(12) United States Patent
Hayashi et al.

(10) Patent No.: US 12,057,426 B2
(45) Date of Patent: Aug. 6, 2024

(54) SEMICONDUCTOR MODULE

(71) Applicant: ROHM CO., LTD., Kyoto (JP)

(72) Inventors: Kenji Hayashi, Kyoto (JP); Kohei Tanikawa, Kyoto (JP); Ryosuke Fukuda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/421,658

(22) Filed: Jan. 24, 2024

(65) Prior Publication Data

US 2024/0170441 A1 May 23, 2024

Related U.S. Application Data

(63) Continuation of application No. 18/457,856, filed on Aug. 29, 2023, which is a continuation of application
(Continued)

(30) Foreign Application Priority Data

Oct. 14, 2020 (JP) ................................. 2020-173339

(51) Int. Cl.
*H01L 23/00* (2006.01)
*H01L 21/56* (2006.01)
(Continued)

(52) U.S. Cl.
CPC ............ *H01L 24/40* (2013.01); *H01L 21/565* (2013.01); *H01L 23/3121* (2013.01);
(Continued)

(58) Field of Classification Search
None
See application file for complete search history.

(56) References Cited

U.S. PATENT DOCUMENTS 4,885,629 A 12/1989 Takagi
5,408,141 A 4/1995 Devore et al.
(Continued)

FOREIGN PATENT DOCUMENTS

CN 116034473 A 4/2023
DE 10 2013 213 205 A1 9/2014
(Continued)

OTHER PUBLICATIONS

International Search Report issued in PCT/JP2021/033513, Dec. 7, 2021 (2 pages).
(Continued)

*Primary Examiner* — Michelle Mandala
*Assistant Examiner* — Jordan M Klein
(74) *Attorney, Agent, or Firm* — HSML P.C.

(57) ABSTRACT

A semiconductor module includes: a first conductive portion; a second conductive portion spaced from the first conductive portion in a first direction; first semiconductor elements electrically bonded to the first conductive portion and mutually spaced in a second direction perpendicular to the first direction; and second semiconductor elements electrically bonded to the second conductive portion and mutually spaced in the second direction. The semiconductor module further includes: a first input terminal electrically connected to the first conductive portion; a second input terminal of opposite polarity to the first input terminal; and an output terminal opposite from the two input terminals in the first direction and electrically connected to the second conductive portion. The semiconductor module further includes: a first conducting member connected to the first semiconductor elements and second conductive portion; and a second conducting member connected to the second semiconductor elements and second input terminal.

8 Claims, 34 Drawing Sheets

Related U.S. Application Data

No. 18/005,048, filed as application No. PCT/JP2021/035261 on Sep. 27, 2021, now abandoned.

(51) Int. Cl.
    *H01L 23/31* (2006.01)
    *H01L 23/498* (2006.01)
    *H01L 25/07* (2006.01)

(52) U.S. Cl.
    CPC .. *H01L 23/49844* (2013.01); *H01L 23/49861* (2013.01); *H01L 24/29* (2013.01); *H01L 24/32* (2013.01); *H01L 24/73* (2013.01); *H01L 24/83* (2013.01); *H01L 25/072* (2013.01); *H01L 2224/29575* (2013.01); *H01L 2224/32245* (2013.01); *H01L 2224/40095* (2013.01); *H01L 2224/40101* (2013.01); *H01L 2224/40139* (2013.01); *H01L 2224/40245* (2013.01); *H01L 2224/73263* (2013.01); *H01L 2224/8383* (2013.01); *H01L 2924/13091* (2013.01); *H01L 2924/30107* (2013.01); *H01L 2924/35121* (2013.01)

(56) References Cited

U.S. PATENT DOCUMENTS

| | | | |
|---|---|---|---|
| 5,430,326 A | 7/1995 | Miyashita | |
| 5,532,512 A | 7/1996 | Fillion et al. | |
| 5,544,412 A | 8/1996 | Romero et al. | |
| 5,721,455 A | 2/1998 | Takeshita | |
| 6,201,696 B1 | 3/2001 | Shimizu et al. | |
| 6,703,703 B2 * | 3/2004 | Grant | H01L 25/072 257/730 |
| 6,867,484 B2 | 3/2005 | Nakajima et al. | |
| 6,992,283 B2 | 1/2006 | Bateman et al. | |
| 7,148,562 B2 | 12/2006 | Yoshida et al. | |
| 2006/0119512 A1 | 6/2006 | Yoshimatsu et al. | |
| 2006/0151874 A1 | 7/2006 | Milich et al. | |
| 2007/0145540 A1 | 6/2007 | Mochida | |
| 2007/0290311 A1 | 12/2007 | Hauenstein | |
| 2008/0150102 A1 | 6/2008 | Yokomae et al. | |
| 2008/0251903 A1 | 10/2008 | Otremba et al. | |
| 2010/0013085 A1 | 1/2010 | Oi et al. | |
| 2010/0133667 A1 * | 6/2010 | Oka | H01L 23/49517 257/666 |
| 2010/0148298 A1 | 6/2010 | Takano et al. | |
| 2011/0089558 A1 | 4/2011 | Muto et al. | |
| 2011/0272797 A1 | 11/2011 | Onishi et al. | |
| 2012/0228741 A1 | 9/2012 | Araki et al. | |
| 2012/0298009 A1 | 11/2012 | Endoh et al. | |
| 2012/0313252 A1 | 12/2012 | Ueda et al. | |
| 2014/0159054 A1 * | 6/2014 | Otake | H01L 23/053 257/77 |
| 2015/0287665 A1 * | 10/2015 | Hanada | H01L 21/50 257/691 |
| 2017/0110395 A1 | 4/2017 | Wabuchi et al. | |
| 2023/0245960 A1 | 8/2023 | Hayashi et al. | |

FOREIGN PATENT DOCUMENTS

| | | |
|---|---|---|
| DE | 10 2018 115 957 A1 | 1/2019 |
| DE | 11 2019 005 313 T5 | 7/2021 |
| DE | 11 2019 006 032 T5 | 10/2021 |
| DE | 11 2013 007 670 B4 | 7/2023 |
| JP | 10-4167 A | 1/1998 |
| JP | 10-116962 A1 | 5/1998 |
| JP | 2000-245170 A | 9/2000 |
| JP | 2000-353778 A | 12/2000 |
| JP | 2001-284525 A | 10/2001 |
| JP | 2004-107728 A | 4/2004 |
| JP | 2005-183463 A | 7/2005 |
| JP | 2005-235816 A | 9/2005 |
| JP | 2006-108247 A | 4/2006 |
| JP | 2008-243970 A | 10/2006 |
| JP | 2007-53379 A | 3/2007 |
| JP | 2007-110025 A | 4/2007 |
| JP | 2008-98585 | 4/2008 |
| JP | 2008-124522 A | 5/2008 |
| JP | 2009-158787 A | 7/2009 |
| JP | 2009-200416 A | 9/2009 |
| JP | 2010-129795 A | 6/2010 |
| JP | 2011-35354 A | 2/2011 |
| JP | 2011-86889 A | 4/2011 |
| JP | 2011-253862 A | 12/2011 |
| JP | 2012-216711 A | 11/2012 |
| JP | 2012-248907 A | 12/2012 |
| JP | 2013-4765 A | 1/2013 |
| JP | 2013-183023 A | 9/2013 |
| JP | 2014-135527 A | 7/2014 |
| JP | 2015-53241 A | 3/2015 |
| JP | 2015-185834 A | 10/2015 |
| JP | 2015-220382 A | 12/2015 |
| JP | 2016-39202 A | 3/2016 |
| JP | 2017-212286 A | 11/2017 |
| JP | 2018-101766 A | 6/2018 |
| JP | 2019-29457 A | 2/2019 |
| JP | 2020-72106 A | 5/2020 |
| JP | 2020-92108 A | 6/2020 |
| WO | 2009/093982 A1 | 7/2009 |
| WO | 2012/018073 A | 2/2012 |
| WO | 2012/073570 A1 | 6/2012 |
| WO | 2014/046058 A1 | 3/2014 |
| WO | 2016/152258 A1 | 9/2016 |

OTHER PUBLICATIONS

International Search Report issued in PCT/JP2021/033676, Dec. 7, 2021 (3 pages).

International Search Report issued in PCT/JP2021/033845, Dec. 7, 2021 (2 pages).

International Search Report issued in PCT/JP2021/035010, Dec. 14, 2021 (2 pages).

International Search Report issued in PCT/JP2021/034715, Dec. 14, 2021 (2 pages).

Office Action issued in corresponding German Patent Application No. 11 2021 002 452.3, mailed Mar. 2, 2023 (14 pages).

Office Action issued in corresponding German Patent Application No. 11 2021 002 397.7, Mar. 17, 2023 (12 pages).

Office Action received in corresponding Japanese Patent Application No. 2022-557285, Jul. 18, 2023, and machine translation (6 pages).

Office Action received in corresponding Japanese Patent application No. 2022-557280, Jul. 18, 2023, and machine translation (8 pages).

Office Action received in the corresponding German Patent application No. 11 2021 002 900.2, May 5, 2023, and machine translation (11 pages).

Office Action received in the corresponding Japanese Patent application 2023-150336, Oct. 24, 2023, and machine translation (6 pages).

Office Action received in the corresponding German Patent application 11 2021 002 383.7, Nov. 16, 2023, and machine translation.

Office Action received in the corresponding German Patent Application No. 11 2021 002 383.7, Nov. 16, 2023, and machine translation (14 pages).

Office Action received in the corresponding Chinese Patent Application No. 202311044146.1, Dec. 10, 2023, and machine translation (16 pages).

Office Action received in corresponding German Patent Application No. 11 2021 002 900.2, Dec. 8, 2023 and machine translation (10 pages).

Office Action received in the corresponding Chinese Patent application No. 202311046034.X Jan. 11, 2024, and machine translation (14 pages).

Office Action received in the corresponding Chinese Patent application No. 202311044839.0, Jan. 11, 2024, and machine translation (14 pages).

(56) References Cited

OTHER PUBLICATIONS

Office Action received in corresponding Chinese Patent Application No. 202311044314.7, Feb. 1, 2024, and machine translation (15 pages).
U.S. Appl. No. 18/453,259, filed Aug. 21, 2023.
U.S. Appl. No. 18/454,984, filed Aug. 24, 2023.
U.S. Appl. No. 18/455,009, filed Aug. 24, 2023.
U.S. Appl. No. 18/457,841, filed Aug. 29, 2023.
U.S. Appl. No. 18/457,856, filed Aug. 29, 2023.
U.S. Appl. No. 18/601,686, filed Mar. 11, 2024.
U.S. Appl. No. 18/430,414, filed Feb. 1, 2024.
U.S. Appl. No. 18/012,207, filed Dec. 21, 2022.
U.S. Appl. No. 18/012,594, filed Dec. 22, 2022.
U.S. Appl. No. 18/004,290, filed Jan. 4, 2023.
U.S. Appl. No. 18/671,652, filed May 22, 2024.
Office Action received in the corresponding Chinese Patent application No. 202311582608.5, May 16, 2024, and machine translation (15 pages).
Office Action received in the corresponding Chinese Patent application No. 202311046034.X, May 15, 2024, and machine translation (12 pages).
Office Action received in corresponding German Patent Application No. 11 2021 007 737.6, Apr. 23, 2024, and machine translation (14 pages).

* cited by examiner

SEMICONDUCTOR MODULE

TECHNICAL FIELD

The present disclosure relates to a semiconductor module.

BACKGROUND ART

Conventionally, semiconductor modules including power switching elements, such as metal oxide semiconductor field effect transistors (MOSFETs) or insulated gate bipolar transistors (IGBTs), have been known. The semiconductor modules are used in various electronic devices, such as industrial devices, home appliances, information terminals, and automobile devices. Patent Document 1 discloses a conventional semiconductor module (power module). The semiconductor module described in Patent Document 1 includes a semiconductor element and a supporting substrate (ceramic substrate). The semiconductor element is an IGBT made of silicon (Si), for example. The supporting substrate supports the semiconductor element. The supporting substrate includes an insulating base member and conductor layers stacked on the respective surfaces of the base member. The base member is made of ceramic, for example. Each of the conductor layers is made of copper (Cu), for example, and the semiconductor element is bonded to one of the conductor layers.

PRIOR ART DOCUMENT

Patent Document

Patent Document 1: JP-A-2015-220382

SUMMARY OF THE INVENTION

Problem to be Solved by the Invention

In recent years, there has been a demand for energy-saving, sophisticated, and smaller electronic devices. In order to meet the demand, it is necessary to improve the performance and reduce size of semiconductor modules mounted on the electronic devices.

In view of the above circumstances, an object of the present disclosure is to provide a semiconductor module having a module structure preferable for equalizing parasitic inductance components along the path of a main circuit current and for equalizing the amount of current to a semiconductor element.

Means to Solve the Problem

A semiconductor module provided by the present disclosure includes: a conductive substrate having an obverse surface and a reverse surface that are spaced apart from each other in a thickness direction; at least one semiconductor element electrically bonded to the obverse surface and having a switching function; a conducting member that forms a path of a main circuit current switched by the plurality of semiconductor elements; a first input terminal and a second input terminal that are offset in one sense of a first direction relative to the conductive substrate, the first direction being perpendicular to the thickness direction; and at least one output terminal offset in another sense of the first direction relative to the conductive substrate. The conductive substrate includes a first conductive portion and a second conductive portion that are spaced apart from each other in the first direction. The at least one semiconductor element includes a plurality of first semiconductor elements electrically bonded to the first conductive portion, and a plurality of second semiconductor elements electrically bonded to the second conductive portion. The plurality of first semiconductor elements are spaced apart from each other along a second direction perpendicular to the thickness direction and the first direction. The plurality of second semiconductor elements are spaced apart from each other along the second direction. The first input terminal is electrically connected to the first conductive portion. The second input terminal has an opposite polarity to the first input terminal. The output terminal is electrically connected to the second conductive portion. The conducting member includes a first conducting member connected to the plurality of first semiconductor elements and the second conductive portion, and a second conducting member connected to the plurality of second semiconductor elements and the second input terminal.

Advantages of the Invention

The configuration as described above can provide a module structure preferable for equalizing parasitic inductance components along the path of a main circuit current and for equalizing the amount of current to a semiconductor element.

MODE FOR CARRYING OUT THE INVENTION

Figure 1:
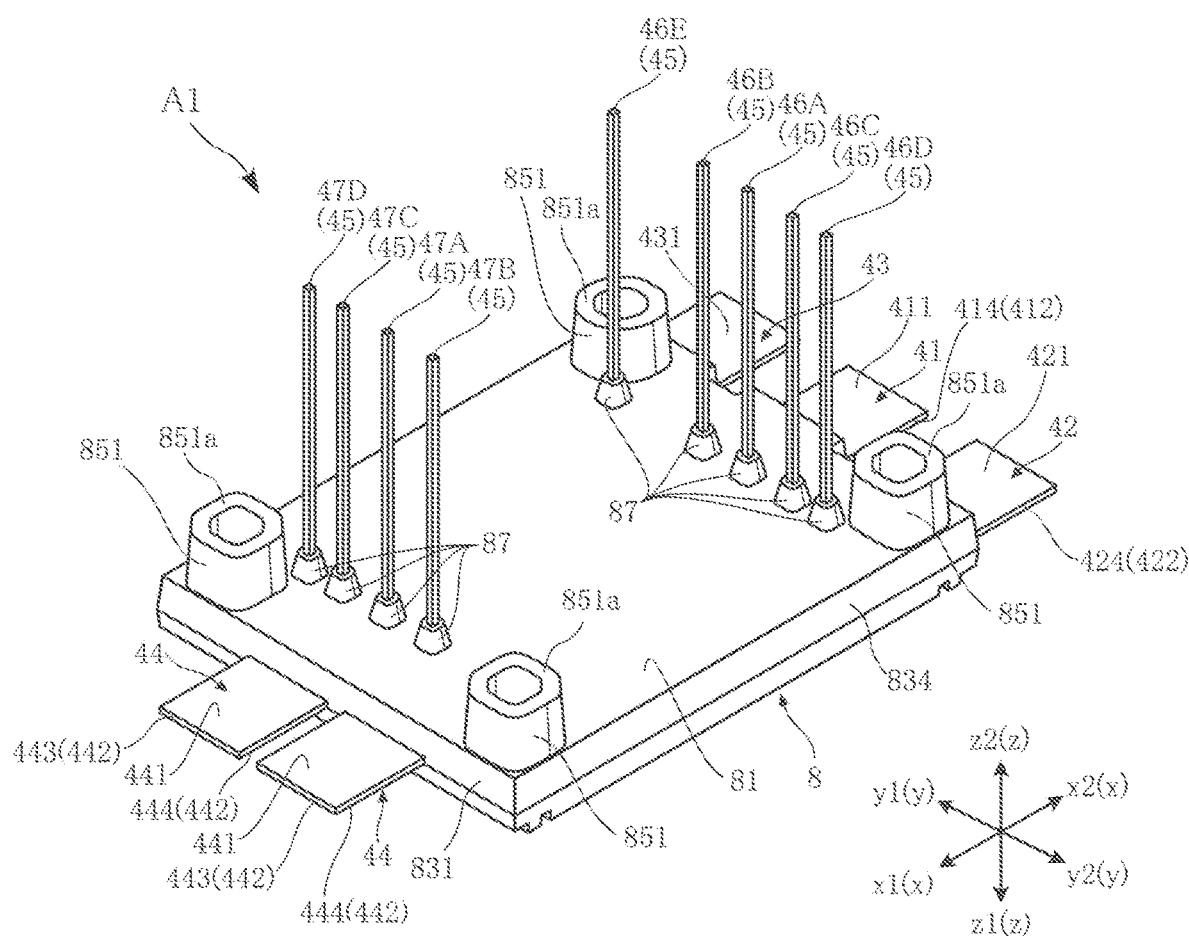
FIG. 1 is a perspective view illustrating a semiconductor module according to a first embodiment.

The following describes preferred embodiments of a semiconductor module according to the present disclosure with reference to the drawings. In the following, the same or similar elements are provided with the same reference signs, and redundant descriptions are omitted.

FIGS. 1 to 20 illustrate a semiconductor module A1 according to a first embodiment. The semiconductor module A1 includes a plurality of semiconductor elements 10, a conductive substrate 2, a supporting substrate 3, a plurality of input terminals 41 to 43, a plurality of output terminals 44, a plurality of control terminals 45, a control terminal support 5, a conducting member 6, a first conductive bonding member 71, a second conductive bonding member 72, a plurality of wires 731 to 735, a sealing resin 8, resin members 87, and resin-filling portions 88.

Figure 2:
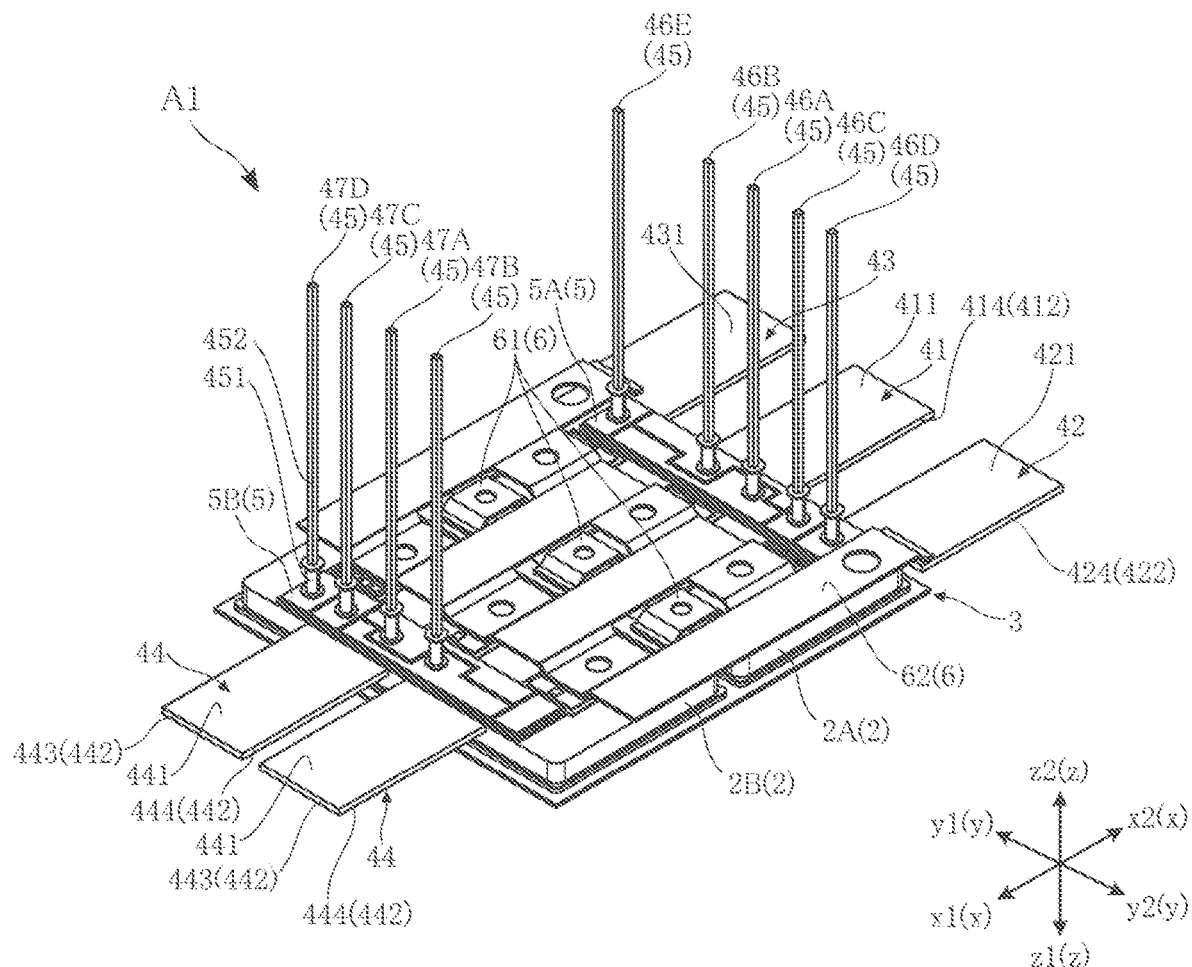
FIG. 2 is a perspective view corresponding to FIG. 1 but omitting a sealing resin, a resin member, and a resin-filling portion.
Figure 3:
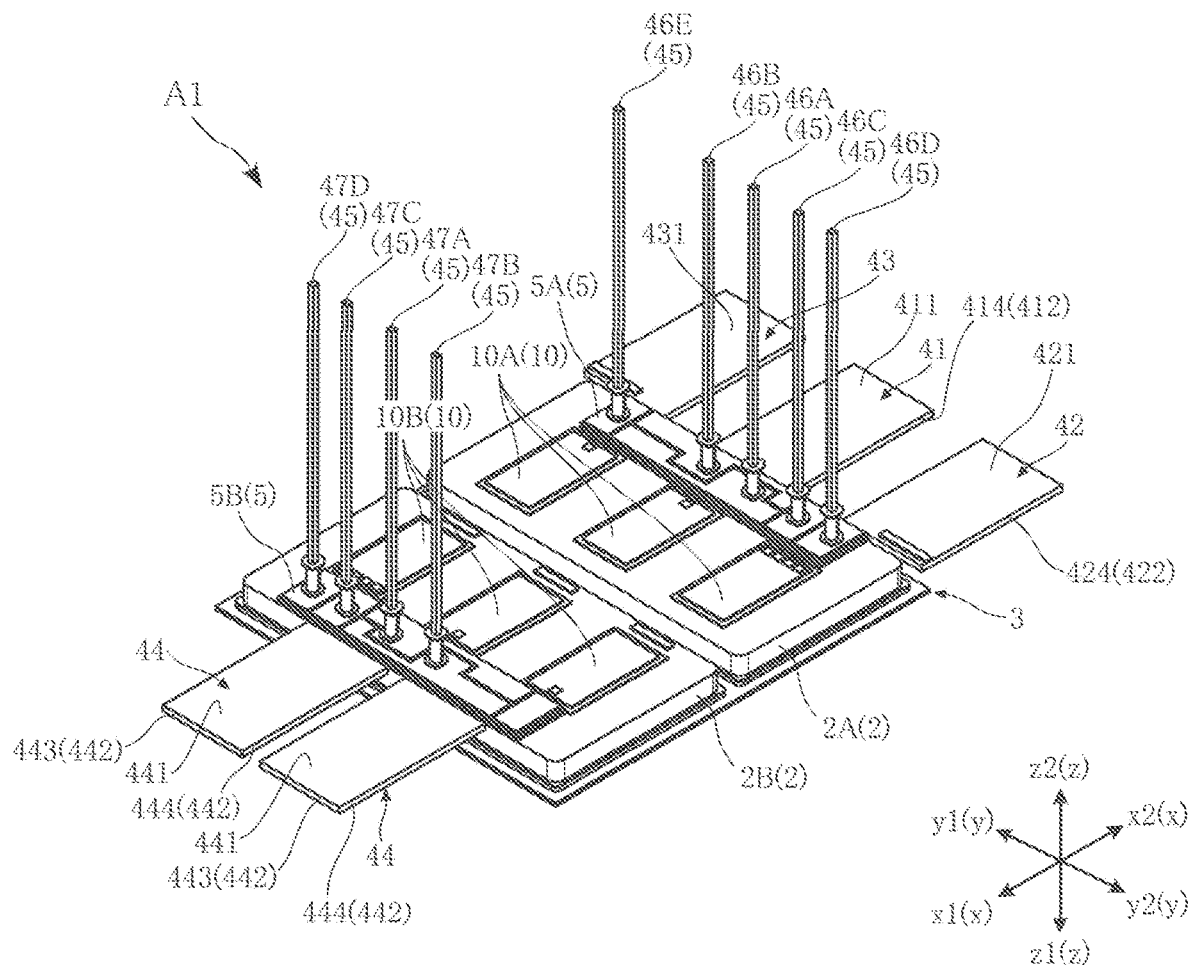
FIG. 3 is a perspective view corresponding to FIG. 2 but omitting a conducting member.
Figure 4:
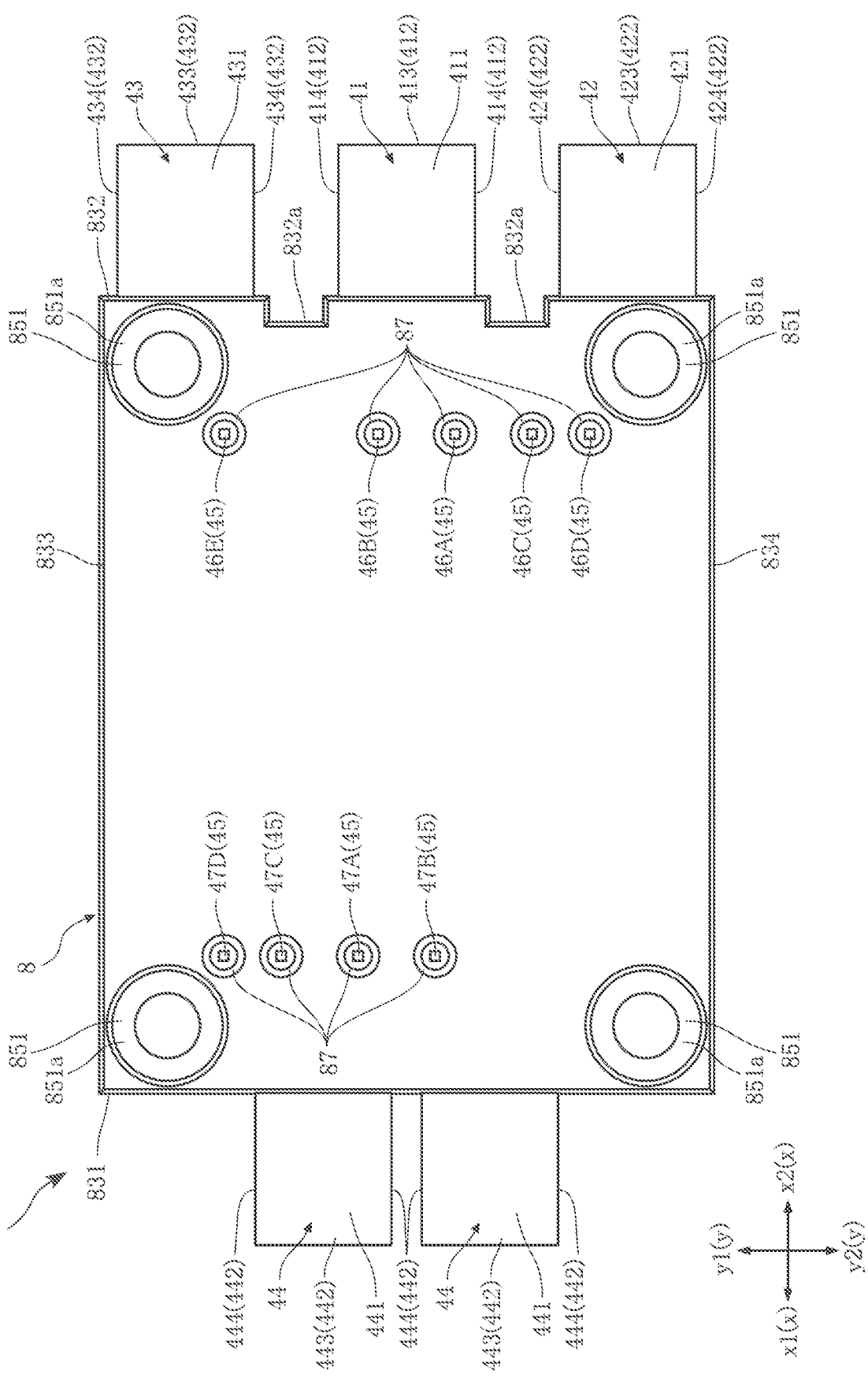
FIG. 4 is a plan view illustrating the semiconductor module according to the first embodiment.
Figure 5:
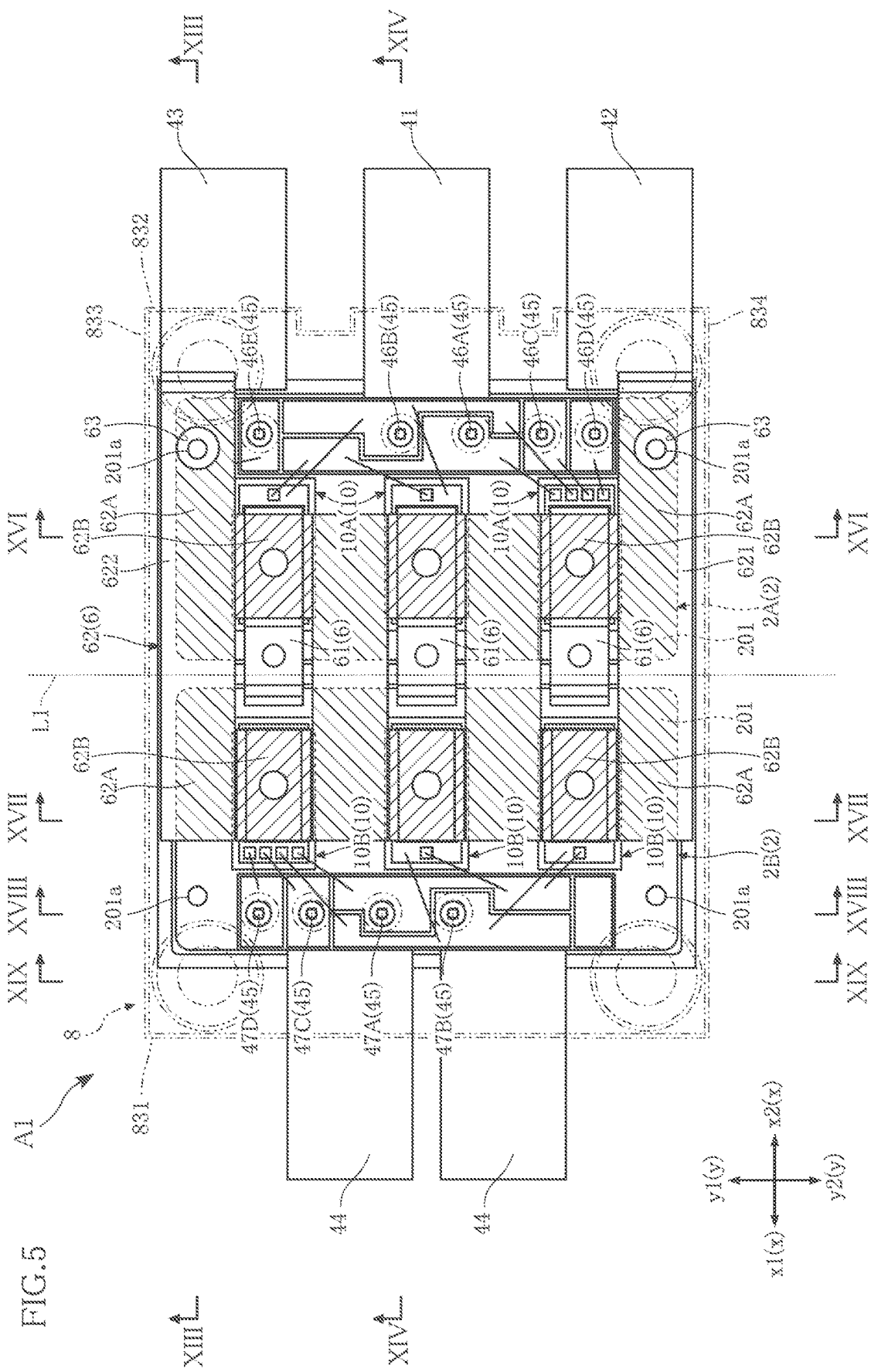
FIG. 5 is a plan view corresponding to FIG. 4 but showing the sealing resin, the resin member, and the resin-filling portion with imaginary lines.
Figure 6:
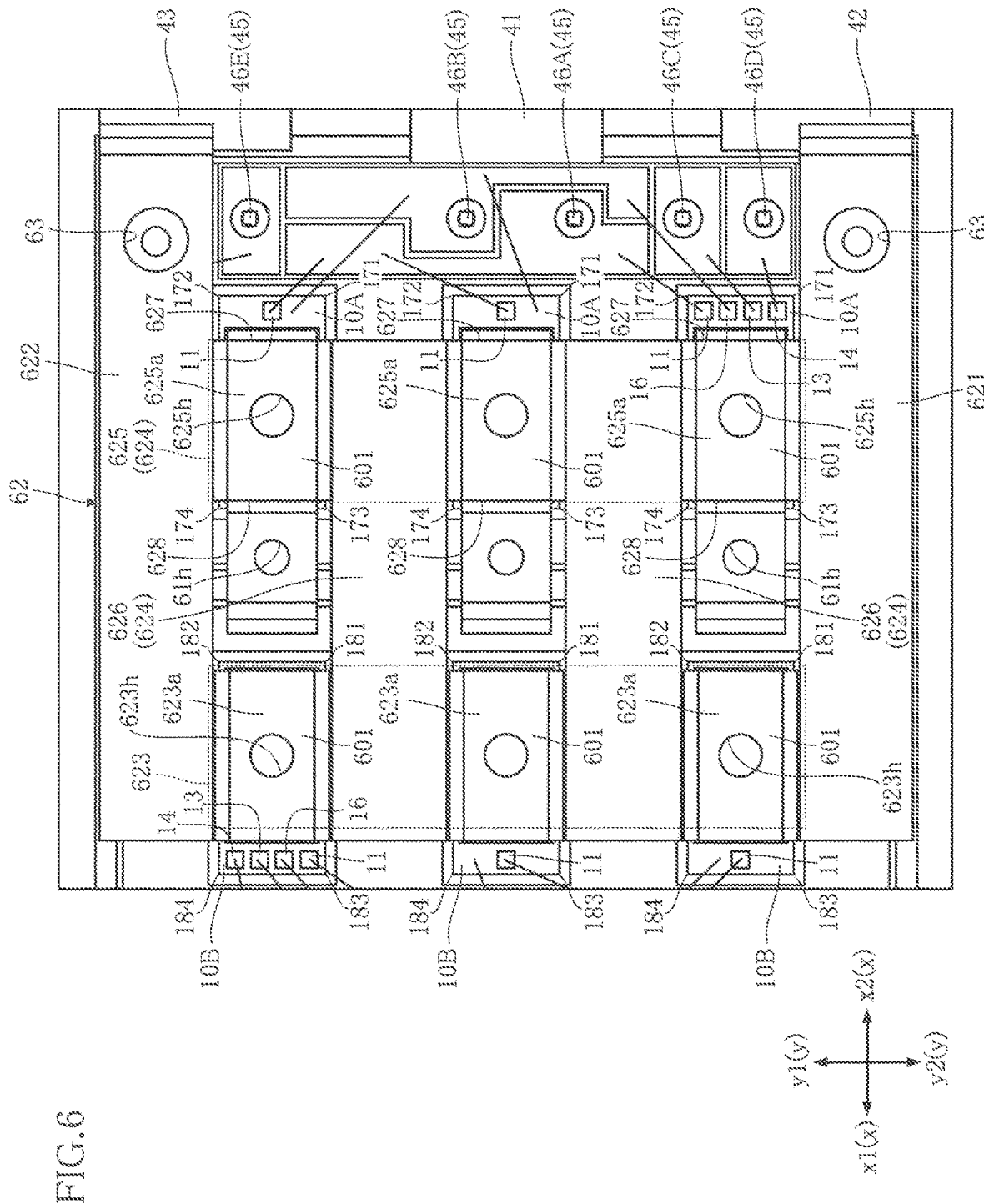
FIG. 6 is a partially enlarged view showing a part of FIG. 5 but omitting the imaginary lines of the sealing resin, the resin member, and the resin-filling portion.
Figure 7:
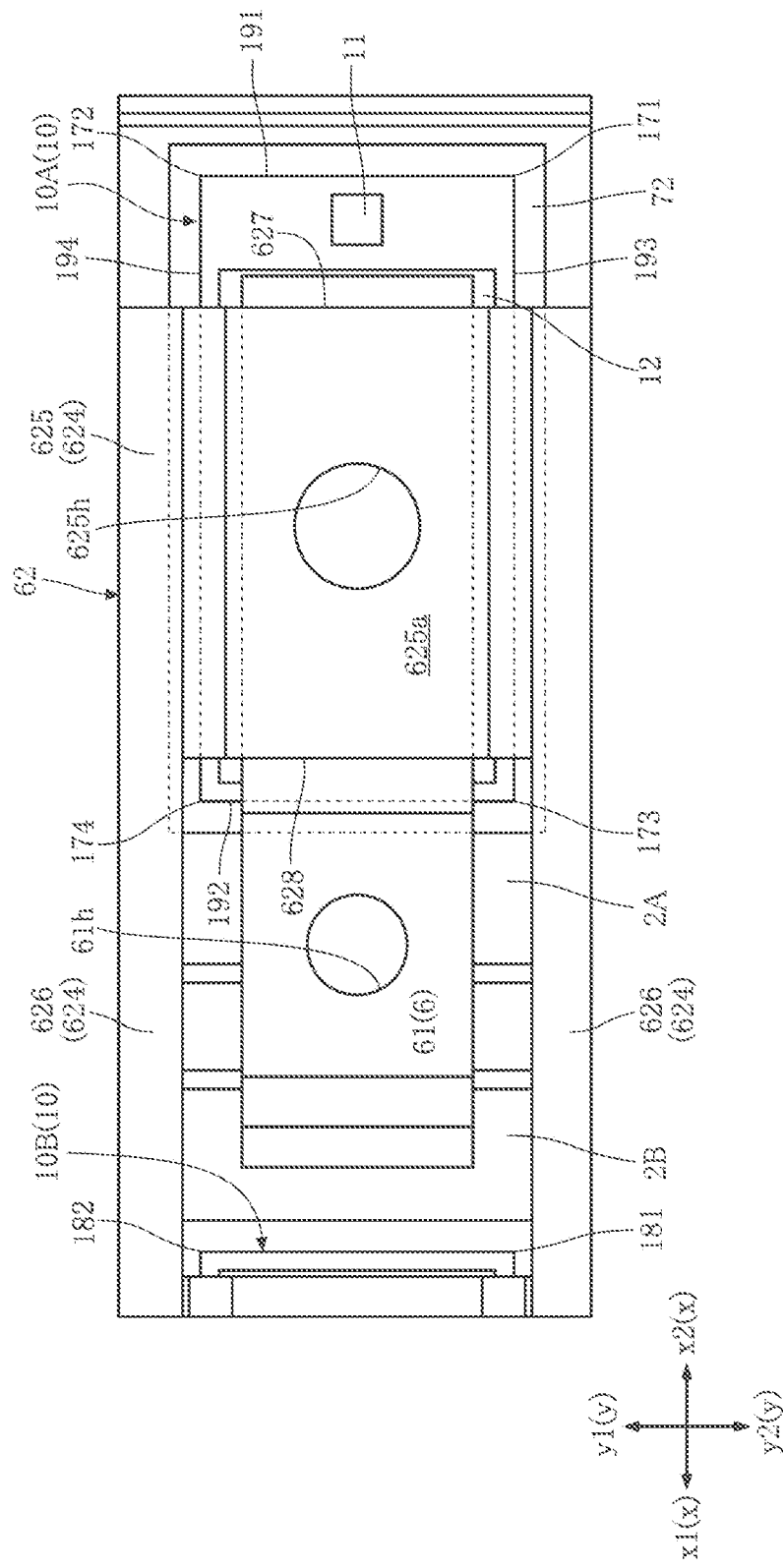
FIG. 7 is a partially enlarged view showing a part of FIG. 6.
Figure 8:
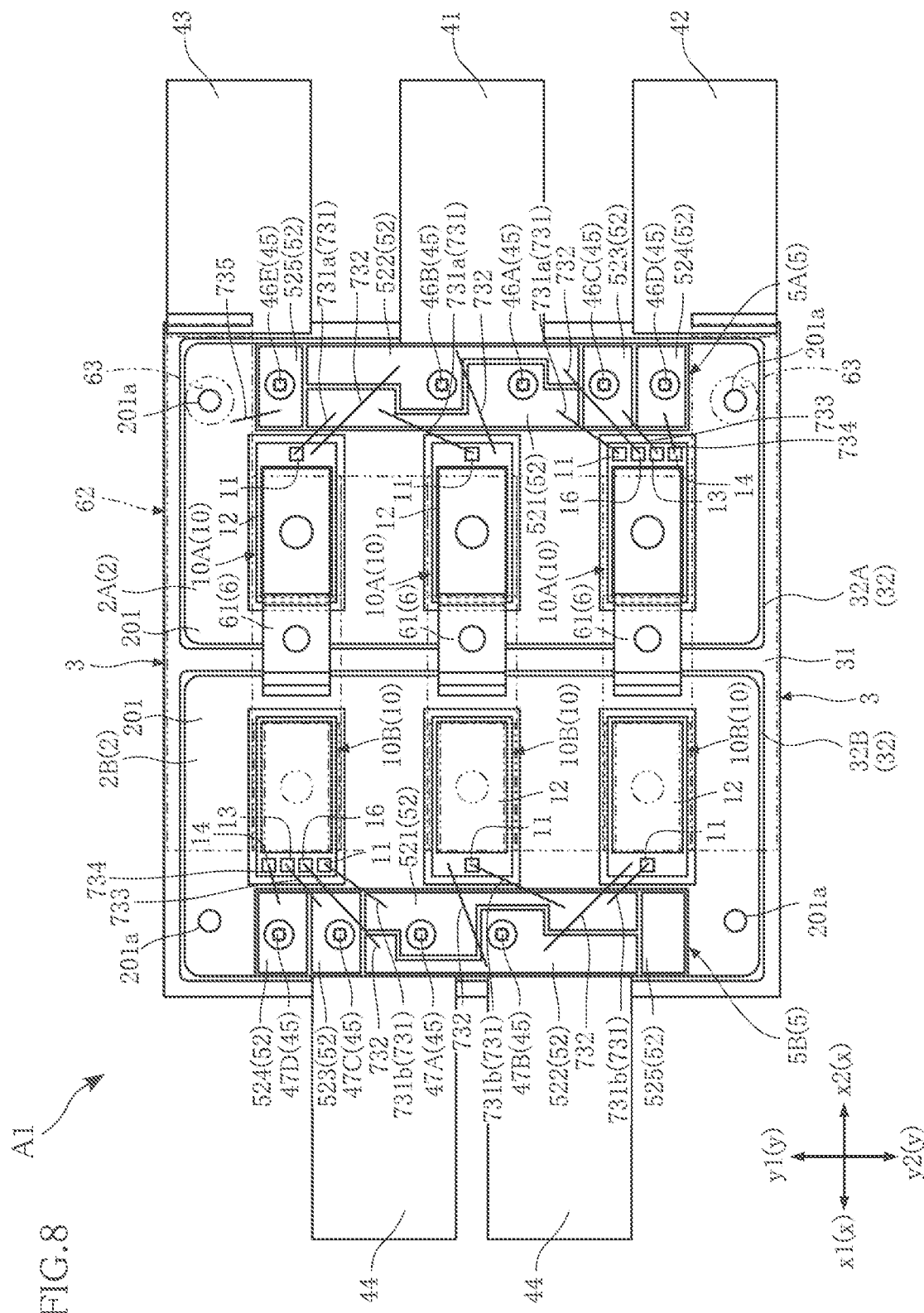
FIG. 8 is a plan view corresponding to FIG. 5 but showing a part of the conducting member with an imaginary line.
Figure 9:
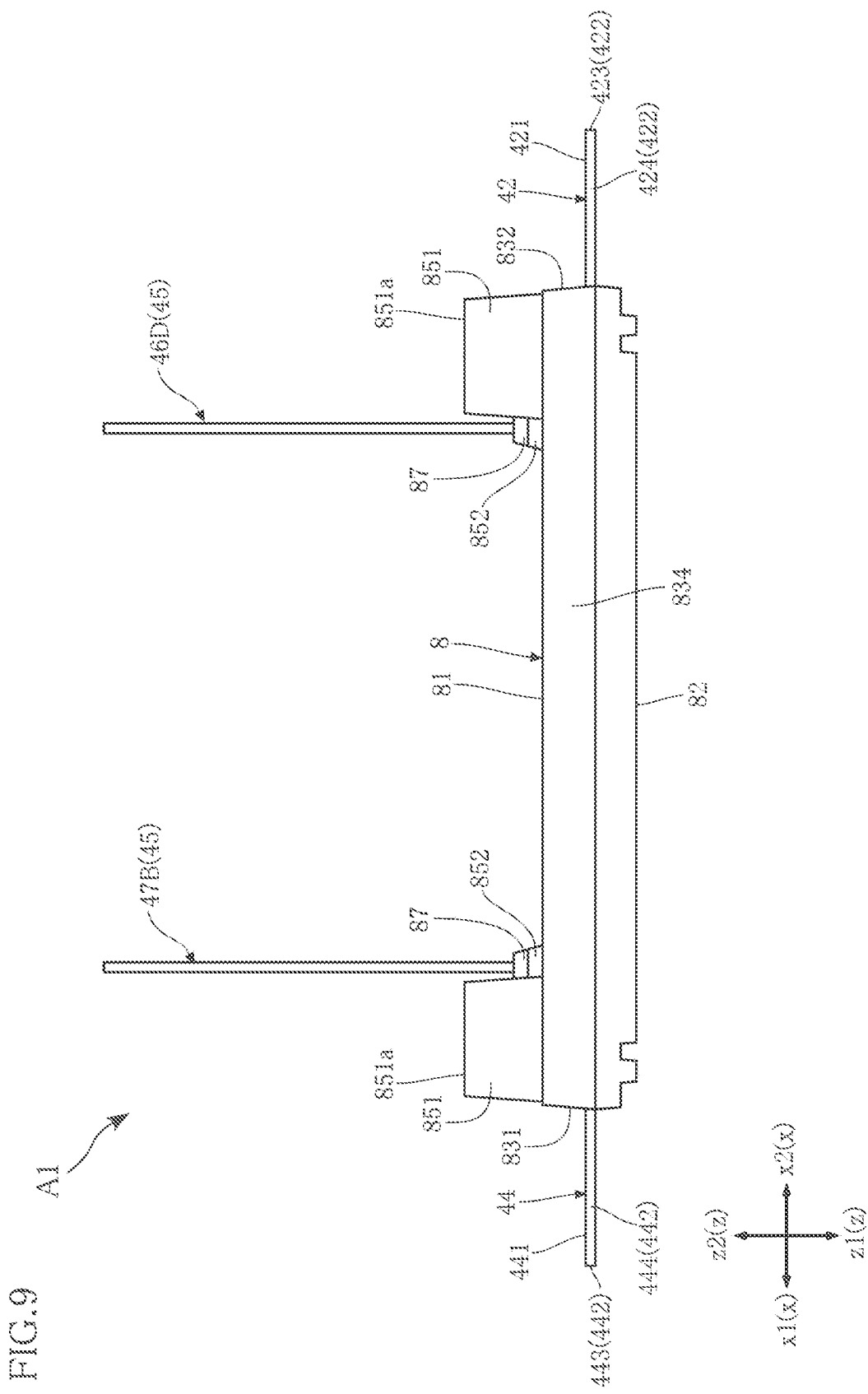
FIG. 9 is a front view illustrating the semiconductor module according to the first embodiment.
Figure 10:
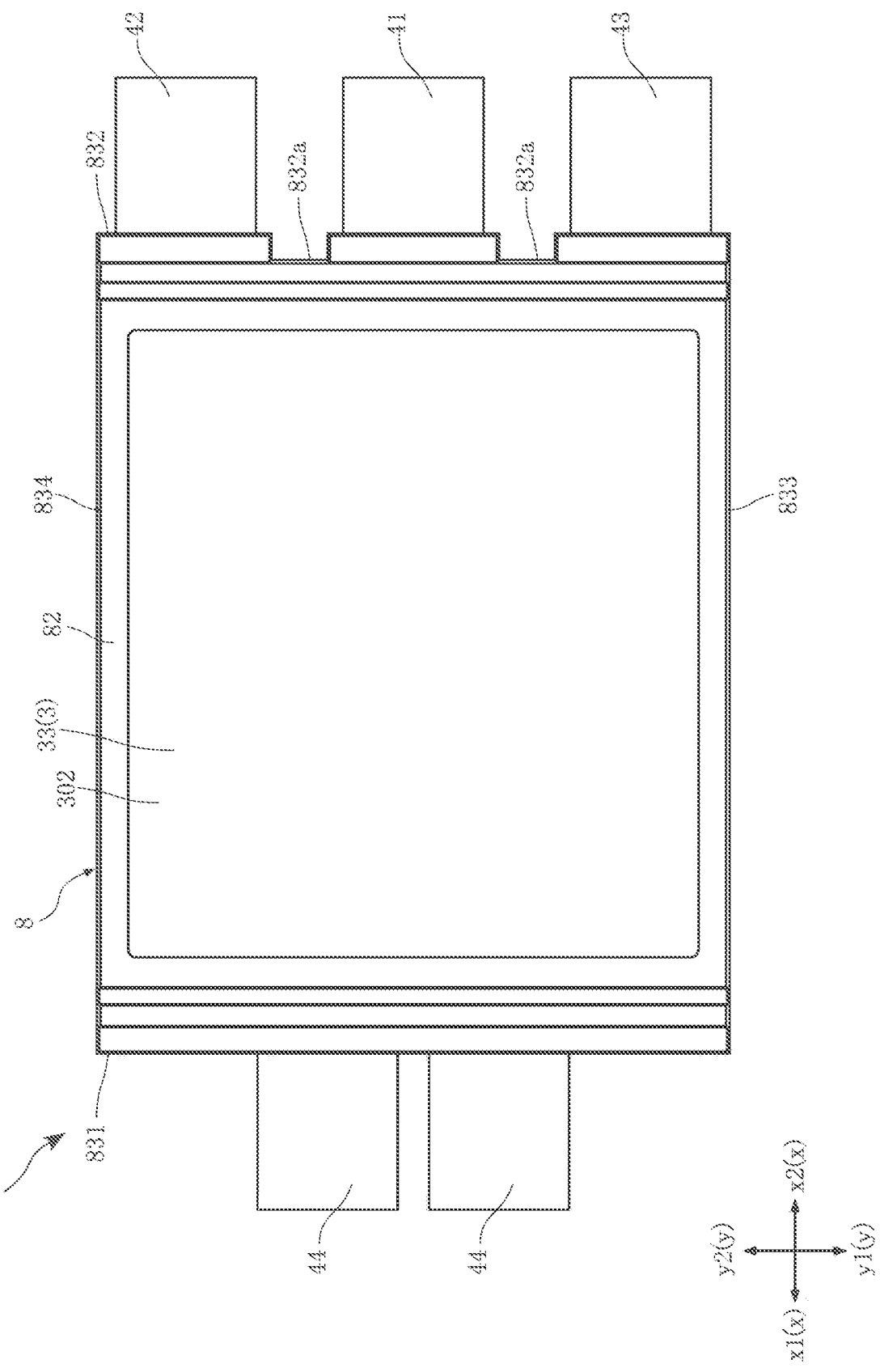
FIG. 10 is a bottom view illustrating the semiconductor module according to the first embodiment.
Figure 11:
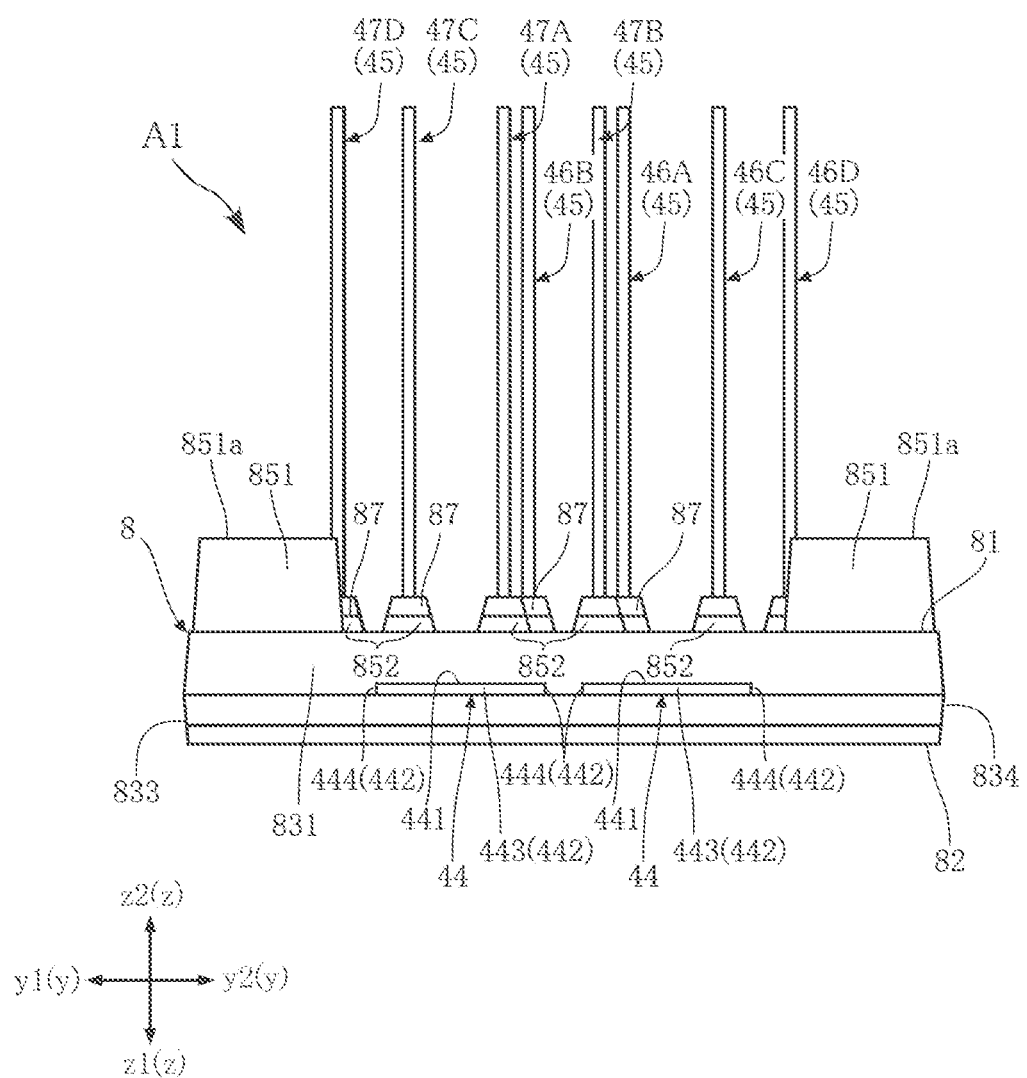
FIG. 11 is a left side view illustrating the semiconductor module according to the first embodiment.
Figure 12:
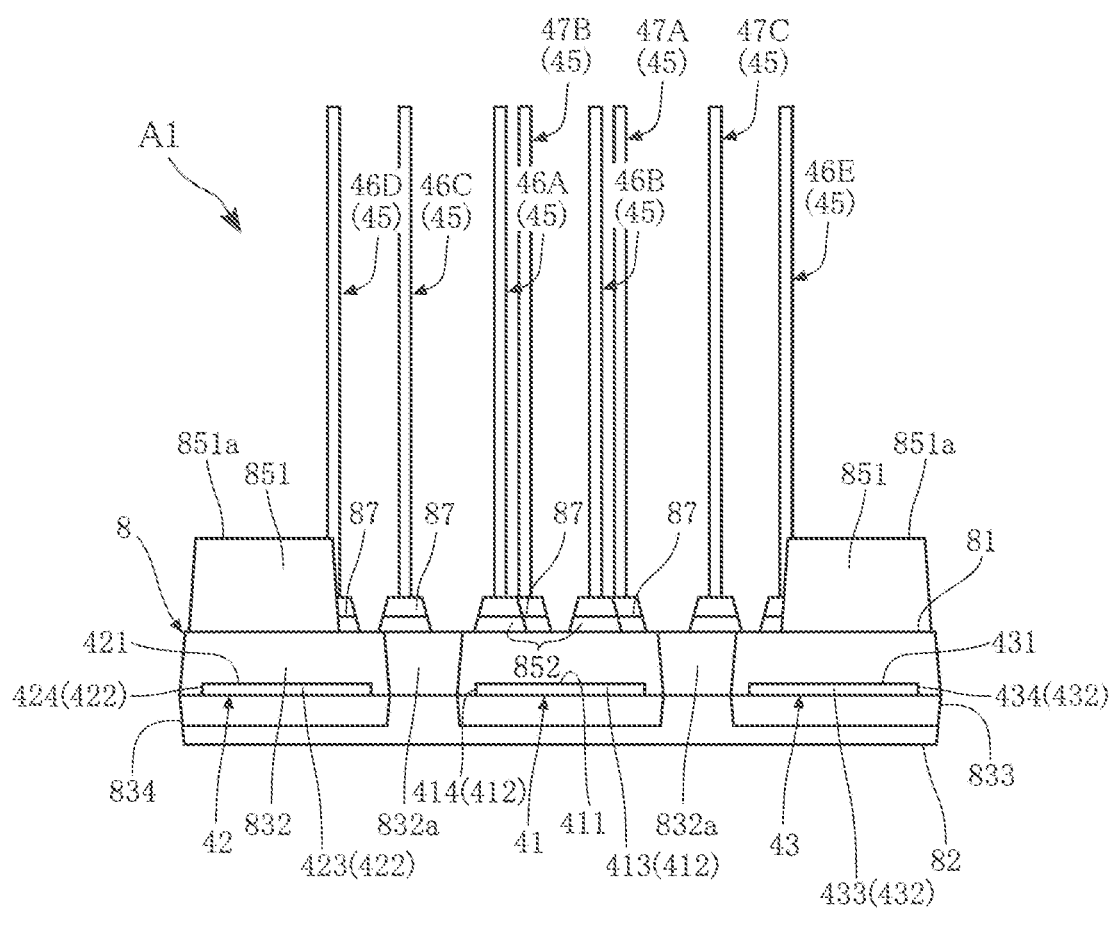
FIG. 12 is a right side view illustrating the semiconductor module according to the first embodiment.
Figure 13:
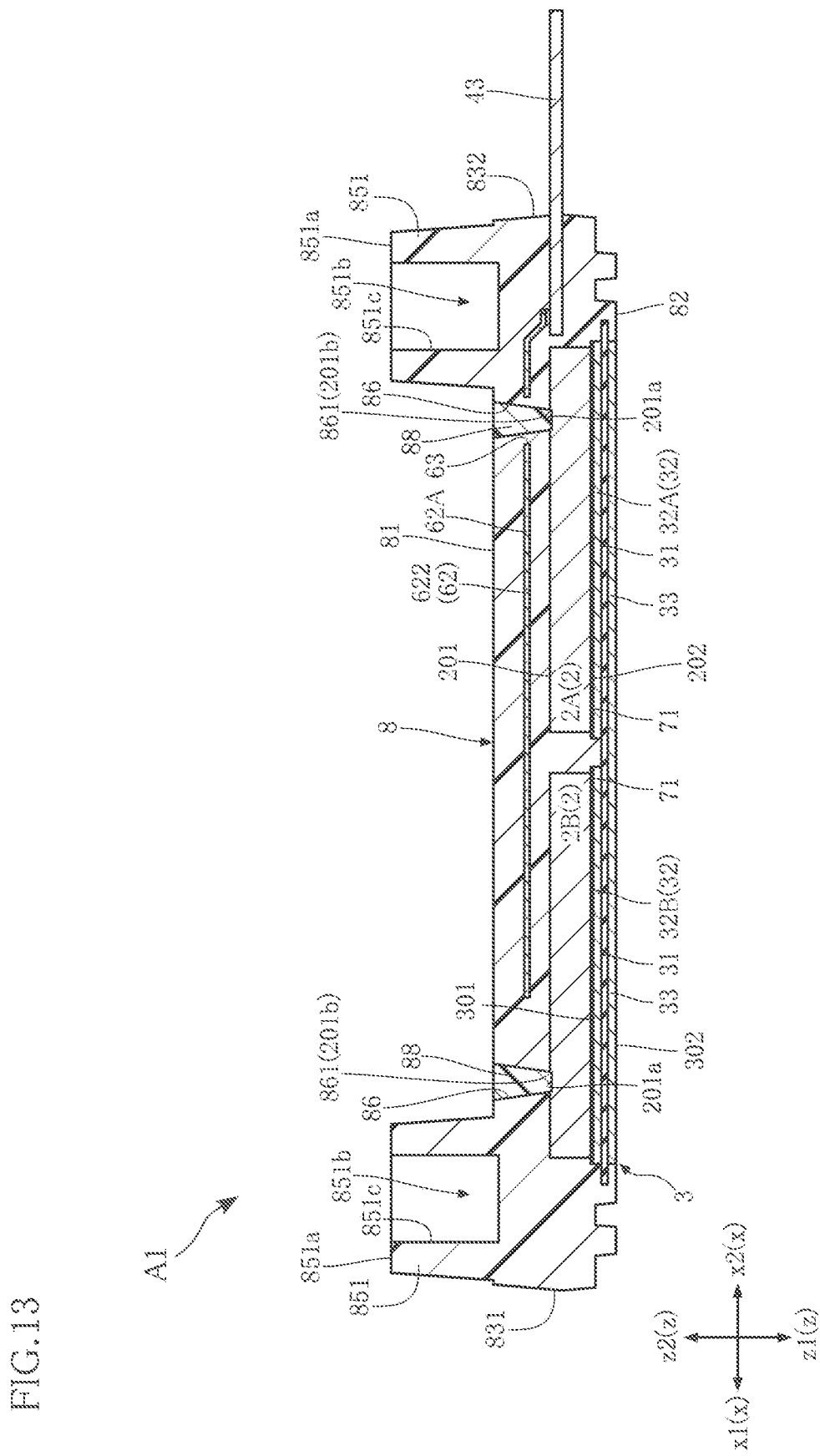
FIG. 13 is a cross-sectional view taken along line XIII-XIII of FIG. 5.
Figure 14:
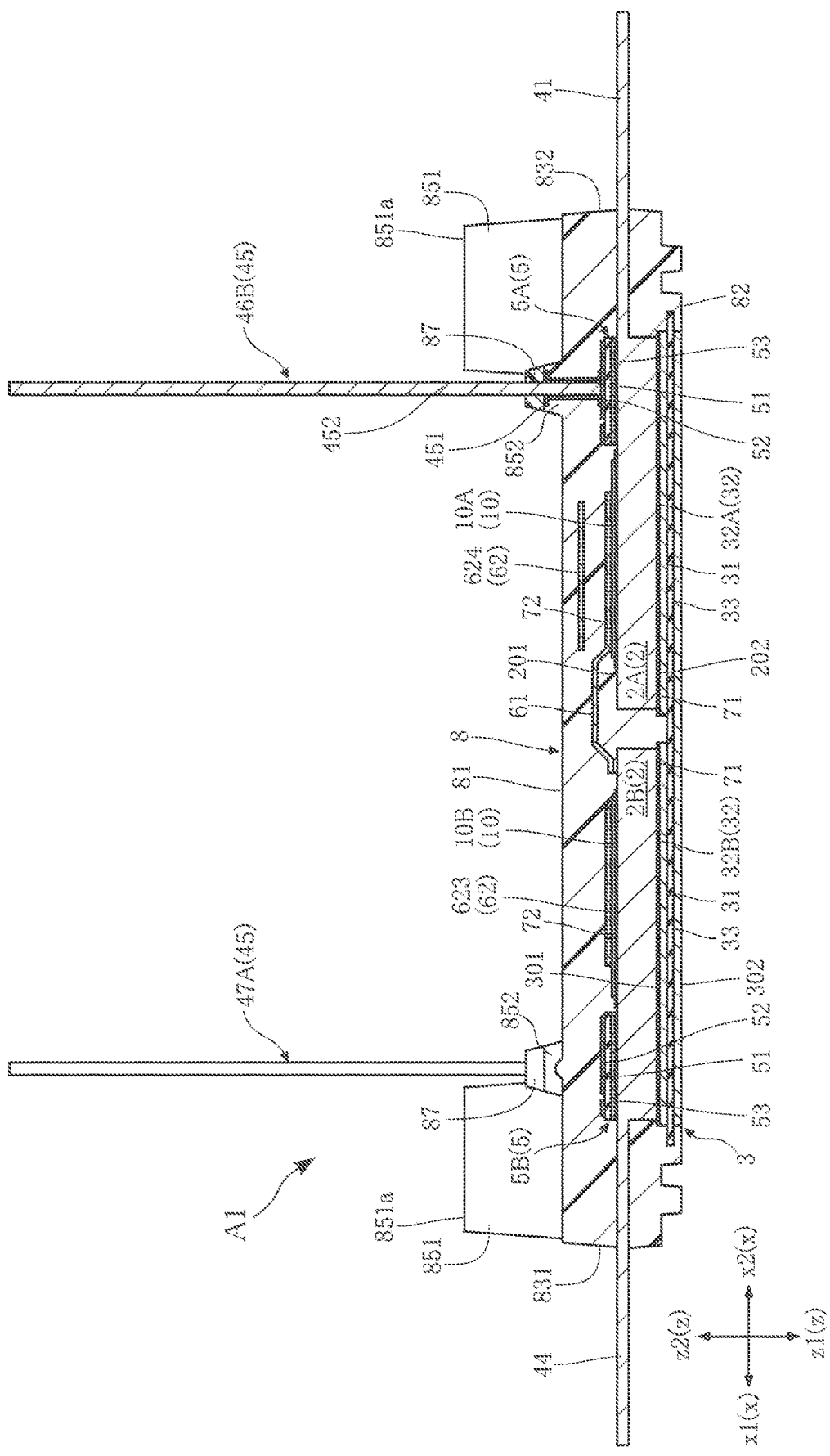
FIG. 14 is a cross-sectional view taken along line XIV-XIV of FIG. 5.
Figure 15:
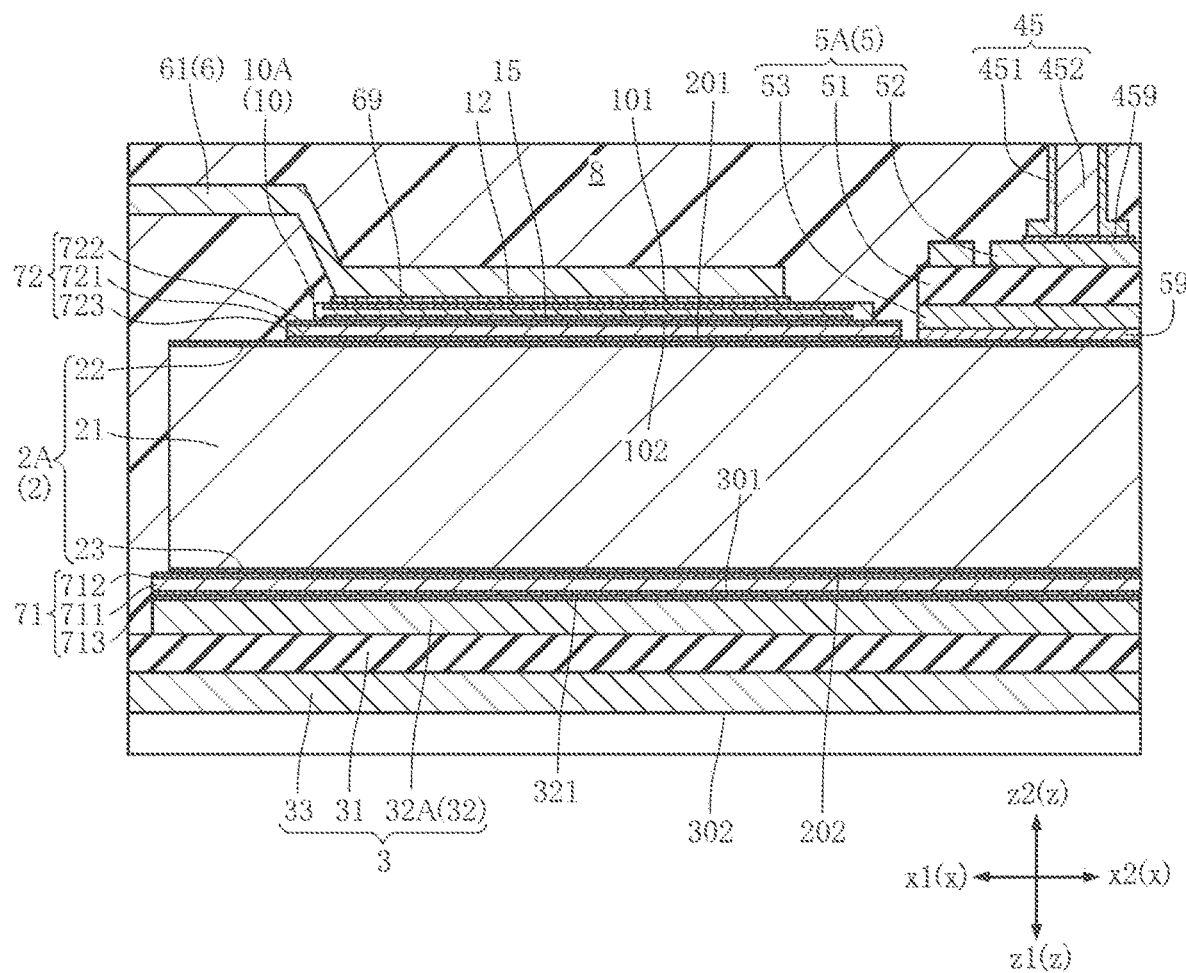
FIG. 15 is a partially enlarged view showing a part of FIG. 14.
Figure 16:
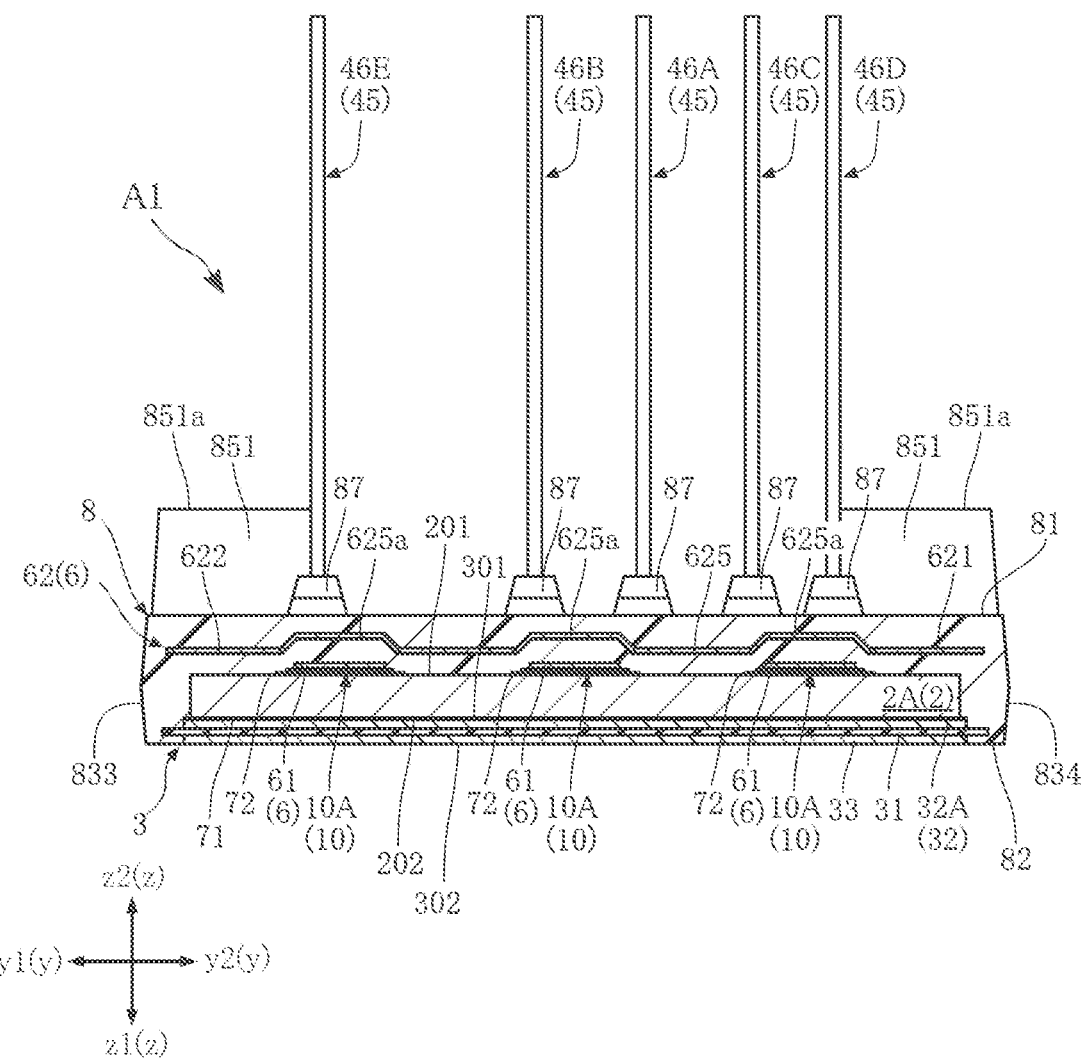
FIG. 16 is a cross-sectional view taken along line XVI-XVI of FIG. 5.
Figure 17:
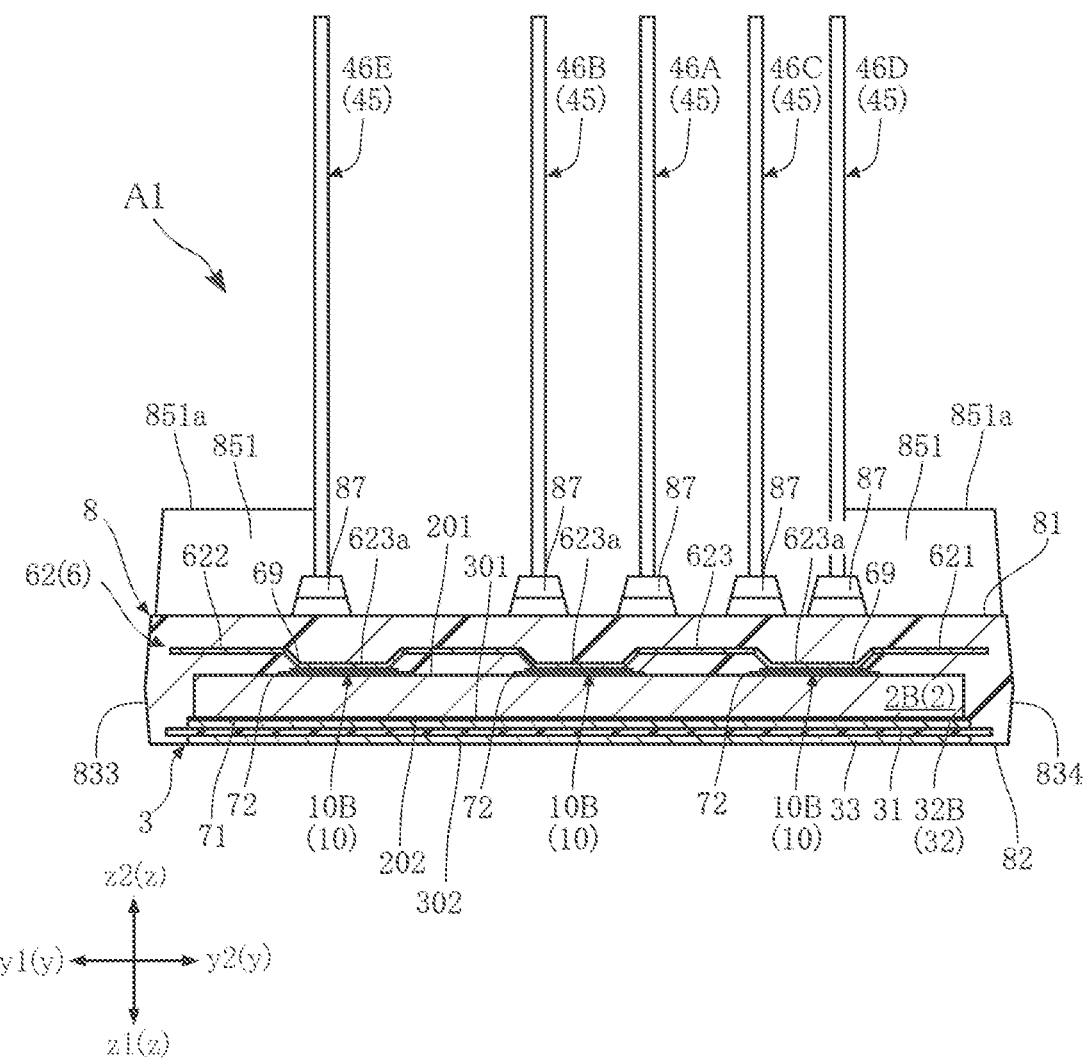
FIG. 17 is a cross-sectional view taken along line XVII-XVII of FIG. 5.
Figure 18:
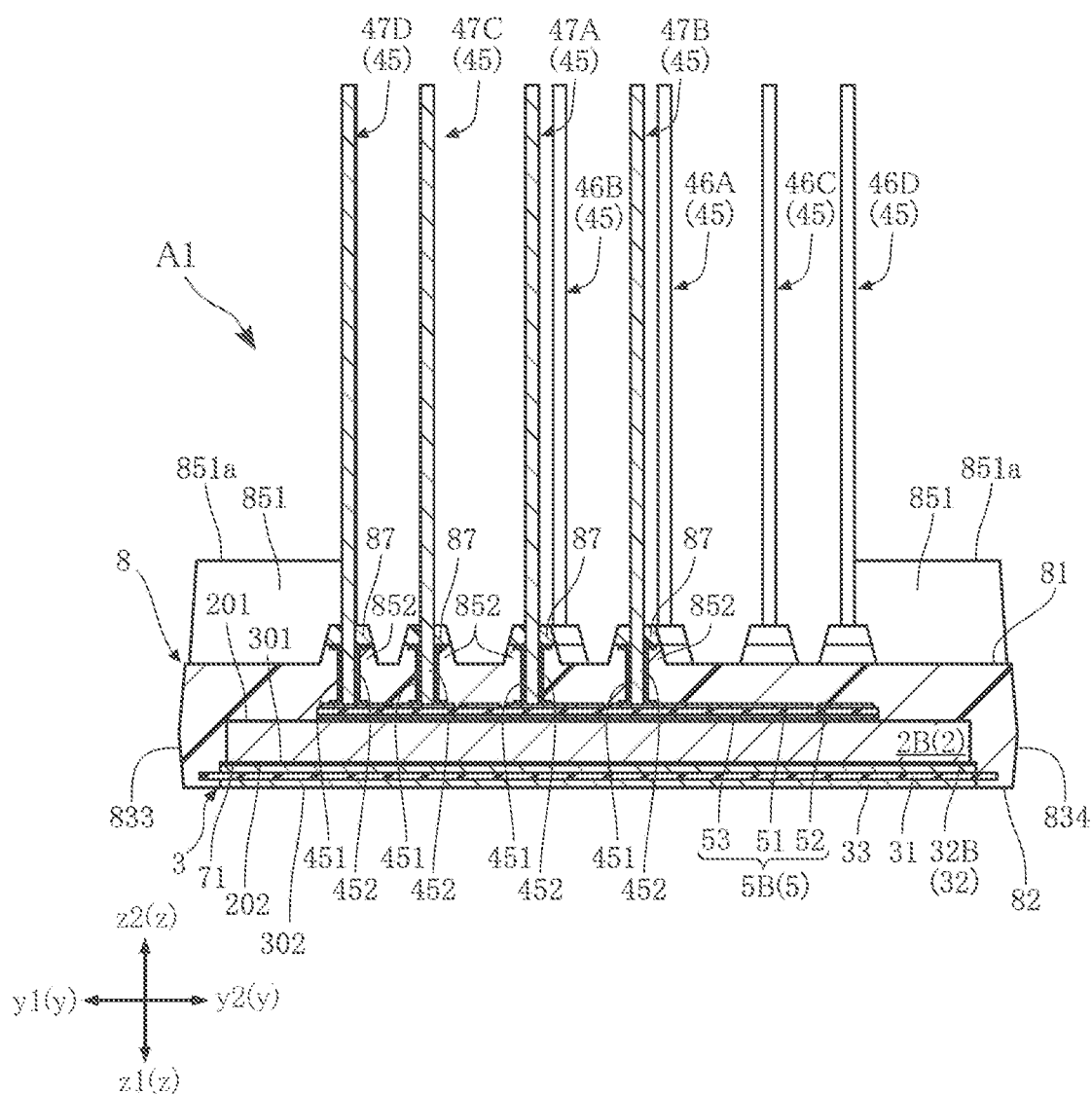
FIG. 18 is a cross-sectional view taken along line XVIII-XVIII of FIG. 5.
Figure 19:
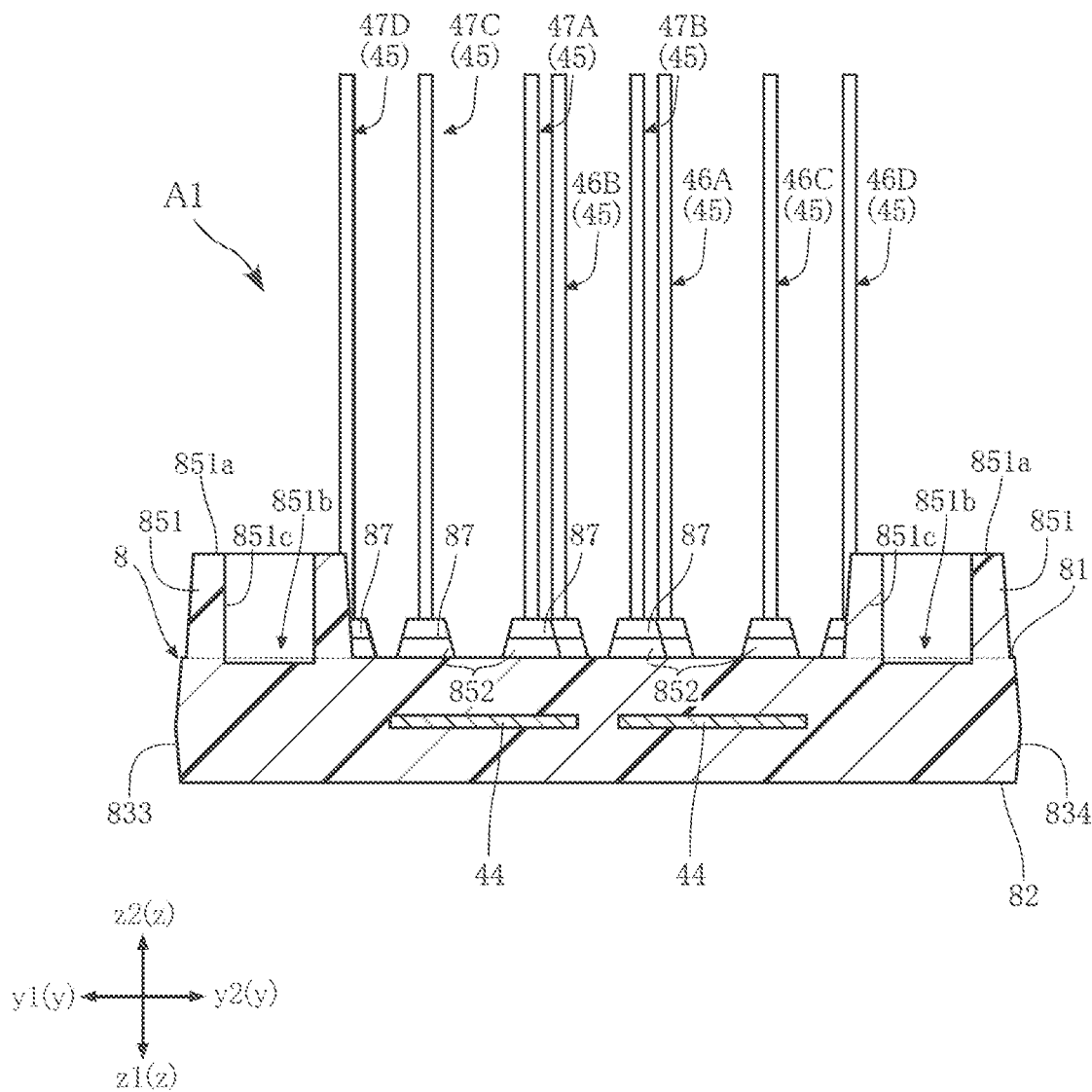
FIG. 19 is a cross-sectional view taken along line XIX-XIX of FIG. 5.
Figure 20:
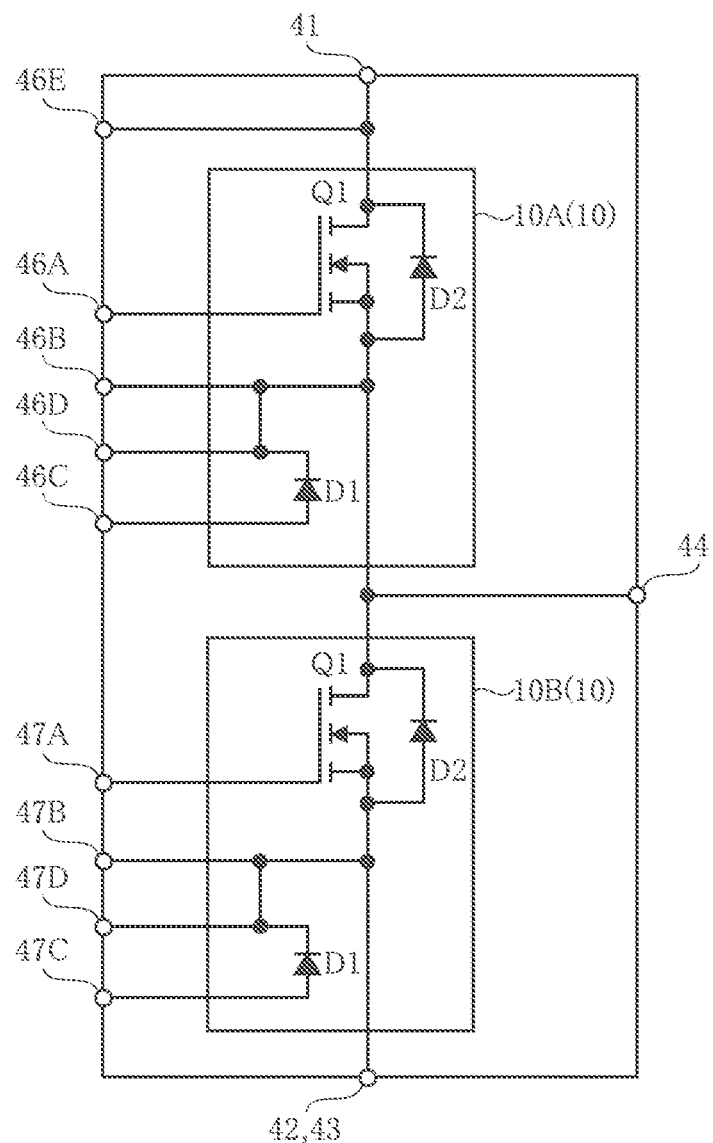
FIG. 20 shows an example of the circuit configuration of the semiconductor module according to the first embodiment.

FIG. 1 is a perspective view illustrating the semiconductor module A1. FIG. 2 is a perspective view corresponding to FIG. 1 but omitting the sealing resin 8, the resin members 87, and the resin-filling portions 88. FIG. 3 is a perspective view corresponding to FIG. 2 but omitting the conducting member 6. FIG. 4 is a plan view illustrating the semiconductor module A1. FIG. 5 is a plan view corresponding to FIG. 4 but showing the sealing resin 8, the resin members 87, and the resin-filling portions 88 with imaginary lines. FIG. 6 is a partially enlarged view showing a part of FIG. 5. In FIG. 6, the imaginary lines of the sealing resin 8, the resin members 87, and the resin-filling portions 88 are omitted. FIG. 7 is a partially enlarged view showing a part of FIG. 6. FIG. 8 is a plan view corresponding to FIG. 5 but showing a part of the conducting member 6 (a second conducting member 62 described below) with an imaginary line. FIG. 9 is a front view illustrating the semiconductor module A1. FIG. 10 is a bottom view illustrating the semiconductor module A1. FIG. 11 is a left side view illustrating the semiconductor module A1. FIG. 12 is a right side view illustrating the semiconductor module A1. FIG. 13 is a cross-sectional view taken along line XIII-XIII of FIG. 5. FIG. 14 is a cross-sectional view taken along line XIV-XIV of FIG. 5. FIG. 15 is a partially enlarged view showing a part of FIG. 14. FIG. 16 is a cross-sectional view taken along line XVI-XVI of FIG. 5. FIG. 17 is a cross-sectional view taken along line XVII-XVII of FIG. 5. FIG. 18 is a cross-sectional view taken along line XVIII-XVIII of FIG. 5. FIG. 19 is a cross-sectional view taken along line XIX-XIX of FIG. 5. In FIGS. 2, 3, 7, 14, and 18, the wires 731 to 735 are omitted. FIG. 20 shows an example of the circuit configuration of the semiconductor module A1. In the circuit diagram of FIG. 20, only one of a plurality of first semiconductor elements 10A (described below) and only one of a plurality of second semiconductor elements 10B (described below) are illustrated, and the rest of the first semiconductor elements 10A and the second semiconductor elements 10B are omitted.

For convenience, reference is made to three mutually perpendicular directions, i.e., x direction, y direction, and z direction. The z direction corresponds to the thickness direction of the semiconductor module A1. The x direction corresponds to the horizontal direction in the plan view (see FIG. 4) of the semiconductor module A1. The y direction corresponds to the vertical direction in the plan view (see FIG. 4) of the semiconductor module A1. One sense of the x direction is defined as x1 direction, and the other sense as x2 direction. The same rule applies to the y direction and the z direction. In the following description, "as viewed in the z direction" means "plan view". The x direction is an example of a "first direction", and the y direction is an example of a "second direction".

The semiconductor elements 10 form the functional core of the semiconductor module A1. The semiconductor elements 10 are made of a semiconductor material that mainly contains silicon carbide (SiC), for example. The semiconductor material is not limited to SiC, and may be silicon (Si), gallium arsenide (GaAs) or gallium nitride (GaN). Each of the semiconductor elements 10 has a switching function unit Q1 (see FIG. 20) composed of a metal-oxide-semiconductor field-effect transistor (MOSFET), for example. The switching function unit Q1 is not limited to a MOSFET, and may be another transistor, which is, for example, a field-effect transistor such as a metal-insulator-semiconductor FET (MISFET) or a bipolar transistor such as an IGBT. The semiconductor elements 10 are the same elements. The semiconductor elements 10 are n-channel MOSFETs, for example, but may be p-channel MOSFETs instead.

As shown in FIG. 15, each of the semiconductor elements 10 has an element obverse surface 101 and an element reverse surface 102. The element obverse surface 101 and the element reverse surface 102 of each semiconductor element 10 are spaced apart from each other in the z direction. The element obverse surface 101 faces in the z2 direction, and the element reverse surface 102 faces in the z1 direction.

The semiconductor elements 10 include a plurality of first semiconductor elements 10A and a plurality of second semiconductor elements 10B. In the present embodiment, the semiconductor module A1 includes three first semiconductor elements 10A and three second semiconductor elements 10B. However, the number of first semiconductor elements 10A and the number of second semiconductor elements 10B are not limited thereto, and may be changed as appropriate according to the performance required for the semiconductor module A1. In the example shown in FIG. 8, three first semiconductor elements 10A and three second semiconductor elements 10B are provided. The number of first semiconductor elements 10A and the number of second semiconductor elements 10B may each be one, two, or no less than four. The number of first semiconductor elements 10A and the number of second semiconductor elements 10B may be equal or different. The number of first semiconductor elements 10A and the number of second semiconductor elements 10B are determined according to the current capacity handled by the semiconductor module A1.

As shown in FIG. 20, the semiconductor module A1 may be configured as a half-bridge switching circuit. In this case, the first semiconductor elements 10A constitute an upper arm circuit of the semiconductor module A1, and the second semiconductor elements 10B constitute a lower arm circuit of the semiconductor module A1. In the upper arm circuit, the first semiconductor elements 10A are connected in parallel to each other, and in the lower arm circuit, the second semiconductor elements 10B are connected in parallel to each other. Each of the first semiconductor elements 10A and each of the second semiconductor elements 10B are connected in series to form a bridge layer.

As shown in FIGS. 8 and 16, for example, the first semiconductor elements 10A are mounted on the conductive substrate 2. In the example shown in FIG. 8, the first semiconductor elements 10A are aligned in the y direction and spaced apart from each other. The first semiconductor elements 10A are electrically bonded to the conductive substrate 2 (a first conductive portion 2A described below) via the second conductive bonding member 72. When the first semiconductor elements 10A are bonded to the first conductive portion 2A, the element reverse surfaces 102 face the first conductive portion 2A.

As shown in FIGS. 8 and 17, for example, the second semiconductor elements 10B are mounted on the conductive substrate 2. In the example shown in FIG. 8, the second semiconductor elements 10B are aligned in the y direction and spaced apart from each other. The second semiconductor elements 10B are electrically bonded to the conductive substrate 2 (a second conductive portion 2B described below) via the second conductive bonding member 72. When the second semiconductor elements 10B are bonded to the second conductive portion 2B, the element reverse surfaces 102 face the second conductive portion 2B. As is evident from FIG. 8, the first semiconductor elements 10A and the second semiconductor elements 10B overlap with each other as viewed in the x direction, but the present disclosure is not limited to this.

Each of the semiconductor elements 10 (the first semiconductor elements 10A and the second semiconductor elements 10B) has a first obverse-surface electrode 11, a second obverse-surface electrode 12, and a reverse-surface electrode 15. The configurations of the first obverse-surface electrode 11, the second obverse-surface electrode 12, and the reverse-surface electrode 15, which are described below, are common to each of the semiconductor elements 10. The first obverse-surface electrode 11 and the second obverse-surface electrode 12 are mounted on the element obverse surface 101. The first obverse-surface electrode 11 and the second obverse-surface electrode 12 are insulated from each other by an insulating film (not illustrated). The reverse-surface electrode 15 is provided on the element reverse surface 102.

The first obverse-surface electrode 11 is a gate electrode, for example, to which a drive signal (e.g., gate voltage) for driving the semiconductor element 10 is inputted. In the semiconductor element 10, the second obverse-surface electrode 12 is a source electrode, for example, through which a source current flows. The reverse-surface electrode 15 is a drain electrode, for example, through which a drain current flows. The reverse-surface electrode 15 almost entirely covers the element reverse surface 102. The reverse-surface electrode 15 may be formed by Ag plating.

Each of the semiconductor elements 10 switches between a connected state and a disconnected state according to a drive signal (gate voltage), which is input to the first obverse-surface electrode 11 (gate electrode) via the switching function unit Q1. The operation of switching between the connected state and the disconnected state is referred to as a switching operation. In the connected state, a current flows from the reverse-surface electrode 15 (drain electrode) to the second obverse-surface electrode 12 (source electrode). In the disconnected state, the current does not flow. In other words, each of the semiconductor elements 10 performs a switching operation through the switching function unit Q1. The semiconductor module A1 converts a first power supply voltage (DC voltage) inputted between the input terminal 41 and the two input terminals 42, 43 to a second power supply voltage (AC voltage) by the switching function units Q1 of the semiconductor elements 10, for example, and outputs the second power supply voltage from the output terminals 44. The input terminals 41 to 43 and the output terminals 44 are power supply terminals that handle power supply voltage. The input terminals 41 to 43 are first power supply terminals that receive the first source voltage. The output terminals 44 are second power supply terminals that output the second source voltage.

Some (two in the example shown in FIG. 8) of the semiconductor elements 10 each have a diode function unit D1 (see FIG. 20) in addition to the switching function unit Q1. In the semiconductor module A1, one of the first semiconductor elements 10A (i.e., the first semiconductor element 10A offset furthest in the y2 direction in FIG. 8) and one of the second semiconductor elements 10B (i.e., the second semiconductor element 10B offset furthest in the y1 direction in FIG. 8) each include a diode function unit D1 in addition to the switching function unit Q1. The function and role of the diode function unit D1 is not particularly limited but one example of the diode function unit D1 is a temperature detection diode. Note that the diode D2 in FIG. 20 is, for example, a parasitic diode component of the switching function unit Q1.

As shown in FIG. 8, each of the semiconductor elements 10 having the diode function units D1 has a third obverse-surface electrode 13, a fourth obverse-surface electrode 14, and a fifth obverse-surface electrode 16, in addition to the first obverse-surface electrode 11, the second obverse-surface electrode 12, and the reverse-surface electrode 15. The configurations of the third obverse-surface electrode 13, the fourth obverse-surface electrode 14, and the fifth obverse-surface electrode 16, which are described below, are common to each of the semiconductor elements 10 having the diode function units D1. The third obverse-surface electrode 13, the fourth obverse-surface electrode 14, and the fifth obverse-surface electrode 16 are formed on the element obverse surface 101. In each of the semiconductor elements 10 having the diode function units D1, the third obverse-surface electrode 13 and the fourth obverse-surface electrode 14 are electrically connected to the diode function unit D1. The fifth obverse-surface electrode 16 is a source sense electrode, for example, through which a source current in the switching function unit Q1 flows.

As shown in FIG. 7, each of the first semiconductor elements 10A has a first side 191, a second side 192, a third side 193, and a fourth side 194 in plan view. FIG. 7 illustrates the first semiconductor element 10A arranged in the middle in the y direction among the first semiconductor elements 10A aligned in the y direction, but each of the other first semiconductor elements 10A also similarly has a first side 191, a second side 192, a third side 193, and a fourth side 194. The first side 191 and the second side 192 extend in the y direction. The first side 191 is an edge located in the x2 direction in plan view, and the second side 192 is an edge located in the x1 direction in plan view. The third side 193 and the fourth side 194 extend in the x direction. The third side 193 is an edge located in the y2 direction in plan view, and the fourth side 194 is an edge located in the y1 direction in plan view. Since each of the first semiconductor elements 10A has a rectangular shape in plan view, the four corners formed by the first side 191, the second side 192, the third side 193, and the fourth side 194 are generally right-angled in plan view. As shown in FIG. 7, the four corners do not overlap with the conducting member 6 (first conducting members 61 and a second conducting member 62 described below) in plan view. The third side 193 and the fourth side 194 are longer than the first side 191 and the second side 192.

The conductive substrate 2 is also referred to as a lead frame. The conductive substrate 2 supports the semiconductor elements 10. The conductive substrate 2 is bonded to the supporting substrate 3 via the first conductive bonding member 71. The conductive substrate 2 has a rectangular shape in plan view, for example. The conductive substrate 2, together with the conducting member 6, forms the path of a main circuit current switched by the semiconductor elements 10.

The conductive substrate 2 includes a first conductive portion 2A and a second conductive portion 2B. The first conductive portion 2A and the second conductive portion 2B are plate-like members made of metal. The metal is copper (Cu) or a Cu alloy, for example. The first conductive portion 2A and the second conductive portion 2B form a conductive path to the semiconductor elements 10, together with the input terminals 41 to 43 and the output terminals 44. As shown in FIGS. 13 to 18, the first conductive portion 2A and the second conductive portion 2B are bonded to the supporting substrate 3 via the first conductive bonding member 71. The first semiconductor elements 10A are bonded to the first conductive portion 2A via the second conductive bonding member 72. The second semiconductor elements 10B are bonded to the second conductive portion 2B via the second conductive bonding member 72. As shown in FIGS. 3, 8, 13, and 14, the first conductive portion 2A and the second conductive portion 2B are spaced apart from each other in the x direction. In the example shown in these figures, the first conductive portion 2A is offset in the x2 direction relative to the second conductive portion 2B. The first conductive portion 2A and the second conductive portion 2B each have a rectangular shape in plan view, for example. The first conductive portion 2A and the second conductive portion 2B overlap with each other as viewed in the x direction. The first conductive portion 2A and the second conductive portion 2B may each have a dimension of 15 mm to 25 mm (preferably about 20 mm) in the x direction, a dimension of 30 mm to 40 mm (preferably about 35 mm) in the y direction, and a dimension of 1.5 mm to 3.0 mm (preferably about 2.0 mm) in the z direction.

The conductive substrate 2 has an obverse surface 201 and a reverse surface 202. As shown in FIGS. 13, 14, and 16 to 18, the obverse surface 201 and the reverse surface 202 are spaced apart from each other in the z direction. The obverse surface 201 faces in the z2 direction, and the reverse surface 202 faces in the z1 direction. The obverse surface 201 is a combination of the upper surface of the first conductive portion 2A and the upper surface of the second conductive portion 2B. The reverse surface 202 is a combination of the lower surface of the first conductive portion 2A and the lower surface of the second conductive portion 2B. The reverse surface 202 faces the supporting substrate 3 and is bonded to the supporting substrate 3. As shown in FIGS. 5, 8, and 13, the obverse surface 201 is formed with a plurality of recessed portions 201a. The recessed portions 201a are recessed from the obverse surface 201 in the z direction. The degree of recession (depth) of each recessed portion 201a is greater than 0 μm and less than or equal to 100 μm, for example. The recessed portions 201a are formed during molding described below, for example. The recessed portions 201a include those formed in the obverse surface 201 of the first conductive portion 2A, and those formed in the obverse surface 201 of the second conductive portion 2B. Two recessed portions 201a formed in the obverse surface 201 of the first conductive portion 2A are spaced apart from each other in the y direction and overlap with each other as viewed in the y direction. Two recessed portions 201a formed in the obverse surface 201 of the second conductive portion 2B are spaced apart from each other in the y direction and overlap with each other as viewed in the y direction.

The conductive substrate 2 (each of the first conductive portion 2A and the second conductive portion 2B) includes a base member 21, an obverse-surface bonding layer 22, and a reverse-surface bonding layer 23 that are stacked on each other. The base member 21 is a plate-like member made of metal. The metal is Cu or a Cu alloy. The obverse-surface bonding layer 22 is formed on the upper surface of the base member 21. The obverse-surface bonding layer 22 is the surface layer of the conductive substrate 2 in the z2 direction. The upper surface of the obverse-surface bonding layer 22 corresponds to the obverse surface 201 of the conductive substrate 2. The obverse-surface bonding layer 22 is a Ag plating layer, for example. The reverse-surface bonding layer 23 is formed on the lower surface of the base member 21. The reverse-surface bonding layer 23 is the surface layer of the conductive substrate 2 in the z1 direction. The lower surface of the reverse-surface bonding layer 23 corresponds to the reverse surface 202 of the conductive substrate 2. The reverse-surface bonding layer 23 is a Ag plating layer, for example, as is the obverse-surface bonding layer 22.

The supporting substrate 3 supports the conductive substrate 2. The supporting substrate 3 is a direct bonded copper (DBC) substrate, for example. The supporting substrate 3 includes an insulating layer 31, a first metal layer 32, a first bonding layer 321, and a second metal layer 33.

The insulating layer 31 is made of a ceramic with excellent thermal conductivity, for example. The ceramic may be aluminum nitride (AlN). The insulating layer 31 is not limited to a ceramic, and may be an insulating resin sheet, for example. The insulating layer 31 has a rectangular shape in plan view, for example.

The first metal layer 32 is formed on the upper surface (surface facing in the z2 direction) of the insulating layer 31. The material of the first metal layer 32 contains Cu, for example. The material may contain Al instead of Cu. The first metal layer 32 includes a first portion 32A and a second portion 32B. The first portion 32A and the second portion 32B are spaced apart from each other in the x direction. The first portion 32A is offset in the x2 direction relative to the second portion 32B. The first portion 32A is bonded to the first conductive portion 2A and supports the first conductive portion 2A. The second portion 32B is bonded to the second conductive portion 2B and supports the second conductive portion 2B. The first portion 32A and the second portion 32B each have a rectangular shape in plan view, for example.

The first bonding layer 321 is formed on the upper surface of the first metal layer 32 (each of the first portion 32A and the second portion 32B). The first bonding layer 321 is a Ag plating layer, for example. The first bonding layer 321 is provided to enhance the solid-phase diffusion bonding with the first conductive bonding member 71.

The second metal layer 33 is formed on the lower surface of the insulating layer 31 (surface facing in the z1 direction). The second metal layer 33 is made of the same material as the first metal layer 32. In the example shown in FIG. 10, the lower surface (a bottom surface 302 described below) of the second metal layer 33 is exposed from the sealing resin 8. The lower surface may not be exposed from the sealing resin 8, and may be covered with the sealing resin 8. The second metal layer 33 may overlap with the first portion 32A and the second portion 32B in plan view.

As shown in FIGS. 13 to 18, the supporting substrate 3 has a supporting surface 301 and a bottom surface 302. The supporting surface 301 and the bottom surface 302 are spaced apart from each other in the z direction. The supporting surface 301 faces in the z2 direction, and the bottom surface 302 faces in the z1 direction. As shown in FIG. 10, the bottom surface 302 is exposed from the sealing resin 8. The supporting surface 301 is the upper surface of the first bonding layer 321, i.e., a combination of the upper surface of the first portion 32A and the upper surface of the second portion 32B. The supporting surface 301 faces the conductive substrate 2, and is bonded to the conductive substrate 2. The bottom surface 302 is the lower surface of the second metal layer 33. A heat dissipating member (e.g., heat sink) or the like, which is not illustrated in the figure, can be attached to the bottom surface 302. The dimension of the supporting substrate 3 in the z direction (distance along the z direction from the supporting surface 301 to the bottom surface 302) is 0.7 mm to 2.0 mm, for example.

Each of the input terminals 41 to 43 and the output terminals 44 is a plate-like metal plate. The metal plate is made of Cu or a Cu alloy, for example. In the example shown in FIGS. 1 to 5, 8, and 10, the semiconductor module A1 includes the three input terminals 41 to 43 and the two output terminals 44.

Power supply voltage is applied to the three input terminals 41 to 43. In the present embodiment, the input terminal 41 is a positive electrode (P terminal), and the two input terminals 42 and 43 are negative electrodes (N terminal). Alternatively, the input terminal 41 may be a negative terminal (N terminal), and the two input terminals 42 and 43 may be positive terminals (P terminals). In this case, the wiring in the package may be appropriately changed according to the change in the polarity of each terminal. Each of the three input terminals 41 to 43 and the two output terminals 44 includes a portion covered with the sealing resin 8 and a portion exposed from a resin side surface of the sealing resin 8.

As shown in FIG. 14, the input terminal 41 is formed integrally with the first conductive portion 2A. Unlike this configuration, the input terminal 41 may be separated from the first conductive portion 2A and electrically bonded to the first conductive portion 2A. As shown in FIG. 8, for example, the input terminal 41 is offset in the x2 direction relative to the first semiconductor elements 10A and the first conductive portion 2A (conductive substrate 2). The input terminal 41 is electrically connected to the first conductive portion 2A, and is electrically connected to the reverse-surface electrodes 15 (drain electrodes) of the first semiconductor elements 10A via the first conductive portion 2A. The input terminal 41 is an example of a "first input terminal".

The input terminal 41 has an input-side bonding surface 411 and input-side side surfaces 412. The input-side bonding surface 411 faces in the z2 direction and extends in the x2 direction. Each of the input-side side surfaces 412 is located at the periphery of the input-side bonding surface 411 as viewed in the z direction, and faces in a direction intersecting with the input-side bonding surface 411. In the present embodiment, the input-side side surfaces 412 include a tip surface 413 and a pair of lateral surfaces 414. The tip surface 413 is positioned at the end of the input terminal 41 in the x2 direction and faces in the x2 direction. The pair of lateral surfaces 414 are located at the respective ends of the input terminal 41 in the y direction, and face in the y1 direction and the y2 direction, respectively. Among the input-side side surfaces 412, at least one of the tip surface 413 and the pair of lateral surfaces 414 has an input-side machining mark. The input-side machining mark is formed by the cutting process of a lead frame as described below.

As shown in FIG. 8, the two input terminals 42 and 43 are spaced apart from the first conductive portion 2A. The two input terminals 42 and 43 are bonded to the second conducting member 62. As shown in FIG. 8, for example, the two input terminals 42 and 43 are offset in the x2 direction relative to the first semiconductor elements 10A and the first conductive portion 2A (conductive substrate 2). The two input terminals 42 and 43 are electrically connected to the second conducting member 62, and are electrically connected to the second obverse-surface electrodes 12 (source electrodes) of the second semiconductor elements 10B via the second conducting member 62. The input terminal 42 is an example of a "second input terminal", and the input terminal 43 is an example of a "third input terminal".

The input terminal 42 has an input-side bonding surface 421 and input-side side surfaces 422, and the input terminal 43 has an input-side bonding surface 431 and input-side side surfaces 432. The input-side bonding surfaces 421 and 431 face in the z2 direction, and extend in the x2 direction. Each of the input-side side surfaces 422 is located at the periphery of the input-side bonding surface 421 as viewed in the z direction, and faces in a direction intersecting with the input-side bonding surface 421. Each of the input-side side surfaces 432 is located at the periphery of the input-side bonding surface 431 as viewed in the z direction, and faces in a direction intersecting with the input-side bonding surface 431. In the present embodiment, the input-side side surfaces 422 include a tip surface 423 and a pair of lateral surfaces 424. The tip surface 423 is positioned at the end of the input terminal 42 in the x2 direction and faces in the x2 direction. The pair of lateral surfaces 424 are located at the respective ends of the input terminal 42 in the y direction, and face in the y1 direction and the y2 direction, respectively. Among the input-side side surfaces 422, at least one of the tip surface 423 and the pair of lateral surfaces 424 has an input-side machining mark. The input-side machining mark is formed by the cutting process of a lead frame as described below. The input-side side surfaces 432 include a tip surface 433 and a pair of lateral surfaces 434. The tip surface 433 is positioned at the end of the input terminal 43 in the x2 direction and faces in the x2 direction. The pair of lateral surfaces 434 are located at the respective ends of the input terminal 43 in the y direction, and face in the y1 direction and the y2 direction, respectively. Among the input-side side surfaces 432, at least one of the tip surface 433 and the pair of lateral surfaces 434 has an input-side machining mark. The input-side machining mark is formed by the cutting process of a lead frame as described below.

As shown in FIGS. 1 to 5, 8, and 10, for example, the three input terminals 41 to 43 of the semiconductor module A1 protrude from the sealing resin 8 in the x2 direction. The three input terminals 41 to 43 are spaced apart from each other. The two input terminals 42 and 43 are located opposite from each other with the input terminal 41 therebetween in the y direction. The input terminal 42 is offset in the y2 direction relative to the input terminal 41, and the input terminal 43 is offset in the y1 direction relative to the input terminal 41. The three input terminals 41 to 43 overlap with each other as viewed in the y direction.

As is evident from FIGS. 8 and 14, the two output terminals 44 are integrally formed with the second conductive portion 2B. Unlike this configuration, the output terminals 44 may be separated from the second conductive portion 2B and electrically bonded to the second conductive portion 2B. As shown in FIG. 8, for example, the two output terminals 44 are offset in the x1 direction relative to the second semiconductor elements 10B and the second conductive portion 2B (conductive substrate 2). The output terminals 44 are electrically connected to the second conductive portion 2B, and are electrically connected to the reverse-surface electrodes 15 (drain electrodes) of the second semiconductor elements 10B via the second conductive portion 2B. The two output terminals 44 are examples of a "first output terminal" and a "second output terminal".

Each of the output terminals 44 has an output-side bonding surface 441 and output-side side surfaces 442. The output-side bonding surface 441 faces in the z2 direction and extends in the x1 direction. Each of the output-side side surfaces 442 is located at the periphery of the output-side bonding surface 441 as viewed in the z direction, and faces in a direction intersecting with the output-side bonding surface 441. In the present embodiment, the output-side side surfaces 442 include a tip surface 443 and a pair of lateral surfaces 444. The tip surface 443 is positioned at the end of the output terminal 44 in the x1 direction and faces in the x1 direction. The pair of lateral surfaces 444 are located at the respective ends of the output terminal 44 in the y direction, and face in the y1 direction and the y2 direction, respectively. Among the output-side side surfaces 442, at least one of the tip surface 443 and the pair of lateral surfaces 444 has an output-side machining mark. The output-side machining mark is formed by the cutting process of a lead frame as described below. The number of output terminals 44 is not limited to two, and may be one or no less than three. When the number of output terminals 44 is one, it is desirable that the output terminal 44 be connected to the middle section of the second conductive portion 2B in the y direction.

The control terminals 45 are pin-like terminals for controlling the semiconductor elements 10. The control terminals 45 include a plurality of first control terminals 46A to 46E and a plurality of second control terminals 47A to 47D. The first control terminals 46A to 46E are used to control the first semiconductor elements 10A. The second control terminals 47A to 47D are used to control the second semiconductor elements 10B.

The first control terminals 46A to 46E are arranged at intervals in the y direction. As shown in FIGS. 8 and 14, for example, the first control terminals 46A to 46E are supported by the first conductive portion 2A via the control terminal support 5 (a first supporting portion 5A described below). As shown in FIGS. 5 and 8, the first control terminals 46A to 46E are located between the first semiconductor elements 10A and the three input terminals 41 to 43 in the x direction.

The first control terminal 46A is a terminal (gate terminal) used to input a drive signal for the first semiconductor elements 10A. The first control terminal 46A receives the drive signal for driving the first semiconductor elements 10A (e.g., it receives application of gate voltage).

The first control terminal 46B is a terminal (source sense terminal) used to detect a source signal for the first semiconductor elements 10A. Voltage (corresponding to a source current) applied to the second obverse-surface electrodes 12 (source electrodes) of the first semiconductor elements 10A is detected from the first control terminal 46B.

The first control terminals 46C and 46D are terminals that are electrically connected to the diode function unit D1. The first control terminal 46C is electrically connected to the third obverse-surface electrode 13 of the first semiconductor element 10A having the diode function unit D1, and the first control terminal 46D is electrically connected to the fourth obverse-surface electrode 14 of the first semiconductor element 10A having the diode function unit D1.

The first control terminal 46E is a terminal (drain sense terminal) used to detect a drain signal for the first semiconductor elements 10A. Voltage (corresponding to a drain current) applied to the reverse-surface electrodes 15 (drain electrodes) of the first semiconductor elements 10A is detected from the first control terminal 46E.

The second control terminals 47A to 47D are arranged at intervals in the y direction. As shown in FIGS. 5 and 18, for example, the second control terminals 47A to 47D are supported by the second conductive portion 2B via the control terminal support 5 (a second supporting portion 5B described below). As shown in FIGS. 5 and 8, the second control terminals 47A to 47D are located between the second semiconductor elements 10B and the two output terminals 44 in the x direction.

Each of the control terminals 45 (first control terminals 46A to 46E and the second control terminals 47A to 47D) includes a holder 451 and a metal pin 452.

The holder 451 is made of a conductive material. As shown in FIG. 15, the holder 451 is bonded to the control terminal support 5 (a first metal layer 52 described below)

via a conductive bonding member 459. The holder 451 includes a tubular portion, an upper-end flange portion, and a lower-end flange portion. The upper-end flange portion is joined to the top of the tubular portion, and the lower-end flange portion is joined to the bottom of the tubular portion. The metal pin 452 is inserted through at least the upper-end flange portion and the tubular portion of the holder 451. The upper surface of the upper-end flange portion is exposed from the sealing resin 8 (a second protruding portion 852 described below), and is covered with the resin member 87.

The metal pin 452 is a rod-like member extending in the z direction. The metal pin 452 is supported by being pressed into the holder 451. The metal pin 452 is electrically connected to the control terminal support 5 (a first metal layer 52 described below) at least via the holder 451. As shown in the example in FIG. 15, when the lower end (end in the z1 direction) of the metal pin 452 is in contact with the conductive bonding member 459 within the insertion hole of the holder 451, the metal pin 452 is electrically connected to the control terminal support 5 via the conductive bonding member 459.

The control terminal support 5 supports the control terminals 45. The control terminal support 5 is provided between the obverse surface 201 (conductive substrate 2) and the control terminals 45.

The control terminal support 5 includes a first supporting portion 5A and a second supporting portion 5B. The first supporting portion 5A is arranged on the first conductive portion 2A of the conductive substrate 2, and supports the first control terminals 46A to 46E among the control terminals 45. As shown in FIG. 15, the first supporting portion 5A is bonded to the first conductive portion 2A via a bonding member 59. The bonding member 59 may be conductive or insulative. For example, the bonding member 59 may be solder. The second supporting portion 5B is arranged on the second conductive portion 2B of the conductive substrate 2, and supports the second control terminals 47A to 47D among the control terminals 45. The second supporting portion 5B is bonded to the second conductive portion 2B via the bonding member 59.

The control terminal support 5 (the first supporting portion 5A and the second supporting portion 5B) may be a DBC substrate, for example. Each of the supporting portions of the control terminal support 5 includes an insulating layer 51, a first metal layer 52, and a second metal layer 53 that are stacked on each other.

The insulating layer 51 is made of a ceramic, for example. The insulating layer 51 has a rectangular shape in plan view, for example.

As shown in FIG. 15, for example, the first metal layer 52 is formed on the upper surface of the insulating layer 51. The control terminals 45 are erected on the first metal layer 52. The first metal layer 52 is made of Cu or a Cu alloy, for example. As shown in FIG. 8, the first metal layer 52 includes a first portion 521, a second portion 522, a third portion 523, a fourth portion 524, and a fifth portion 525. The first portion 521, the second portion 522, the third portion 523, the fourth portion 524, and the fifth portion 525 are spaced apart and insulated from each other.

A plurality of wires 731 are bonded to the first portion 521, so that the first portion 521 is electrically connected to the first obverse-surface electrodes 11 (gate electrodes) of the semiconductor elements 10 via the wires 731. As shown in FIG. 8, the first control terminal 46A is bonded to the first portion 521 of the first supporting portion 5A, and the second control terminal 47A is bonded to the first portion 521 of the second supporting portion 5B.

A plurality of wires 732 are bonded to the second portion 522, so that the second portion 522 is electrically connected to the second obverse-surface electrodes 12 (source electrodes) of the semiconductor elements 10 via the wires 732. As shown in FIG. 8, the first control terminal 46B is bonded to the second portion 522 of the first supporting portion 5A, and the second control terminal 47B is bonded to the second portion 522 of the second supporting portion 5B.

A wire 733 is bonded to the third portion 523, so that the third portion 523 is electrically connected to the third obverse-surface electrode 13 of the semiconductor element 10 having the diode function unit D1 via the wire 733. As shown in FIG. 8, the first control terminal 46C is bonded to the third portion 523 of the first supporting portion 5A, and the second control terminal 47C is bonded to the third portion 523 of the second supporting portion 5B.

A wire 734 is bonded to the fourth portion 524, so that the fourth portion 524 is electrically connected to the fourth obverse-surface electrode 14 of the semiconductor element 10 having the diode function unit D1 via the wire 734. As shown in FIG. 8, the first control terminal 46D is bonded to the fourth portion 524 of the first supporting portion 5A, and the second control terminal 47D is bonded to the fourth portion 524 of the second supporting portion 5B.

A wire 735 is bonded to the fifth portion 525 of the first supporting portion 5A, and the fifth portion 525 is electrically connected to the first conductive portion 2A. The fifth portion 525 of the second supporting portion 5B is not electrically connected to other components. As shown in FIG. 8, the first control terminal 46E is bonded to the fifth portion 525 of the first supporting portion 5A.

As shown in FIG. 15, for example, the second metal layer 53 is formed on the lower surface of the insulating layer 51. As shown in FIG. 15, the second metal layer 53 of the first supporting portion 5A is bonded to the first conductive portion 2A via the bonding member 59. The second metal layer 53 of the second supporting portion 5B is bonded to the second conductive portion 2B via the bonding member 59.

The conducting member 6, together with the conductive substrate 2, forms the path of a main circuit current switched by the semiconductor elements 10. The conducting member 6 is separated from the obverse surface 201 (conductive substrate 2) in the z2 direction, and overlaps with the obverse surface 201 in plan view. In the present embodiment, the conducting member 6 is made of a metal plate-like member. The metal is Cu or a Cu alloy, for example. Specifically, the conducting member 6 is a metal plate-like member that is bent. Alternatively, the conducting member 6 may be formed with a metal foil member. In the present embodiment, the conducting member 6 includes a plurality of first conducting members 61 and a second conducting member 62. The main circuit current includes a first main circuit current and a second main circuit current. The first main circuit current flows through a path between the input terminal 41 and the output terminals 44. The second main circuit current flows through a path between the output terminals 44 and the input terminals 42, 43.

The first conducting members 61 are connected to the second obverse-surface electrodes 12 (source electrodes) of the first semiconductor elements 10A and the second conductive portion 2B, so that the second obverse-surface electrodes 12 of the first semiconductor elements 10A are electrically connected to the second conductive portion 2B. The first conducting members 61 and the second obverse-surface electrodes 12 (see FIG. 8) of the first semiconductor elements 10A, as well as the first conducting members 61 and the second conductive portion 2B, are bonded to each other via the conductive bonding member 69. The conductive bonding member 69 may be made of solder, a metal paste material, or a sintered metal. As shown in FIG. 8, each of the first conducting members 61 has a band shape extending along the x direction in plan view.

In the present embodiment, each of the first conducting members 61 has a rectangular portion connecting the first semiconductor element 10A and the second conductive portion 2B, and the rectangular portion is formed with an opening 61h, as shown in FIG. 6, for example. The opening 61h may be a through-hole that penetrates through in the z direction, and is preferably formed in the center of the rectangular portion in plan view. The opening 61h is formed so that when a flowable resin material is injected to form a sealing resin, the resin material can easily flow between the upper side (in the z2 direction) and the lower side (in the z1 direction) near the first conducting member 61. In plan view, the opening 61h may have a perfectly circular shape, or may have another shape such as an oval shape or a rectangular shape. Each of the first conducting members 61 is not limited to having the configuration described above, and may not be formed with an opening 61h.

In the present embodiment, the number of first conducting members 61 is three so as to correspond to the number of first semiconductor elements 10A. Alternatively, a single first conducting member 61 common to the first semiconductor elements 10A may be used, without depending on the number of first semiconductor elements 10A.

The second conducting member 62 electrically connects the second obverse-surface electrodes 12 of the second semiconductor elements 10B to the input terminals 42 and 43. The second conducting member 62 may have a maximum dimension of 25 mm to 40 mm (preferably about 32 mm) in the x direction, and a maximum dimension of 30 mm to 45 mm (preferably about 38 mm) in the y direction. As shown in FIG. 6, the second conducting member 62 includes a first wiring portion 621, a second wiring portion 622, a third wiring portion 623, and a fourth wiring portion 624.

The first wiring portion 621 is connected to the input terminal 42. The first wiring portion 621 and the input terminal 42 are bonded with the conductive bonding member 69. The first wiring portion 621 has a band shape extending in the x direction in plan view.

The second wiring portion 622 is connected to the input terminal 43. The second wiring portion 622 and the input terminal 43 are bonded with the conductive bonding member 69. The second wiring portion 622 has a band shape extending in the x direction in plan view. The first wiring portion 621 and the second wiring portion 622 are spaced apart from each other in the y direction and arranged substantially in parallel to each other. The second wiring portion 622 is offset in the y1 direction relative to the first wiring portion 621.

The third wiring portion 623 is joined to the first wiring portion 621 and the second wiring portion 622. The third wiring portion 623 has a band shape extending in the y direction in plan view. As is evident from FIG. 6, the third wiring portion 623 overlaps with the second semiconductor elements 10B in plan view. As shown in FIG. 17, the third wiring portion 623 is connected to the second semiconductor elements 10B. The third wiring portion 623 has a plurality of recessed areas 623a. As shown in FIG. 17, the recessed areas 623a are recessed in the z1 direction relative to the other areas of the third wiring portion 623. The recessed areas 623a of the third wiring portion 623 are bonded to the second semiconductor elements 10B. The recessed areas 623a of the third wiring portion 623 and the second obverse-surface electrodes 12 (see FIG. 8) of the second semiconductor elements 10B are bonded with the conductive bonding member 69.

The fourth wiring portion 624 is joined to the first wiring portion 621 and the second wiring portion 622. The fourth wiring portion 624 is also connected to the third wiring portion 623. The fourth wiring portion 624 is offset in the x2 direction relative to the third wiring portion 623. As is evident from FIG. 6, the fourth wiring portion 624 overlaps with the first semiconductor elements 10A in plan view. The fourth wiring portion 624 includes a first band portion 625 and a plurality of second band portions 626.

The first band portion 625 is a part of the fourth wiring portion 624 that has a band shape in plan view, and is spaced apart from the third wiring portion 623 in the x direction. The first band portion 625 is joined to the first wiring portion 621 and the second wiring portion 622. The first band portion 625 overlaps with the first semiconductor elements 10A in plan view. The first band portion 625 has a plurality of protruding areas 625a. As shown in FIG. 16, the protruding areas 625a protrude in the z2 direction relative to the other areas of the first band portion 625. As shown in FIG. 6, the protruding areas 625a overlap with the first semiconductor elements 10A in plan view. Since the first band portion 625 has the protruding areas 625a, areas for bonding the first conducting members 61 are provided on the first semiconductor elements 10A, as shown in FIG. 16. This prevents the first band portion 625 from being in contact with the first conducting members 61.

Each of the second band portions 626 is connected to the first band portion 625 and the third wiring portion 623. Each of the second band portions 626 has a band shape extending in the x direction in plan view. The second band portions 626 are spaced apart from each other in the y direction and arranged substantially in parallel to each other. In plan view, one end of each band portion 626 is connected to a part of the first band portion 625, which is located between two first semiconductor elements 10A adjacent in the y direction, and the other end of each band portion 626 is connected to a part of the third wiring portion 623, which is located between two second semiconductor elements 10B adjacent in the y direction.

The first band portion 625 has a first edge 627 and a second edge 628. As shown in FIG. 7, the first edge 627 is offset in the x1 direction relative to the first side 191 in plan view, and extends at least from the third side 193 to the fourth side 194 in the y direction. As such, two corners 171 and 172 of each first semiconductor element 10A in the x2 direction do not overlap with the second conducting member 62 in plan view. The two corners are the corner 171 formed by the first side 191 and the third side 193, and the corner 172 formed by the first side 191 and the fourth side 194. Accordingly, in each of the first semiconductor elements 10A, parts of the two sides forming each of the corners 171 and 172 are visible in plan view (specifically, when viewed as shown in FIG. 7; the same applies hereinafter). As shown in FIG. 7, the second edge 628 is offset in the x2 direction relative to the second side 192 in plan view, and extends at least from the third side 193 to the fourth side 194 in the y direction. As such, two corners 173 and 174 of each first semiconductor element 10A in the x1 direction do not overlap with the second conducting member 62 in plan view. The two corners are the corner 173 formed by the second side 192 and the third side 193, and the corner 174 formed by the second side 192 and the fourth side 194. Accordingly, in each of the first semiconductor elements 10A, parts of the two sides forming each of the corners 173 and 174 are visible in plan view.

Regarding the corners 171, 172, 173, and 174, it is sufficient for each of the visible portions of the two sides forming each of the corners 171, 172, 173, and 174 to have a length greater than 0 μm and no greater than 200 μm in plan view. Furthermore, it is preferable that in plan view, the length of each of the visible portions of the two sides forming each of the corners 171, 172, 173, and 174 be no less than 5 μm and no greater than 150 μm. When the length of each of the visible portions of the two sides forming each of the corners 171, 172, 173, and 174 is no less than 2 μm, it is possible to detect the corners of each of the first semiconductor elements 10A. When the length of each of the visible portions of the two sides is no less than 5 μm, it is possible to reliably detect the corners of each of the first semiconductor elements 10A. When the length of each of the visible portions of the two sides is greater than 200 μm, the bonding areas between the first conducting members 61 and the first semiconductor elements 10A become smaller than necessary, which is not desirable. It is preferable that the upper limit of the length of each of the visible portions of the two sides be no greater than 150 μm, because the bonding area between the first conducting members 61 and the first semiconductor elements 10A is prevented from being too small.

As shown in FIG. 6, the conducting member 6 (first conducting members 61 and the second conducting member 62) has first portions 601. The first portions 601 are areas that overlap with the semiconductor elements 10 (the first semiconductor elements 10A and the second semiconductor elements 10B) in plan view. At the second conducting member 62, parts of the fourth wiring portion 624 (areas overlapping with the first semiconductor elements 10A in plan view) and parts of the third wiring portion 623 (areas overlapping with the second semiconductor elements 10B in plan view) constitute the first portions 601.

As shown in FIGS. 6 and 8, the obverse-surface electrodes 11, 13, 14, and 16 of one of the first semiconductor elements 10A (the first semiconductor element 10A having the diode function unit D1) are aligned along the y direction at the end of the first semiconductor element 10A in the x2 direction. In plan view, the first conducting members 61 and the second conducting member 62 do not overlap with the obverse-surface electrodes 11, 13, 14, and 16 of the first semiconductor element 10A or with the corners 171 and 172 thereof in the x2 direction. Furthermore, in plan view, the first conducting members 61 and the second conducting member 62 do not overlap with at least one of the corners 173 and 174 of the first semiconductor element 10A in the x1 direction (opposite from the side where the obverse-surface electrodes are arranged). As such, at least three corners among the four corners 171, 172, 173, and 174 of the semiconductor element 10A are visible in plan view. This makes it possible to inspect whether the first semiconductor elements 10A are correctly mounted by automatic visual inspection when the first semiconductor elements 10A, the conducting members 61, and the second conducting member 62 are mounted on the conductive substrate 2. In plan view, the four corners 171, 172, 173, and 174 of each of the first semiconductor elements 10A may all be visible. Note that the obverse-surface electrodes 11, 13, 14, and 16 of the first semiconductor element 10A are examples of "obverse-surface electrodes on one side".

As shown in FIG. 6, each of the second semiconductor elements 10B has a rectangular shape in plan view, similarly to the first semiconductor elements 10A, and has four corners 181, 182, 183, and 184 corresponding to the four corners 171, 172, 173, and 174 of each first semiconductor element 10A. The above-described relationship in plan view between the four corners 171, 172, 173, and 174 of each first semiconductor element 10A and the first and second conducting members 61, 62 also holds for the relationship in plan view between the four corners 181, 182, 183, and 184 of each second semiconductor element 10B and the second conducting member 62.

As shown in FIG. 5, the second conducting member 62 includes first portions 62A and second portions 62B. The first portions 62A overlap with the obverse surface 201 of the conductive substrate 2 (the obverse surface 201 of either the first conductive portion 2A or the second conductive portion 2B) in plan view, and do not overlap with any of the semiconductor elements 10 in plan view. The second portions 62B overlap with the obverse surface 201 in plan view, and overlap with the semiconductor elements 10 in plan view. In FIG. 5, the first portions 62A are shown with hatching that diagonally rising to the right, and the second portions 62B are shown with hatching that diagonally falling to the right. The first portions 62A have openings 63. As shown in FIGS. 5 and 13, for example, the openings 63 are partially cut away portions in plan view. In the present embodiment, the openings 63 are provided at positions that overlap with the obverse surface 201 of the first conductive portion 2A (conductive substrate 2) in plan view, and that do not overlap with the semiconductor elements 10 in plan view. The openings 63 are through-holes that penetrate through in the z direction, for example. The openings 63 include one formed in the first wiring portion 621 and one formed in the second wiring portion 622. The openings 63 are provided in the vicinity of at least two of the four corners of the conductive substrate 2 in plan view. For example, one of the openings 63 is provided at an area of the first wiring portion 621 in the x2 direction, and the other at an area of the second wiring portion 622 in the x2 direction. Note that the planar shape of each opening 63 is not limited. For example, the openings 63 may be holes as described in the present embodiment or notches unlike the present embodiment. The openings 63 may be formed by electroforming, for example. In this case, the second conducting member 62 has openings 63 in areas not electrodeposited with a metal, instead of the openings 63 formed by removing portions of the second conducting member 62.

The second conducting member 62 is formed with openings 625*h* in rectangular portions that overlap with the first semiconductor elements 10A in plan view. In the present embodiment, it is preferable that the openings 625*h* be formed to overlap with the centers of the first semiconductor elements 10A in plan view. The openings 625*h* are through-holes (see FIG. 6) formed in the protruding areas 625*a* of the first band portion 625 (fourth wiring portion 624), for example. The openings 625*h* are used, when the first conducting members 61 and the first semiconductor elements 10A are bonded, to optically check the bonding state from above.

The second conducting member 62 is formed with openings 623*h* in rectangular portions that overlap with the second semiconductor elements 10B in plan view. In the present embodiment, it is preferable that the openings 623*h* be formed to overlap with the centers of the second semiconductor elements 10B in plan view. The openings 623*h* are through-holes formed in the recessed areas 623*a* of the third wiring portion 623, for example. The openings 623*h* are used when the second conducting member 62 is positioned relative to the conductive substrate 2. In plan view, each of the two types of openings 623h and 625h may have a perfectly circular shape, or may have another shape such as an oval shape or a rectangular shape.

The second conducting member 62 is not limited to having the configuration described above, and may not include the fourth wiring portion 624. However, the second conducting member 62 is preferably provided with the fourth wiring portion 624 in order to reduce the inductance value due to the current flowing through the second conducting member 62.

The first conductive bonding member 71 is provided between the conductive substrate 2 and the supporting substrate 3 to electrically bond the conductive substrate 2 and the supporting substrate 3. The first conductive bonding member 71 includes a conductive bonding portion that electrically bonds the first conductive portion 2A to the first portion 32A, and a conductive bonding portion that electrically bonds the second conductive portion 2B to the second portion 32B. As shown in FIG. 15, the first conductive bonding member 71 includes a first base layer 711, a first layer 712, and a second layer 713 that are stacked on each other.

As shown in FIG. 15, it is most preferable that a side surface of the first conductive bonding member 71 and a side surface of the first metal layer 32, which is the top layer of the supporting substrate 3, be flush with each other. It is preferable that in plan view, the side surface of the first metal layer 32 is positioned slightly more inward than the side surface of the first conductive bonding member 71. That is, in plan view, bonding is performed such that the side surface of the first metal layer 32 does not extend outward from the side surface of the first conductive bonding member 71. If the side surface of the first metal layer 32 extends more outward than the side surface of the first conductive bonding member 71 in plan view, the creepage distance between the first metal layer 32 and the second metal layer 33 becomes undesirably small. In plan view, the side surface of the first metal layer 32 is positioned more outward than a side surface of the base member 21 in the conductive substrate 2.

The first base layer 711 is made of a metal, such as aluminum (Al) or an Al alloy. The first base layer 711 is made of a sheet material. The Young's modulus of Al, which is the material of the first base layer 711, is 70.3 GPa.

The first layer 712 is formed on the upper surface of the first base layer 711. The first layer 712 is provided between the first base layer 711 and the conductive substrate 2 (each of the first conductive portion 2A and the second conductive portion 2B). The first layer 712 is a Ag plating layer, for example. The first layer 712 is bonded to the respective reverse-surface bonding layers 23 of the first conductive portion 2A and the second conductive portion 2B by the solid-phase diffusion of metal, for example. In other words, the first layer 712 and the reverse-surface bonding layers 23 of the first conductive portion 2A and the second conductive portion 2B are bonded by solid-phase diffusion. As a result, the first layer 712 and the reverse-surface bonding layers 23 are bonded in direct contact with each other at the bonding interface. In the present disclosure, "A and B are bonded by solid-phase diffusion" means that as a result of solid-phase diffusion bonding, A and B are fixed to each other in direct contact at the bonding interface, where A and B constitute a solid-phase diffusion layer. When solid-phase diffusion bonding is performed under an ideal condition, the bonding interface may not exist clearly due to the diffusion of metal elements. On the other hand, when an inclusion such as an oxidation film is formed on the surface layers of A and B, or when there is a gap between A and B, the inclusion or the gap may exist at the bonding interface.

The second layer 713 is formed on the lower surface of the first base layer 711. The second layer 713 is provided between the first base layer 711 and the supporting substrate 3 (each of the first portion 32A and the second portion 32B). The second layer 713 is a Ag plating layer, for example. The second layer 713 is bonded to the first bonding layer 321 formed on each of the first portion 32A and the second portion 32B by solid-phase diffusion of metal. In other words, the second layer 713 and the first bonding layer 321 are bonded by solid-phase diffusion in direct contact with each other at the bonding interface. The Young's modulus of silver (Ag), which is the material of the first layer 712 and the second layer 713, is 82.7 GPa.

Since the first base layer 711, the first layer 712, and the second layer 713 in the first conductive bonding member 71 are made of the materials described above, the Young's modulus of the first base layer 711 is smaller than the Young's modulus of each of the first layer 712 and the second layer 713. The thickness (dimension in the z direction) of the first base layer 711 is greater than the thickness of each of the first layer 712 and the second layer 713.

In the first conductive bonding member 71, an end surface of the first base layer 711, which is made of Al or an Al alloy, is not plated with Ag, so that the end surface of the first base layer 711 is exposed. Note that the end surface of the first base layer 711 may be plated with Ag. In view of reducing the manufacturing cost of the first conductive bonding member 71, it is preferable to fabricate the first conductive bonding member 71 by forming Ag plating on both surfaces of a large sheet material and then cutting the Ag-plated sheet material. In this regard, it is preferable that the end surface of the first base layer 711 not be plated with Ag.

The second conductive bonding member 72 is provided between the conductive substrate 2 and the semiconductor elements 10 to electrically bond the conductive substrate 2 and the semiconductor elements 10. The second conductive bonding member 72 includes a conductive bonding portion that electrically bonds the first semiconductor elements 10A to the first conductive portion 2A, and a conductive bonding portion that electrically bonds the second semiconductor elements 10B to the second conductive portion 2B. As shown in FIG. 15, the second conductive bonding member 72 includes a second base layer 721, a third layer 722, and a fourth layer 723 that are stacked on each other.

The second base layer 721 is made of a metal, such as Al or an Al alloy. The second base layer 721 is made of a sheet material.

The third layer 722 is formed on the upper surface of the second base layer 721. The third layer 722 is provided between the second base layer 721 and the semiconductor elements 10. The third layer 722 is a Ag plating layer, for example. The third layer 722 is bonded to the reverse-surface electrodes 15 of the semiconductor elements 10 by the solid-phase diffusion of metal, for example. In other words, the third layer 722 and the reverse-surface electrodes 15 are bonded by solid-phase diffusion in direct contact with each other at the bonding interface.

The fourth layer 723 is formed on the lower surface of the second base layer 721. The fourth layer 723 is provided between the second base layer 721 and the conductive substrate 2 (each of the first conductive portion 2A and the second conductive portion 2B). The fourth layer 723 is a Ag plating layer, for example. The fourth layer 723 is bonded to the respective obverse-surface bonding layers 22 of the first conductive portion 2A and the second conductive portion 2B by the solid-phase diffusion of metal, for example. In other words, the fourth layer 723 and the obverse-surface bonding layers 22 are bonded by solid-phase diffusion in direct contact with each other at the bonding interface.

Since the second base layer 721, the third layer 722, and the fourth layer 723 in the second conductive bonding member 72 are made of the materials described above, the Young's modulus of the second base layer 721 is smaller than the Young's modulus of each of the third layer 722 and the fourth layer 723. The thickness (dimension in the z direction) of the second base layer 721 is greater than the thickness of each of the third layer 722 and the fourth layer 723.

In the second conductive bonding member 72, an end surface of the second base layer 721, which is made of Al or an Al alloy, is not plated with Ag, so that the end surface of the second base layer 721 is exposed. Note that the end surface of the second base layer 721 may be plated with Ag. In view of reducing the manufacturing cost of the second conductive bonding member 72, it is preferable to fabricate the second conductive bonding member 72 by forming Ag plating on both surfaces of a large sheet material and then cutting the Ag-plated sheet material. In this regard, it is preferable that the end surface of the second base layer 721 not be plated with Ag.

Each of the wires 731 to 735 electrically connects two members that are separated from each other. The wires 731 to 735 are bonding wires, for example. The material of each of the wires 731 to 735 contains one of gold (Au), Al, or Cu, for example.

As shown in FIG. 8, each of the wires 731 is bonded to and electrically connects the first obverse-surface electrode 11 (gate electrode) of a semiconductor element 10 and a first portion 521 (first metal layer 52) of the control terminal support 5. As shown in FIG. 8, the plurality of wires 731 include a plurality of first wires 731a and a plurality of second wires 731b. Each of the first wires 731a is connected to the first obverse-surface electrode 11 (gate electrode) of one of the first semiconductor elements 10A and the first portion 521 (first metal layer 52) of the first supporting portion 5A. As a result, the first control terminal 46A is electrically connected to the first obverse-surface electrodes 11 (gate electrodes) of the first semiconductor elements 10A via the first wires 731a. Each of the second wires 731b is connected to the first obverse-surface electrode 11 (gate electrode) of one of the second semiconductor elements 10B and the first portion 521 (first metal layer 52) of the second supporting portion 5B. As a result, the second control terminal 47A is electrically connected to the first obverse-surface electrodes 11 (gate electrodes) of the second semiconductor elements 10B via the second wires 731b.

As shown in FIG. 8, each of the wires 732 is bonded to and electrically connects the second obverse-surface electrode 12 (source electrode) of a semiconductor element 10 and a second portion 522 (first metal layer 52) of the control terminal support 5. As for each of the semiconductor elements 10 having the diode function units D1, the wire 732 is bonded to the fifth obverse-surface electrode 16 (source sense electrode) instead of the second obverse-surface electrode 12 (source electrode).

As shown in FIG. 8, each of the wires 733 is bonded to and electrically connects the third obverse-surface electrode 13 of one of the semiconductor elements 10 having the diode function units D1 and a third portion 523 (first metal layer 52) of the control terminal support 5.

As shown in FIG. 8, each of the wires 734 is bonded to and electrically connects the fourth obverse-surface electrode 14 of one of the semiconductor elements 10 having the diode function units D1 and a fourth portion 524 (first metal layer 52) of the control terminal support 5.

As shown in FIG. 8, the wire 735 is bonded to and electrically connects the obverse surface 201 of the first conductive portion 2A (conductive substrate 2) and the fifth portion 525 (first metal layer 52) of the first supporting portion 5A (control terminal support 5).

The sealing resin 8 covers the semiconductor elements 10, the conductive substrate 2, the supporting substrate 3 (except the bottom surface 302), parts of the input terminals 41 to 43, parts of the output terminals 44, parts of the control terminals 45, the control terminal support 5, the conducting member 6, and the wires 731 to 735. The sealing resin 8 is made of a black epoxy resin, for example. The sealing resin 8 may be formed by molding described below. The sealing resin 8 may have a dimension of about 35 mm to 60 mm in the x direction, a dimension of about 35 mm to 50 mm in the y direction, and a dimension of about 4 mm to 15 mm in the z direction. Each of these dimensions is the size of the largest portion along one of the directions. The sealing resin 8 has a resin obverse surface 81, a resin reverse surface 82, and a plurality of resin side surfaces 831 to 834.

As shown in FIGS. 9, 11, and 12, for example, the resin obverse surface 81 and the resin reverse surface 82 are spaced apart from each other in the z direction. The resin obverse surface 81 faces in the z2 direction, and the resin reverse surface 82 faces in the z1 direction. The control terminals 45 (first control terminals 46A to 46E and the second control terminals 47A to 47D) protrude from the resin obverse surface 81. As shown in FIG. 10, the resin reverse surface 82 has a frame shape surrounding the bottom surface 302 of the supporting substrate 3 (lower surface of the second metal layer 33) in plan view. The bottom surface 302 of the supporting substrate 3 is exposed from the resin reverse surface 82, and is flush with the resin reverse surface 82, for example. The resin side surfaces 831 to 834 are joined to the resin obverse surface 81 and the resin reverse surface 82, and are flanked by these surfaces in the z direction. As shown in FIG. 4, the resin side surface 831 and the resin side surface 832 are spaced apart from each other in the x direction. The resin side surface 831 faces in the x1 direction, and the resin side surface 832 faces in the x2 direction. The two output terminals 44 protrude from the resin side surface 831, and the three input terminals 41 to 43 protrude from the resin side surface 832. As shown in FIG. 4, for example, the resin side surface 833 and the resin side surface 834 are spaced apart from each other in the y direction. The resin side surface 833 faces in the y1 direction, and the resin side surface 834 faces in the y2 direction.

As shown in FIG. 4, the resin side surface 832 is formed with a plurality of recessed portions 832a. The recessed portions 832a are recessed in the x direction in plan view. The recessed portions 832a include one formed between the input terminal 41 and the input terminal 42, and one formed between the input terminal 41 and the input terminal 43 in plan view. The recessed portions 832a are provided to increase the creepage distance between the input terminal 41 and the input terminal 42 along the resin side surface 832, and to increase the creepage distance between the input terminal 41 and the input terminal 43 along the resin side surface 832.

As shown in FIGS. 13 and 14, the sealing resin 8 has a plurality of first protrusions 851, a plurality of second protrusions 852, and resin voids 86.

The first protrusions 851 protrude from the resin obverse surface 81 in the z direction. The first protrusions 851 are arranged near the four corners of the sealing resin 8 in plan view. The tip end (end in the z2 direction) of each of the first protrusions 851 is formed with a first protruding end surface 851*a*. The first protruding end surfaces 851*a* of the first protrusions 851 are substantially parallel to the resin obverse surface 81 and positioned on the same plane (x-y plane) as the resin obverse surface 81. Each of the first protrusions 851 has a bottomed hollow truncated cone shape, for example. The first protrusions 851 are used for an apparatus that uses a power supply generated by the semiconductor module A1, and function as spacers when the semiconductor module A1 is mounted on, for example, a control circuit board of the apparatus. Each of the first protrusions 851 has a recessed portion 851*b* and an inner wall surface 851*c* formed in the recessed portion 851*b*. It suffices for the first protrusions 851 to have a pillar shape, preferably a columnar shape. It is preferable that each of the recessed portions 851*b* have a columnar shape, and each of the inner wall surfaces 851*c* have a single perfect circular shape in plan view.

The semiconductor module A1 may be mechanically fixed to a control circuit board or the like by, for example, a screwing method. In this case, the threads of female screws may be formed in the inner wall surfaces 851*c* of the recessed portions 851*b* in the first protrusions 851. It is also possible to embed an insert nut in the recessed portion 851*b* of each of the first protrusions 851.

As shown in FIG. 14, for example, the second protrusions 852 protrude from the resin obverse surface 81 in the z direction. The second protrusions 852 overlap with the control terminals 45 in plan view. The metal pins 452 of the control terminals 45 protrude from the second protrusions 852. A part of each holder 451 (upper surface of each upper-end flange portion) is exposed from the upper end surface of each second protrusion 852. Each of the second protrusions 852 has a truncated cone shape. The resin members 87 are provided on the second protrusions 852.

As shown in FIG. 13, each of the resin voids 86 passes from the resin obverse surface 81 to the recessed portion 201*a* formed in the obverse surface 201 of the conductive substrate 2 in the z direction. Each of the resin voids 86 is formed to be tapered such that the cross-sectional area thereof decreases along the z direction from the resin obverse surface 81 to the recessed portion 201*a*. A resin void edge 861 of each of the resin voids 86, which is in contact with the obverse surface 201, and a recess edge 201*b* of each of the recessed portions 201*a*, which is in contact with the obverse surface 201, coincide with each other. The resin voids 86 are portions that are formed in a molding process described below, and in which the sealing resin 8 is not formed during the molding process.

The resin members 87 are provided on the second protrusions 852 of the sealing resin 8. The resin members 87 cover parts of the control terminals 45, i.e., parts (upper surfaces of the upper-end flange portions) of the holders 451 that are exposed from the sealing resin 8, and parts of the metal pins 452. For example, the resin members 87 are made of epoxy resin, as with the sealing resin 8, but may be made of a material different from the material of the sealing resin 8.

The resin-filling portions 88 are provided for the resin voids 86 to fill the resin voids 86. For example, the resin-filling portions 88 are made of epoxy resin, as with the sealing resin 8, but may be made of a material different from the material of the sealing resin 8.

Figure 21:
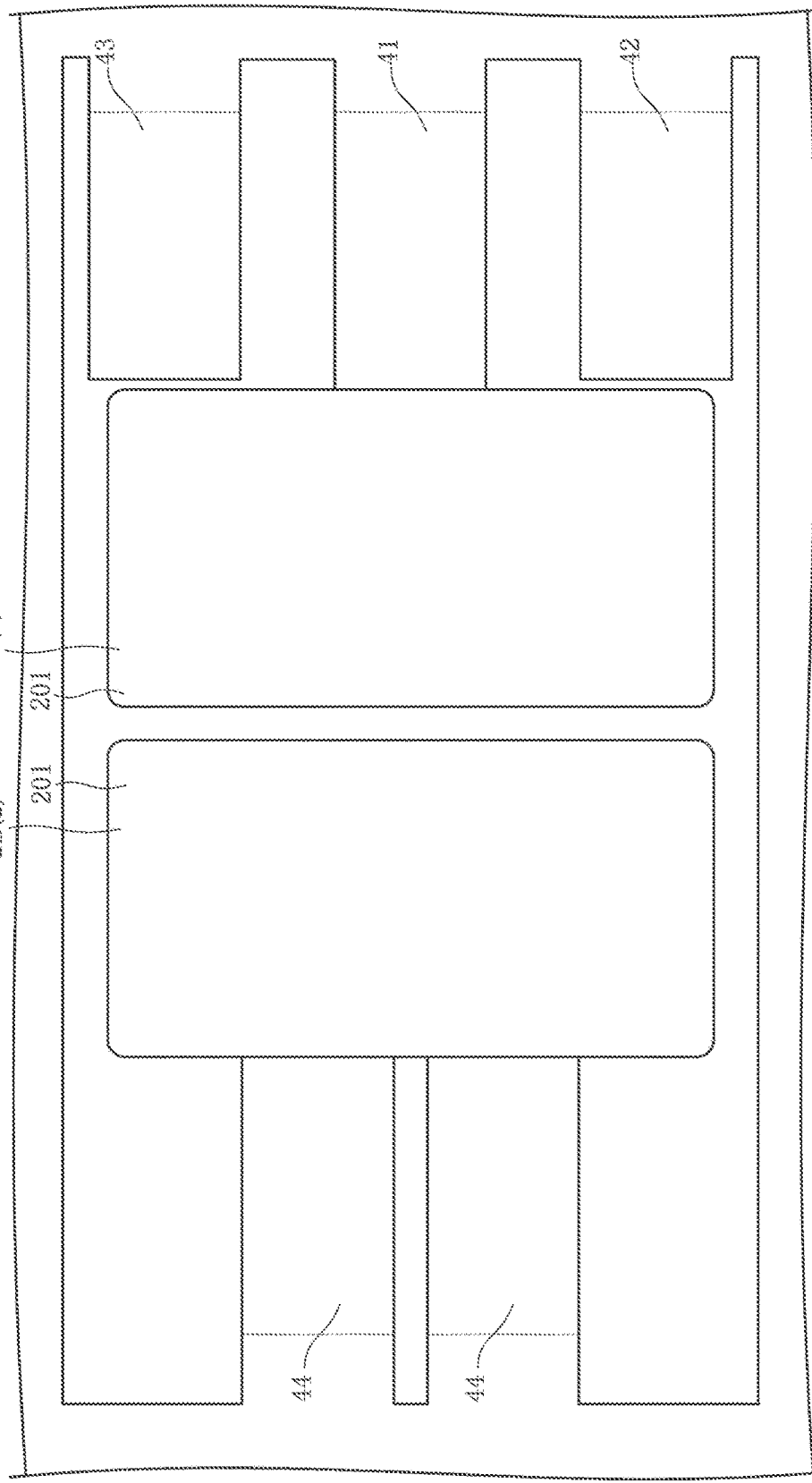
FIG. 21 is a plan view illustrating a step of a method for manufacturing the semiconductor module according to the first embodiment.
Figure 22:
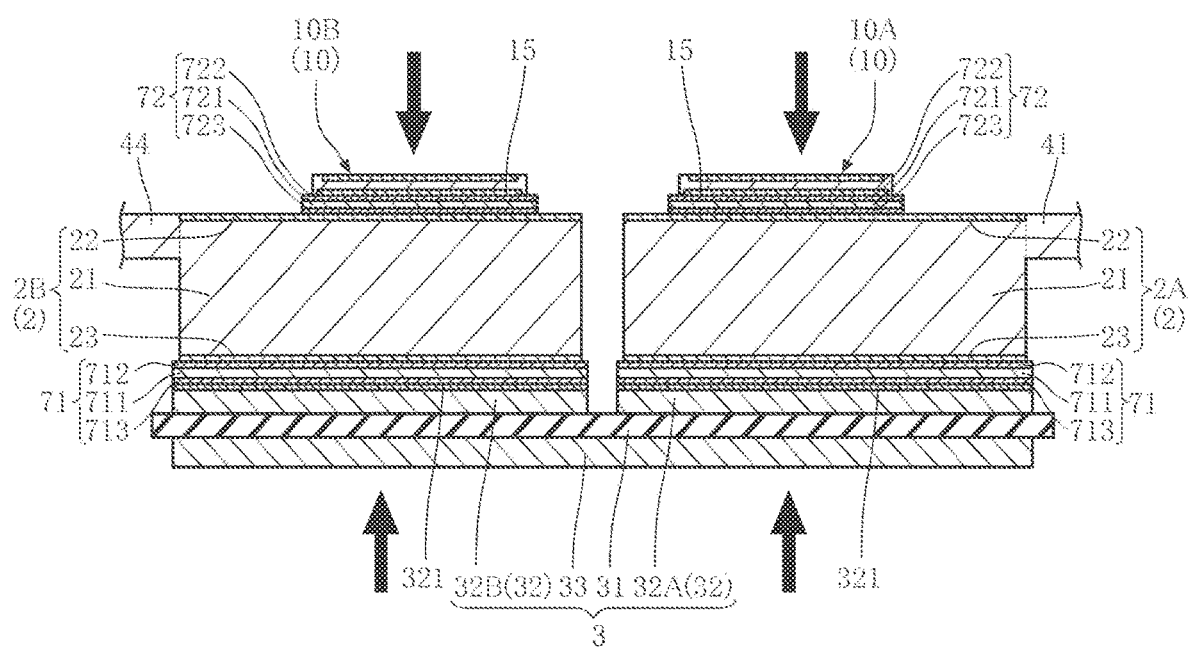
FIG. 22 is a schematic cross-sectional view illustrating a step of the method for manufacturing the semiconductor module according to the first embodiment.
Figure 23:
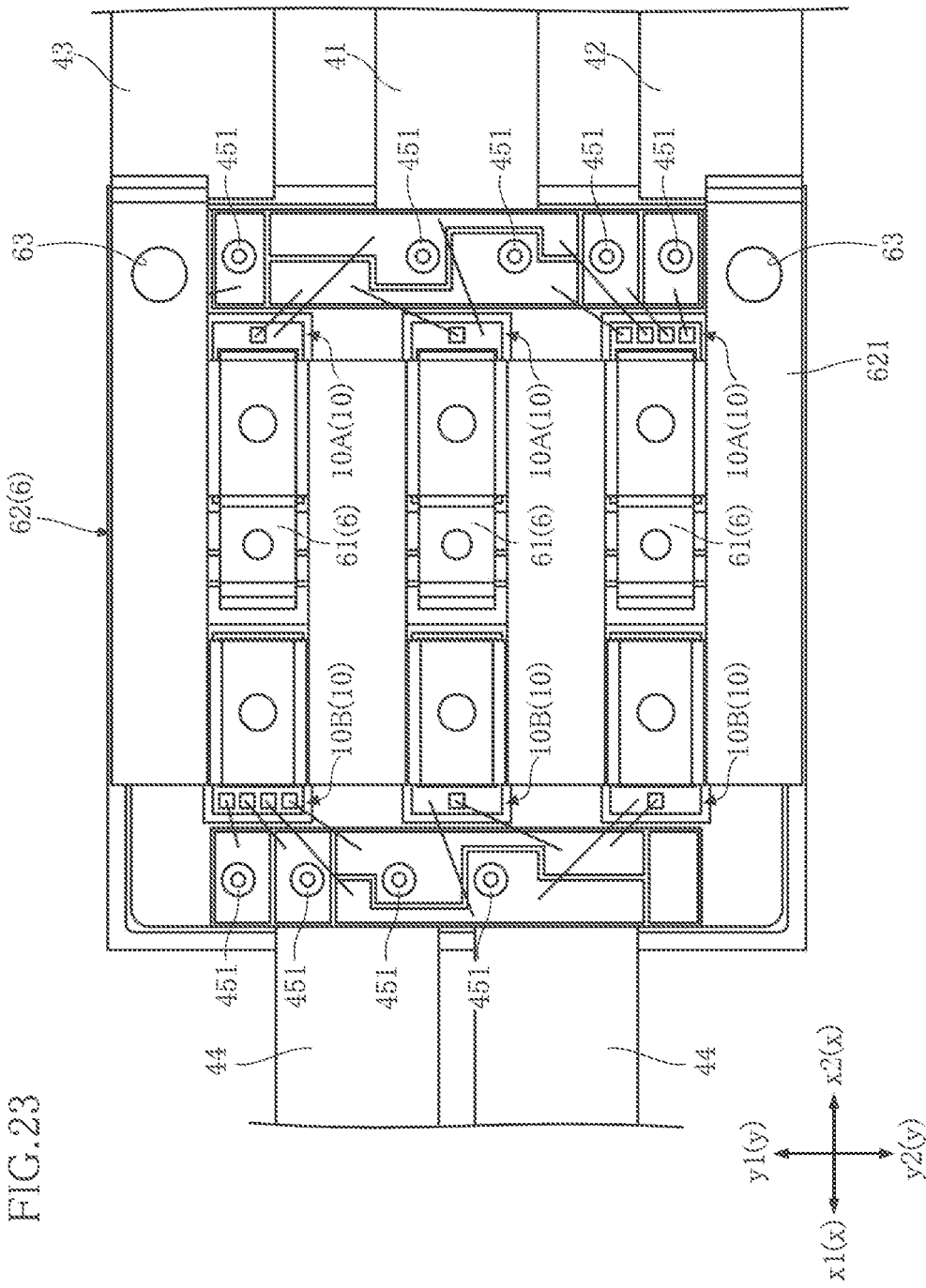
FIG. 23 is a plan view illustrating a step of the method for manufacturing the semiconductor module according to the first embodiment.
Figure 24:
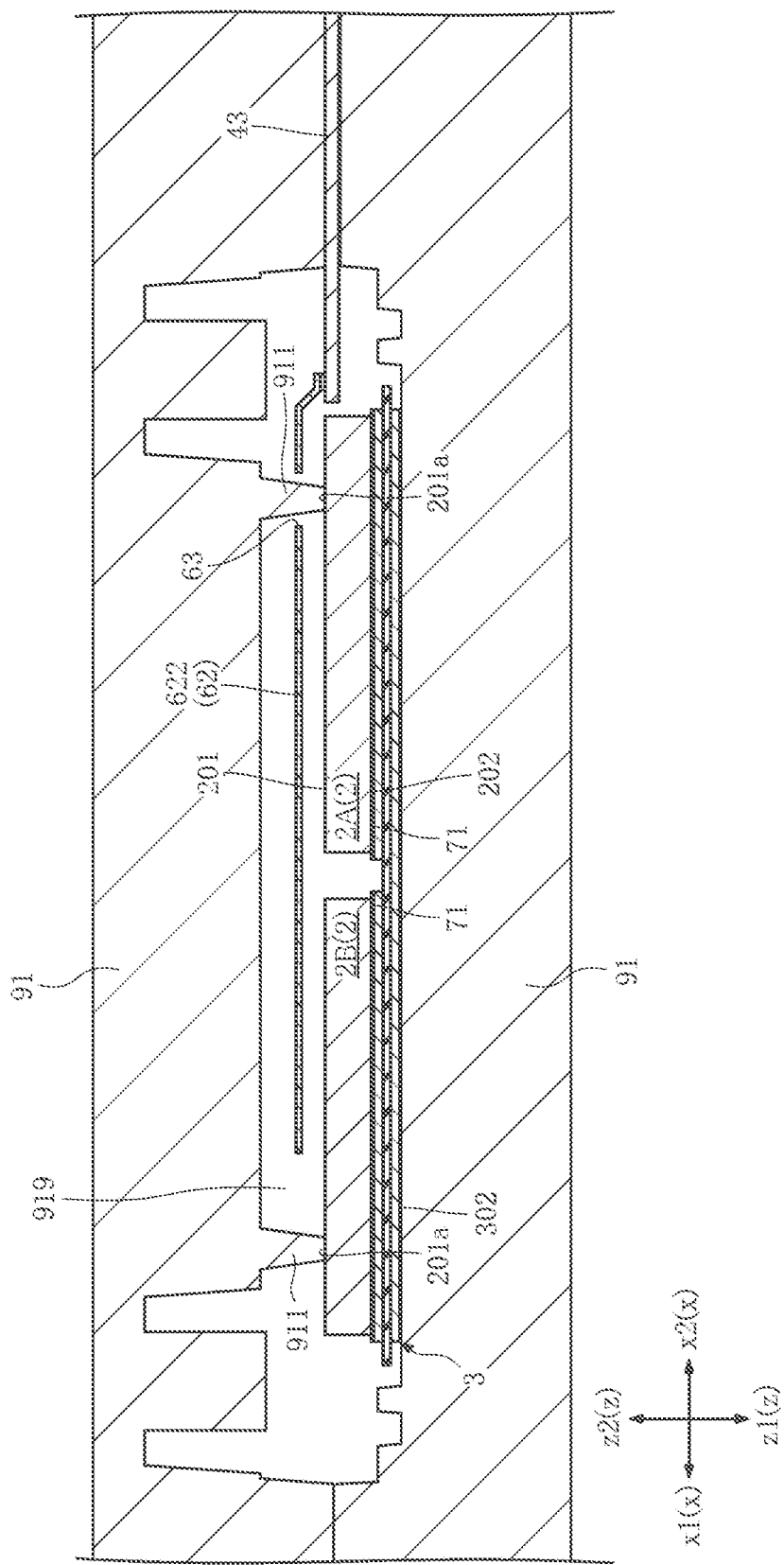
FIG. 24 is a cut end view illustrating a step of the manufacturing method according to the first embodiment, and corresponds to the cross-sectional view of FIG. 13.
Figure 25:
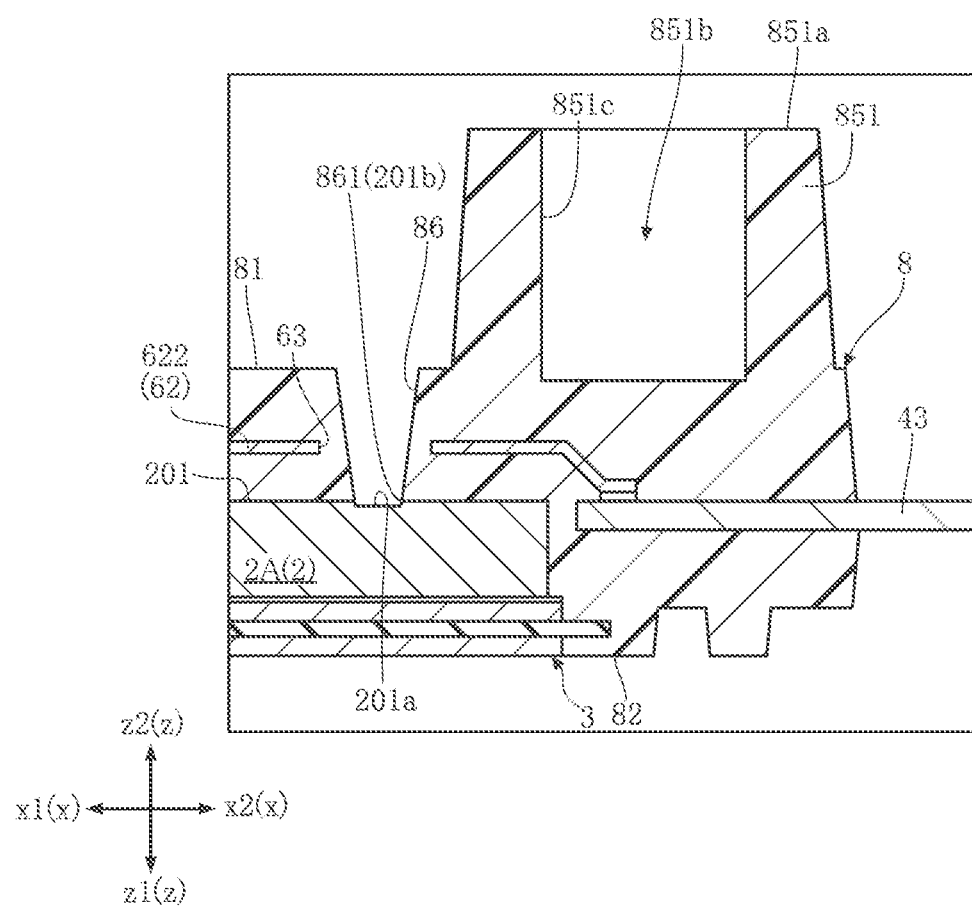
FIG. 25 is a partially enlarged cross-sectional view illustrating a step of the method for manufacturing the semiconductor module according to the first embodiment, and corresponds to an enlarged view of a part of the cross-section in FIG. 13.
Figure 26:
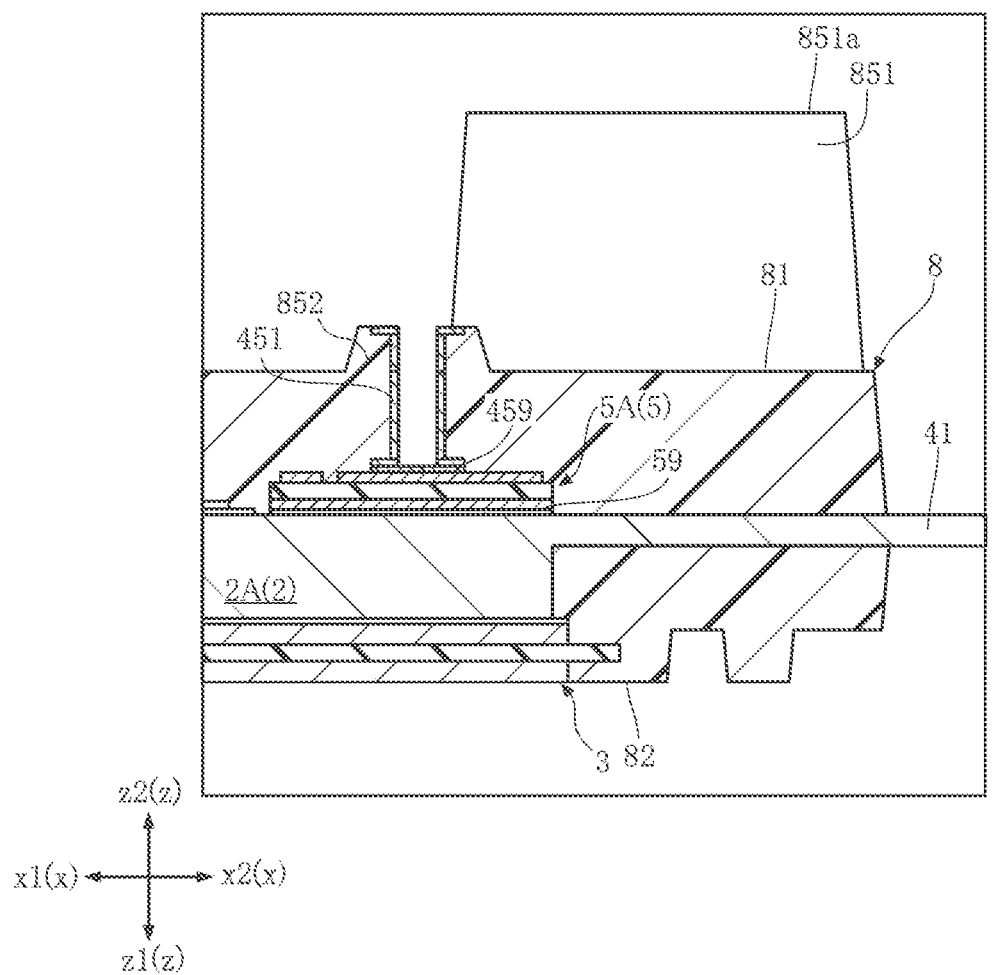
FIG. 26 is a partially enlarged cross-sectional view illustrating a step of the method for manufacturing the semiconductor module according to the first embodiment, and corresponds to an enlarged view of a part of the cross-section in FIG. 14.
Figure 27:
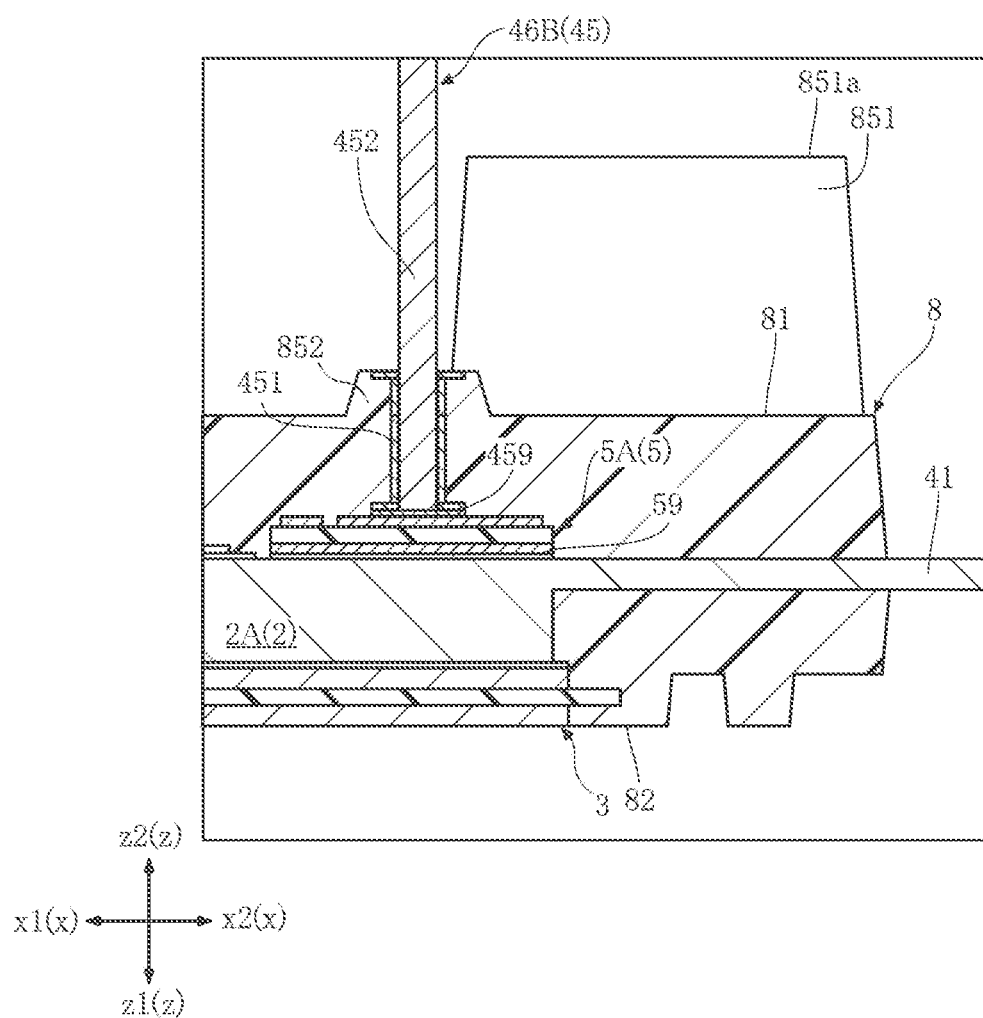
FIG. 27 is a partially enlarged cross-sectional view illustrating a step of the method for manufacturing the semiconductor module according to the first embodiment, and corresponds to an enlarged view of a part of the cross-section in FIG. 14.
Figure 28:
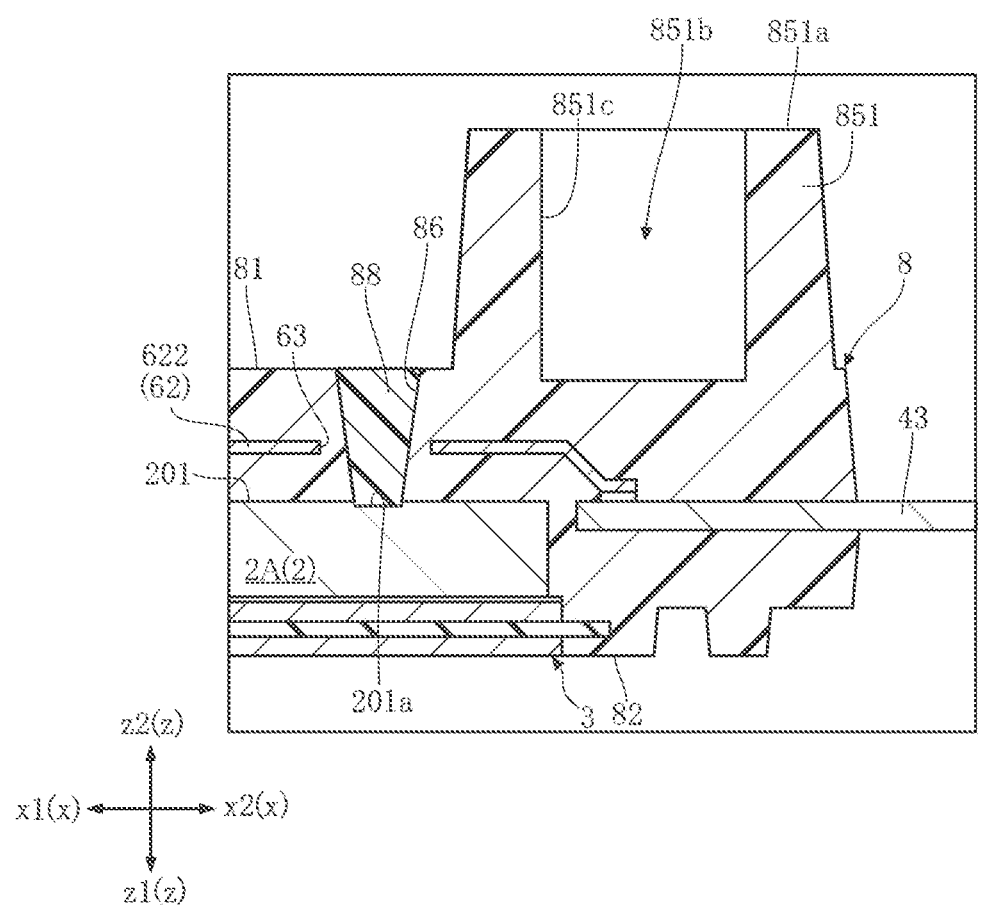
FIG. 28 is a partially enlarged cross-sectional view illustrating a step of the method for manufacturing the semiconductor module according to the first embodiment, and corresponds to an enlarged view of a part of the cross-section in FIG. 13.
Figure 29:
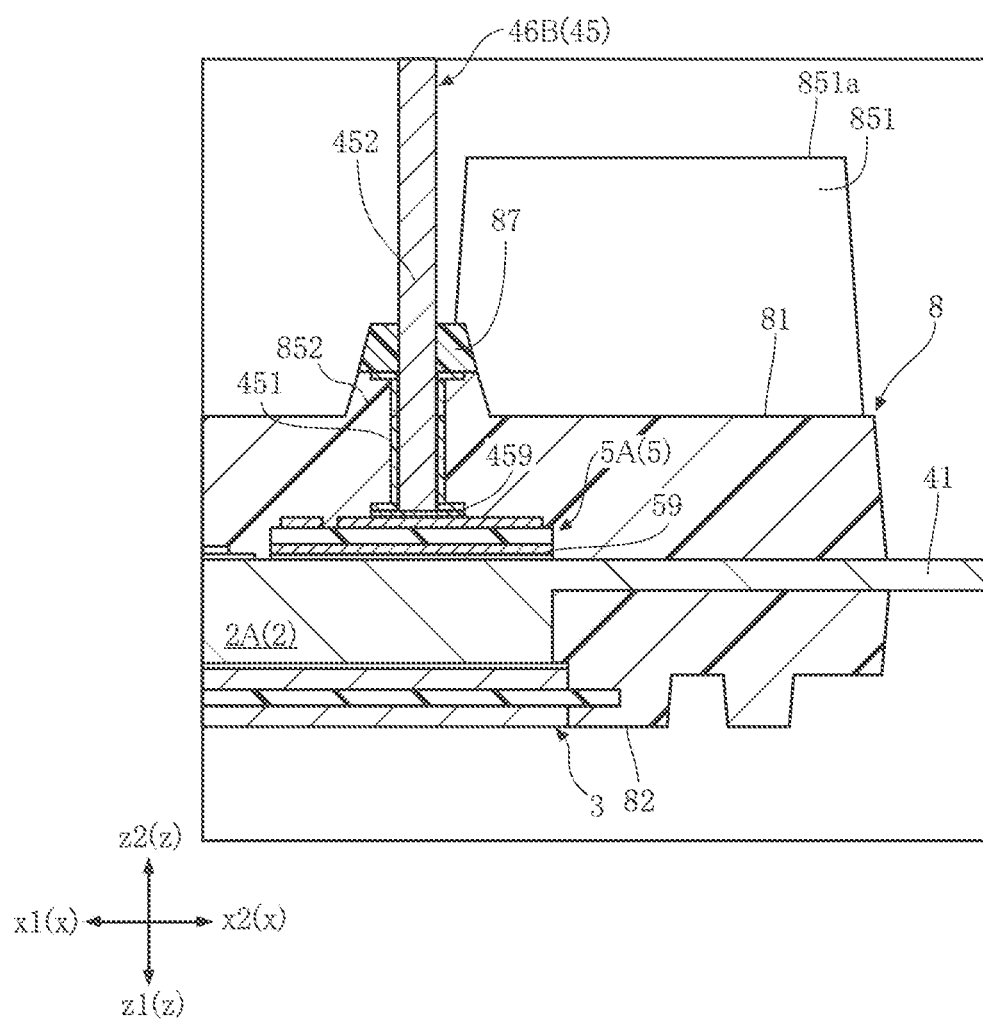
FIG. 29 is a partially enlarged cross-sectional view illustrating a step of the method for manufacturing the semiconductor module according to the first embodiment, and corresponds to an enlarged view of a part of the cross-section in FIG. 14.

The following describes a method for manufacturing the semiconductor module A1, with reference to FIGS. 21 to 29. FIG. 21 is a plan view illustrating a step of the method for manufacturing the semiconductor module A1. FIG. 22 is a schematic cross-sectional view illustrating a step of the method for manufacturing the semiconductor module A1. FIG. 23 is a plan view illustrating a step of the method for manufacturing the semiconductor module A1. FIG. 24 is a cut end view illustrating a step of the method for manufacturing the semiconductor module A1. FIG. 24 corresponds to the cross section shown in FIG. 13. Each of FIGS. 25 and 28 is a partially enlarged cross-sectional view illustrating a step of the method for manufacturing the semiconductor module A1, and corresponds to an enlarged view of a part of the cross-section in FIG. 13. Each of FIGS. 26, 27, and 29 is a partially enlarged cross-sectional view illustrating a step of the method for manufacturing the semiconductor module A1, and corresponds to an enlarged view of a part of the cross-section in FIG. 14.

First, a plurality of semiconductor elements 10, a conductive substrate 2, a supporting substrate 3, a plurality of input terminals 41 to 43, and a plurality of output terminals 44 are prepared. The configurations of the semiconductor elements 10, the conductive substrate 2, and the supporting substrate 3 are as described above. At the stage of preparing them, the semiconductor elements 10, the conductive substrate 2, and the supporting substrate 3 are separately prepared and not bonded to each other. As shown in FIG. 21, the conductive substrate 2, the input terminals 41 to 43, and the output terminals 44 are connected to each other, and may be made of the same lead frame. As shown in FIG. 21, no recessed portion 201*a* is formed in the obverse surface 201 of the conductive substrate 2.

Next, as shown in FIG. 22, the conductive substrate 2 is placed on the supporting substrate 3 via a first conductive bonding member 71, and the semiconductor elements 10 are placed on the conductive substrate 2 via a second conductive bonding member 72. Then, heat is applied while the lower surface of the supporting substrate 3 and the upper surfaces of the semiconductor elements 10 are held (see the thick arrows in FIG. 22). As a result, the semiconductor elements 10 and the conductive substrate 2 are bonded to each other by solid-phase diffusion, and the conductive substrate 2 and the supporting substrate 3 are bonded to each other by solid-phase diffusion. Specifically, the following elements are collectively bonded to each other by solid-phase diffusion: a first bonding layer 321 (supporting substrate 3) on a first metal layer 32 and a second layer 713 (first conductive bonding member 71); a first layer 712 (first conductive bonding member 71) and a reverse-surface bonding layer 23 (conductive substrate 2); a fourth layer 723 (second conductive bonding member 72) and an obverse-surface bonding layer 22 (conductive substrate 2); and a third layer 722 (second conductive bonding member 72) and reverse-surface electrodes 15 of the semiconductor elements 10. As for the conditions of the solid-phase diffusion, the heat temperature during bonding may be in the range of 200° C. to 350° C. inclusive, and the pressure applied (force for the holding) during the bonding may be in the range of 1 MPa to 100 MPa inclusive. The solid-phase diffusion bonding is assumed to be performed in the atmosphere, but it may be performed in vacuum instead. As a result, the conductive substrate 2 is bonded to the supporting substrate 3 via the first conductive bonding member 71, and the semiconductor elements 10 are bonded to the conductive substrate 2 via the second conductive bonding member 72. Note that the bonding between the conductive substrate 2 and the supporting substrate 3, and the bonding between the conductive substrate 2 and the semiconductor elements 10 may be performed separately rather than collectively. However, it is more preferable to perform the bonding collectively in order to improve manufacturing efficiency.

When the semiconductor elements 10 are placed on the conductive substrate 2 via the second conductive bonding member 72, individual second conductive bonding members 72 corresponding to the respective semiconductor elements 10 may be provided as shown in FIGS. 16 and 17. Alternatively, it is possible to provide a single second conductive bonding member 72 corresponding to the three semiconductor elements 10 shown in FIG. 16.

Next, as shown in FIG. 23, bonding of a control terminal support 5, bonding of a plurality of holders 451 of a plurality of control terminals 45, bonding of a plurality of wires 731 to 735, bonding of a plurality of first conducting members 61, and bonding of a second conducting member 62 are performed. The bonding of these elements may be performed in any suitable order.

Next, a sealing resin 8 is formed. The sealing resin 8 is formed by molding, for example. As shown in FIG. 24, a mold 91 for a molding process is provided with pressing pins 911 as pressing members. The tip ends of the pressing pins 911 are in contact with the obverse surface 201 of the conductive substrate 2. At this point, recessed portions 201a are formed in the obverse surface 201 by the pressing force of the pressing pins 911 to the obverse surface 201. The degree of recession (depth) of the recessed portions 201a changes depending on the strength of the pressing force or the like. The pressing pins 911 in contact with the obverse surface 201 of a first conductive portion 2A are inserted through openings 63 of the second conducting member 62. Then, a flowable resin material is injected into a cavity space 919 of the mold 91 via a resin flow channel and a resin inlet (both not shown) in sequence. The injected flowable resin material solidifies to form the sealing resin 8. The sealing resin 8 thus formed has first protrusions 851, second protrusions 852, and resin voids 86, which are all described above, as shown in FIGS. 25 and 26. As shown in FIG. 25, a resin void edge 861 of each of the resin voids 86, which is in contact with the obverse surface 201, and a recess edge 201b of each of the recessed portions 201a, which is in contact with the obverse surface 201, coincide with each other. As shown in FIG. 26, the upper surface of each of the holders 451 is exposed from a second protrusion 852 and flush with the upper surface of the second protrusion 852. As is evident from FIGS. 24 and 25, the resin voids 86 are formed by the pressing pins 911 as a result of the flowable resin material not being filled. Note that the pressing pins 911 may be movable pins. In this case, the pressing pins 911 are preferably provided in holes formed in the mold 91 and supported elastically. Each of the pressing members does not necessarily have a pin shape, and may have a block shape instead.

Next, the mold 91 is opened, and a molded body is taken out, where the molded body contains the lead frame including the conductive substrate 2, and the sealing resin 8. Then, the sealing resin 8 is separated from the resin that has solidified at the resin flow channel and the resin inlet. In this process, one or more resin separation marks are formed at either a first position or a second position on a resin side surface 831 of the sealing resin 8 in the x1 direction. Referring to FIG. 1, the first position may correspond to at least one of two positions each close to a respective end of the resin side surface 831 in the y direction, or at least one of the edges of the respective ends. In the case where the separation mark is formed at one of the edges of the respective ends, it may be formed at a surface formed along the edge (C chamfered portion in plan view). Such an inclined surface may be a part of the resin side surface 831 of the sealing resin 8 in the x1 direction. The second position is located between the two output terminals 44 at the resin side surface 831 shown in FIG. 1. The resin separation mark corresponds to the position of a resin inlet of the mold 91, and is formed by separating the sealing resin 8 from the resin that has solidified at the resin inlet. In order to prevent unevenness of the resin flow, it is preferable that the resin be injected from the central position of the mold in the y direction. In this case, a resin separation mark is formed between the two output terminals 44.

Next, as shown in FIG. 27, metal pins 452 of the control terminals 45 are pressed into the respective holders 451. Specifically, the metal pins 452, each of which has a cross-sectional dimension slightly larger than the inner diameter of a tubular portion (see FIG. 26) of each of the holders 451, are inserted with pressure. As a result, the holders 451 and the metal pins 452 are mechanically fixed and electrically connected to each other. The holders 451 and the metal pins 452 may be electrically connected with solder, for example. Then, resin members 87 and resin-filling portions 88 are formed as shown in FIGS. 28 and 29. The resin members 87 and the resin-filling portions 88 may be formed by potting.

Next, the lead frame is cut appropriately to separate the input terminals 41 to 43 and the output terminals 44. For each of the input terminals 41 to 43 and the output terminals 44 shown in FIG. 21, the area near the connecting portion (portion indicated by a dashed line in FIG. 21) between the terminal and the outer frame portion of the lead frame may be cut with a die or the like. At this point, the input terminals 41 to 43 are formed with tip surfaces 413, 423, and 433, respectively, that have input-side machining marks. Each of the output terminals 44 is formed with a tip surface 443 that has an output-side machining mark. When the lead frame has tie bars that connect, in the y direction, terminals which are adjacent in the y direction, the tie bars may be cut with a die or the like. In this case, for each of the terminals, machining marks are formed on two side surfaces that face in the y direction. The semiconductor module A1 shown in FIGS. 1 to 20 is manufactured through the steps described above.

The semiconductor module A1 is mounted on a circuit board for control, for example. The metal pins 452 are inserted into pin holes of the circuit board on which the semiconductor module A1 is mounted, and are connected to terminals near the pin holes. The input terminals 41, 42, and 43 have the input-side bonding surfaces 411, 421, and 431, respectively, that face in one sense (z2 direction) of the z direction. Each of the output terminals 44 has the output-side bonding surface 441 facing in one sense (z2 direction) of the z direction. The input-side bonding surfaces 411, 421, 431, and the output-side bonding surfaces 441 are connected with solder, for example, to the terminals of the circuit board on which the semiconductor module A1 is mounted.

The following describes the current path from the input terminal 41 to the output terminals 44 in the semiconductor module A1 in the present embodiment. The first main circuit current flows through a path that includes the input terminal 41, the first conductive portion 2A, the first semiconductor elements 10A, the first conducting members 61, the second conductive portion 2B, and the output terminals 44. The first main circuit current flows along the x direction between the second obverse-surface electrodes 12 of the first semiconductor elements 10A and the second conductive portion 2B via the first conducting members 61. In the second conductive portion 2B, the first main circuit current flows along the x direction and a direction slightly inclined from the x direction between the portions to which the first conducting members 61 are bonded and the output terminals 44.

The path of a current from the output terminals 44 to the input terminal 42 and the input terminal 43 is described below. The second main circuit current flows through a path that includes the output terminals 44, the second conductive portion 2B, the second semiconductor elements 10B, the second conducting member 62, the input terminal 42, and the input terminal 43. The second conducting member 62, forming the path of the second main circuit current, includes the third wiring portion 623 extending in the y direction and the first and second wiring portions 621, 622 joined to the respective ends of the third wiring portion 623 so as to extend in the x2 direction. Thus, the second main circuit current flows through the third wiring portion 623 as well as the first wiring portion 621 and the second wiring portion 622. Further, the path of the second main circuit current includes the two second band portions 626 disposed between the first wiring portion 621 and the second wiring portion 622 so as to extend in the x direction and also includes the first band portion 625 disposed between the first wiring portion 621 and the second wiring portion 622 so as to extend in the y direction. Thus, the second main circuit current flows through the first wiring portion 621 and the second wiring portion 622.

The second main circuit current flows between the input terminals 42, 43, and the second obverse-surface electrodes 12 of the second semiconductor elements 10B via a path including the first wiring portion 621, the second wiring portion 622, the third wiring portion 623, the two second band portions 626, and the first band portion 625 in the second conducting member 62. In the first wiring portion 621, the second wiring portion 622, and the two second band portions 626, the second main circuit current flows along the x direction. The direction in which the first main circuit current flows is opposite from the direction in which the second main circuit current flows.

The direction in which the first main circuit current flows in the first conducting members 61 is the x direction, and the direction in which the second main circuit current flows in the first wiring portion 621, the second wiring portion 622, and the two second band portions 626 in the second conducting member 62 is also the x direction.

The following describes the advantages of the semiconductor module A1.

The semiconductor module A1 includes the conductive substrate 2, the input terminals 41 to 43, the output terminals 44, and the conducting member 6. The conductive substrate 2 includes the first conductive portion 2A to which the first semiconductor elements 10A are bonded, and the second conductive portion 2B to which the second semiconductor elements 10B are bonded. The input terminal 41 is joined to the first conductive portion 2A, and is electrically connected to the first semiconductor elements 10A via the first conductive portion 2A. The input terminal 42 and the input terminal 43 are electrically connected to the second semiconductor elements 10B via the second conductive member 62 (conducting member 6). The output terminals 44 are joined to the second conductive portion 2B, and are electrically connected to the second semiconductor elements 10B via the second conductive portion 2B. The conducting member 6 includes the first conducting members 61 that electrically connect the first semiconductor elements 10A and the second conductive portion 2B, and the second conducting member 62 that electrically connects the second semiconductor elements 10B and the input terminals 42 and 43. The input terminals 41 to 43 are offset in the x2 direction relative to the conductive substrate 2, and the output terminals 44 are offset in the x1 direction relative to the conductive substrate 2. The two input terminals 42 and 43 are located opposite from each other with the input terminal 41 therebetween in the y direction. Suppose that a semiconductor module has a configuration different from the semiconductor module A1 in a manner such that no input terminal 43 is provided, and the input terminals 41 and 42 are arranged side by side in the y direction. In this case, variations may occur in the path of current flowing from the input terminal 41 to the output terminals 44 via the first semiconductor elements 10A, and in the path of current flowing from the output terminals 44 to the input terminal 42 via the second semiconductor elements 10B. In view of this, the semiconductor module A1 includes the two input terminals 42 and 43, and the two input terminals 42 and 43 flank the input terminal 41. This makes it possible to reduce variations in the path of a current flowing from the input terminal 41 to the output terminals 44 via the first semiconductor elements 10A, and to reduce variations in the path of a current flowing from the output terminals 44 to the input terminals 42 and 43 via the second semiconductor elements 10B. As a result, the parasitic inductance components of the semiconductor module A1 can be reduced. In other words, the semiconductor module A1 has a package configuration preferable for reducing parasitic inductance components.

In the semiconductor module A1, an upper arm current path and a lower arm current path overlap with each other in plan view. The upper arm current path is the path of a current flowing from the input terminal 41 to the output terminals 44 via the first conductive portion 2A, the first semiconductor elements 10A, the first conducting members 61, and the second conductive portion 2B. In the present embodiment, as seen from FIG. 5, the upper arm current path extends from the x2 direction side to the x1 direction side. The lower arm current path is the path of a current flowing from the output terminals 44 to the input terminal 42 via the second semiconductor elements 10B and the second conductive member 62. In the present embodiment, as seen from FIG. 5, the lower arm current path extends from the x1 direction side to the x2 direction side. With this configuration, the magnetic field generated by the current along the upper arm current path and the magnetic field generated by the current along the lower arm current path cancel each other out, thus enabling reduction of parasitic inductance components. In particular, the conducting member 6 (each of the first conducting members 61 and the second conducting member 62) in the semiconductor module A1 is made of a metal plate-like member, so that an area where the upper arm current path and the lower arm current path overlap with each other in plan view can be provided appropriately. In other words, the semiconductor module A1 has a package configuration preferable for reducing parasitic inductance components.

In the semiconductor module A1, the second conducting member 62 that forms the lower arm current path includes the first wiring portion 621, the second wiring portion 622, the third wiring portion 623, and the fourth wiring portion 624. The first wiring portion 621 and the second wiring portion 622 extend in the x direction, and are respectively connected to the input terminal 42 and the input terminal 43 that are arranged opposite from each other with the input terminal 41 therebetween in the y direction. The third wiring portion 623 is joined to the first wiring portion 621 and the second wiring portion 622, extends in the y direction, and is connected to the second semiconductor elements 10B. The fourth wiring portion 624 is joined to the first wiring portion 621 and the second wiring portion 622, and overlaps with the first semiconductor elements 10A in plan view. The second conductive member 62 including the first wiring portion 621, the second wiring portion 622, the third wiring portion 623, and the fourth wiring portion 624 is spaced apart from the obverse surface 201 (conductive substrate 2) in the z direction, and overlaps with a wide area of the obverse surface 201 in plan view. This configuration can appropriately reduce variations in the path of a current flowing from the output terminals 44 to the input terminals 42 and 43 via the second semiconductor elements 10B, and therefore is suitable in reducing parasitic inductance components.

The first semiconductor elements 10A and the second semiconductor elements 10B overlap with each other as viewed in the x direction. This configuration can suppress an increase in the dimension in the y direction of the conductive substrate 2 (first conductive portion 2A and the second conductive portion 2B) on which the first semiconductor elements 10A and the second semiconductor elements 10B are arranged, and can therefore reduce the size of the semiconductor module A1.

The fourth wiring portion 624 of the second conductive member 62 has the first band portion 625 and the second band portions 626. The first band portion 625 is joined to the first wiring portion 621 and the second wiring portion 622, extends in the y direction, and overlaps with the first semiconductor elements 10A in plan view. Each of the second band portions 626 is connected to the first band portion 625 and the third wiring portion 623, and has a band shape extending in the x direction in plan view. The second band portions 626 are spaced apart from each other in the y direction and arranged substantially in parallel to each other. In plan view, one end of each band portion 626 is connected to a part of the first band portion 625, which is located between two first semiconductor elements 10A adjacent in the y direction, and the other end of each band portion 626 is connected to a part of the third wiring portion 623, which is located between two second semiconductor elements 10B adjacent in the y direction. This configuration can increase the size of the fourth wiring portion 624 (second conductive member 62) in plan view. This is more preferable for reducing parasitic inductance components.

The first band portion 625 has the protruding areas 625*a* protruding in the z2 direction relative to the other areas. The protruding areas 625*a* overlap with the first semiconductor elements 10A in plan view. According to the configuration in which the first band portion 625 has the protruding areas 625*a*, the first band portion 625 is prevented from making improper contact with the first conducting members 61 bonded to the first semiconductor elements 10A.

The third wiring portion 623 has the recessed areas 623*a* recessed in the z1 direction relative to the other areas. The recessed areas 623*a* are bonded to the respective second semiconductor elements 10B. This configuration can increase the size of the third wiring portion 623 (second conductive member 62) in plan view while electrically connecting the third wiring portion 623 (second conductive member 62) and the second semiconductor elements 10B in a suitable manner.

The semiconductor module A1 includes the conducting member 6 (first conducting members 61 and the second conducting member 62) having the configuration described above, and further includes the first control terminals 46A to 46E and the second control terminals 47A to 47D for controlling the first semiconductor elements 10A and the second semiconductor elements 10B. The first control terminals 46A to 46E and the second control terminals 47A to 47D are provided on the obverse surface 201 of the conductive substrate 2 and extend along the z direction. The semiconductor module A1 having this configuration can have a smaller size in plan view, and therefore is suitable for reducing the size in plan view while reducing parasitic inductance components.

The first control terminals 46A to 46E are supported by the first conductive portion 2A and offset in the x2 direction relative to the first semiconductor elements 10A. The second control terminals 47A to 47D are supported by the second conductive portion 2B and offset in the x1 direction relative to the second semiconductor elements 10B. The first control terminals 46A to 46E are arranged at intervals in the y direction, and the second control terminals 47A to 47D are also arranged at intervals in the y direction. As such, the first control terminals 46A to 46E and the second control terminals 47A to 47D are appropriately arranged in an area corresponding to the first semiconductor elements 10A that constitute the upper arm circuit, and in an area corresponding to the second semiconductor elements 10B that constitute the lower arm circuit, respectively. The semiconductor module A1 having this configuration is more preferable for downsizing while reducing parasitic inductance components.

Each of the first semiconductor elements 10A and the second semiconductor elements 10B has a first obverse-surface electrode 11 (gate electrode) facing in the z2 direction. The first control terminal 46A is connected to the first obverse-surface electrodes 11 (gate electrodes) of the first semiconductor elements 10A via the first wires 731*a*. The second control terminal 47A is connected to the first obverse-surface electrodes 11 (gate electrodes) of the second semiconductor elements 10B via the second wires 731*b*. This makes it possible to appropriately input, to the first obverse-surface electrodes 11, a drive signal for driving the first semiconductor elements 10A (second semiconductor elements 10B) that have a switching function, via the first control terminal 46A (second control terminal 47A) and the first wires 731*a* (second wires 731*b*).

When the semiconductor module A1 is mounted on a circuit board, the metal pins 452 are inserted into the pin holes of the circuit board on which the semiconductor module A1 is mounted, and are connected to terminals near the pin holes. The input terminals 41, 42, and 43 have the input-side bonding surfaces 411, 421, and 431, respectively, that face in one sense (z2 direction) of the z direction. The output terminals 44 have the output-side bonding surfaces 441 facing in one sense (z2 direction) of the z direction. The input-side bonding surfaces 411, 421, 431, and the output-side bonding surfaces 441 are connected with solder, for example, to the terminals of the circuit board on which the semiconductor module A1 is mounted. With this configuration, the power system circuit board to which the input terminals 41 to 43 and the output terminals 44 are connected and the control system circuit board to which the metal pins 452 are connected can be arranged in separation in the z direction. This achieves the following improvements. Firstly, an improvement is made in the degree of freedom regarding the arrangement of a signal terminal in the semiconductor module A1. Secondly, an improvement is made in the degree of freedom regarding the routing and length of a signal wire in the semiconductor module A1. Thirdly, an improvement is made in the degree of freedom regarding the arrangement of a circuit board by a user when the semiconductor module A1 is used.

In the semiconductor module A1, the control terminals 45 protrude from the resin obverse surface 81 and extend along the z direction. In a configuration different from that of the semiconductor module A1, the control terminals 45 may be arranged to extend along a plane (x-y plane) perpendicular to the z direction. This configuration has a limit to the size reduction in plan view. Accordingly, as in the semiconductor module A1, the control terminals 45 can be arranged to extend along the z direction, so that the size of the semiconductor module A1 can be reduced in plan view. In other words, the semiconductor module A1 has a package configuration preferable for the size reduction in plan view.

In the semiconductor module A1 of the present embodiment, the control terminal support 5 is provided between the control terminals 45 and the obverse surface 201 (conductive substrate 2). The control terminal support 5 has the insulating layer 51, and the control terminals 45 are supported by the conductive substrate 2 via the control terminal support 5. The configuration with the control terminal support 5 can support the control terminals 45 on the conductive substrate 2 appropriately while maintaining insulation from the conductive substrate 2.

The control terminal support 5 has a layup structure in which the insulating layer 51, the first metal layer 52, and the second metal layer 53 are stacked on each other. The control terminals 45 are bonded to the first metal layer 52, which is formed as the upper surface of the control terminal support 5, via the conductive bonding member 459. According to the configuration, the control terminals 45 can be electrically bonded to the control terminal support 5 (first metal layer 52) while utilizing an existing layup structure (e.g., DBC substrate) as the control terminal support 5.

Each of the semiconductor elements 10 has an element obverse surface 101 facing in the z2 direction, and an element reverse surface 102 facing in the z1 direction. A first obverse-surface electrode 11 (gate electrode) is provided on the element obverse surface 101. The first obverse-surface electrode 11 of each of the semiconductor elements 10 and the first metal layer 52 (first portion 521) are connected by a wire 731 that is electrically conductive. This makes it possible to input a drive signal for driving the semiconductor elements 10 having a switching function to the first obverse-surface electrodes 11 appropriately, via the control terminals 45, the first metal layer 52, and the wires 731.

Each of the control terminals 45 includes a holder 451 and a metal pin 452. The holder 451 is made of a conductive material, and includes a tubular portion. The metal pin 452 is a rod-like member extending in the z direction, and is pressed into the holder 451. A part (the upper surface of the upper-end flange portion) of the holder 451 is exposed from the sealing resin 8. According to this configuration, the sealing resin 8 is formed (by molding) such that the holder 451 is covered with the sealing resin 8 except a part (upper end surface) of the holder 451, and the upper end surface of the holder 451 is exposed from the sealing resin 8. This makes it possible to insert the metal pin 452 into the holder 451 after the sealing resin 8 is formed. Accordingly, with the configuration in which the control terminals 45 include the holders 451 and the metal pins 452, it is possible to avoid complexity of the mold 91 for a molding process. For this reason, this configuration is suitable for efficiently manufacturing the semiconductor module A1.

The semiconductor module A1 of the present embodiment includes the resin members 87 bonded to the sealing resin 8. The resin members 87 cover parts (upper surfaces of the upper-end flange portions) of the holders 451 that are exposed from the sealing resin 8, and parts of the metal pins 452. This configuration prevents foreign matter from entering the connecting portions between the holders 451 and the metal pins 452. The semiconductor module A1 having the above configuration is preferable for improving durability and reliability.

The sealing resin 8 has the second protrusions 852 protruding from the resin obverse surface 81. The second protrusions 852 surround the respective control terminals 45 in plan view. The metal pins 452 of the control terminals 45 protrude from the second protrusions 852. The resin members 87 are provided on the second protrusions 852. According to this configuration, the creepage distance between adjacent control terminals 45 along the resin obverse surface 81 can be increased. This is preferable for increasing the withstand voltage of the adjacent control terminals 45.

The conductive substrate 2 includes the first conductive portion 2A and the second conductive portion 2B that are spaced apart from each other in the x direction. The first conductive portion 2A is offset in the x2 direction relative to the second conductive portion 2B. The semiconductor elements 10 include the first semiconductor elements 10A bonded to the first conductive portion 2A, and the second semiconductor elements 10B bonded to the second conductive portion 2B. The control terminals 45 include the first control terminals 46A to 46E, and the second control terminals 47A to 47D. The first control terminals 46A to 46E are supported by the first conductive portion 2A, and arranged between the first semiconductor elements 10A and the input terminals 41, 42, etc., in the x direction. The second control terminals 47A to 47D are provided between the second semiconductor elements 10B and the output terminals 44 in the x direction. With this configuration, the control terminals 45 (the first control terminals 46A to 46E, and the second control terminals 47A to 47D) are appropriately arranged in an area corresponding to the first semiconductor elements 10A that constitute the upper arm circuit, and in an area corresponding to the second semiconductor elements 10B that constitute the lower arm circuit. The configuration is preferable for downsizing the semiconductor module A1.

The sealing resin 8 has the first protrusions 851 protruding from the resin obverse surface 81. The tip end of each of the first protrusions 851 is formed with a first protruding end surface 851a. The first protruding end surfaces 851a of the first protrusions 851 are substantially parallel to the resin obverse surface 81 and positioned on the same plane (x-y plane) as the resin obverse surface 81. With this configuration, it is possible, in an apparatus that uses a power supply generated by the semiconductor module A1, to provide a predetermined gap between the surface of a control circuit board on which the semiconductor module A1 is mounted and the resin obverse surface 81. In this way, even when various functional components are mounted on a surface of the control circuit board that faces the semiconductor module A1, the functional components do not make improper contact with the sealing resin 8.

The semiconductor module A1 includes the conductive substrate 2 to which the semiconductor elements 10 are bonded. With this configuration, the heat generated by energization of the semiconductor elements 10 is transferred from the semiconductor elements 10 to the conductive substrate 2 and diffused at the conductive substrate 2. As such, the semiconductor module A1 has a package configuration preferable for improving the heat dissipation property of the semiconductor elements 10.

In the semiconductor module A1, the conductive substrate 2 and the supporting substrate 3 are bonded to each other via the first conductive bonding member 71. The first conductive bonding member 71 includes the first layer 712 and the second layer 713. The first layer 712 is bonded to the conductive substrate 2 by the solid-phase diffusion of metal, and is in direct contact with the conductive substrate 2 at the bonding interface. The second layer 713 is bonded to the supporting substrate 3 by the solid-phase diffusion of metal, and is in direct contact with the supporting substrate 3 at the bonding interface. This configuration can increase the bonding strength between the conductive substrate 2 and the supporting substrate 3 as compared to the case where the conductive substrate 2 and the supporting substrate 3 are bonded by a bonding material such as solder. Accordingly, the semiconductor module A1 has a package configuration preferable for suppressing the peeling between the conductive substrate 2 and the support substrate 3.

In the semiconductor module A1, the semiconductor elements 10 and the conductive substrate 2 are bonded to each other via the second conductive bonding member 72. The second conductive bonding member 72 includes the third layer 722 and the fourth layer 723. The third layer 722 is bonded to the semiconductor elements 10 (reverse surface electrodes 15) by the solid-phase diffusion of metal, and is in direct contact with the semiconductor elements 10 at the bonding interface. The fourth layer 723 is bonded to the conductive substrate 2 by the solid-phase diffusion of metal, and is in direct contact with the conductive substrate 2 at the bonding interface. This configuration can increase the bonding strength between the semiconductor elements 10 and the conductive substrate 2 as compared to the case where the semiconductor elements 10 and the conductive substrate 2 are bonded by a bonding material such as solder. Accordingly, the semiconductor module A1 has a package configuration preferable for suppressing the peeling between the semiconductor elements 10 and the conductive substrate 2.

In the semiconductor module A1 of the present embodiment, the Young's modulus of the first base layer 711 in the first conductive bonding member 71 is smaller than the Young's modulus of the material of each of the first layer 712 and the second layer 713. According to the configuration, when the first conductive bonding member 71 is bonded to the conductive substrate 2 and the supporting substrate 3 by solid-phase diffusion, the stress is alleviated by the relatively soft first base layer 711, and the bonding boundary portion is thereby smoothed. As a result, the first layer 712 and the conductive substrate 2, as well as the second layer 713 and the supporting substrate 3, are more firmly bonded by solid-phase diffusion.

In the present embodiment, the first base layer 711 is thicker than each of the first layer 712 and the second layer 713. Accordingly, when bonding by solid-phase diffusion is performed, the pressing force acting on the boundary portion between the first layer 712 and the conductive substrate 2 (reverse-surface bonding layer 23) and on the boundary portion between the second layer 713 and the supporting substrate 3 (first bonding layer 321) is made more uniform. As a result, the first layer 712 and the conductive substrate 2, as well as the second layer 713 and the supporting substrate 3, can be in a stronger conductive bonding state.

The material of each of the first layer 712 and the second layer 713 contains silver. With this composition, when bonding by solid-phase diffusion is performed with the first conductive bonding member 71, oxidation of the first layer 712 and the second layer 713 is suppressed, thus enabling excellent solid-phase diffusion bonding. The reverse-surface bonding layer 23 and the first bonding layer 321, which are bonded to the first layer 712 and the second layer 713 respectively, also contain silver, thus enabling better solid-phase diffusion bonding.

In the present embodiment, the Young's modulus of the second base layer 721 in the second conductive bonding member 72 is smaller than the Young's modulus of the material of each of the third layer 722 and the fourth layer 723. According to the configuration, when the second conductive bonding member 72 is bonded to the semiconductor elements 10 (reverse-surface electrodes 15) and the conductive substrate 2 by solid-phase diffusion, the stress is alleviated by the relatively soft second base layer 721, and the bonding boundary portion is thereby smoothed. As a result, the third layer 722 and the semiconductor elements 10 (reverse-surface electrodes 15), as well as the fourth layer 723 and the conductive substrate 2, are more firmly bonded by solid-phase diffusion.

In the present embodiment, the second base layer 721 is thicker than each of the third layer 722 and the fourth layer 723. Accordingly, when bonding by solid-phase diffusion is performed, the pressing force acting on the boundary portion between the third layer 722 and the semiconductor elements 10 (reverse-surface electrodes 15) and on the boundary portion between the fourth layer 723 and the conductive substrate 2 (obverse-surface bonding layers 22) is made more uniform. As a result, the third layer 722 and the semiconductor elements 10 (reverse-surface electrodes 15), as well as the fourth layer 723 and the conductive substrate 2, can be in a stronger conductive bonding state.

The material of each of the third layer 722 and the fourth layer 723 contains silver. With this material composition, when bonding by solid-phase diffusion is performed with the second conductive bonding member 72, oxidation of the third layer 722 and the fourth layer 723 is suppressed, thus enabling excellent solid-phase diffusion bonding. The reverse-surface electrodes 15 and the obverse-surface bonding layers 22, which are bonded to the third layer 722 and the fourth layer 723 respectively, contain silver, thus enabling better solid-phase diffusion bonding.

The first conductive bonding member 71 has a configuration where the first layer 712 and the second layer 713, which are Ag plating layers, are formed on the surfaces (both surfaces) of the first base layer 711, which is made of a sheet material containing Al. Similarly, the second conductive bonding member 72 has a configuration where the third layer 722 and the fourth layer 723, which are Ag plating layers, are formed on the surfaces (both surfaces) of the second base layer 721, which is made of a sheet material containing Al. With this configuration, the first conductive bonding member 71 and the second conductive bonding member 72 can be easily prepared.

In the semiconductor module A1, the second conducting member 62 is formed with the openings 63. The openings 63 overlap with the obverse surface 201 (conductive substrate 2) in plan view, and do not overlap with the semiconductor elements 10 in plan view. With this configuration, during a molding step (step for forming the sealing resin 8) in the process for manufacturing the semiconductor module A1, the pressing pins 911 of the mold 91 can be inserted into the openings 63. This allows the pressing pins 911 to press the conductive substrate 2 without interfering with the second conducting member 62, thus suppressing the warpage of the supporting substrate 3 to which the conductive substrate 2 is bonded. The warpage occurs, for example, such that the outer sides of the supporting substrate 3 in the y direction are positioned more upward than the center thereof in the y direction. If warpage occurs on the supporting substrate 3, the bonding strength between the conductive substrate 2 and the supporting substrate 3 may be lowered. Furthermore, during a molding process, a part of the sealing resin 8 may be formed on the bottom surface 302 due to resin leakage, causing a bonding failure of a heat dissipating member (e.g., heat sink) that can be bonded to the bottom surface 302. Accordingly, the semiconductor module A1 has a package configuration that is preferable for improving the bonding strength between the conductive substrate 2 and the supporting substrate 3 by suppressing the warpage of the supporting substrate 3, and that is also preferable for suppressing the leakage of the sealing resin 8 to an unintended location.

The conductive substrate 2 includes the first conductive portion 2A to which the first semiconductor elements 10A are bonded, and the second conductive portion 2B to which the second semiconductor elements 10B are bonded. The first conductive portion 2A and the second conductive portion 2B are spaced apart from each other in the x direction, and the first conductive portion 2A is offset in the x2 direction relative to the second conductive portion 2B. The second conducting member 62 is connected to the second semiconductor elements 10B and the input terminals 42 and 43, and the openings 63 in the second conducting member 62 overlap with the obverse surface 201 of the first conductive portion 2A in plan view. With this configuration, even when the second conducting member 62 is designed to have a large size in plan view, the pressing pins 911 of the mold 91 can press the conductive substrate 2 without interfering with the second conducting member 62 during the formation (during the molding process) of the sealing resin 8. Note that the parasitic resistance components of the second conducting member 62 (conductive member 6) that forms the path of the main circuit current can be suppressed by increasing the size of the second conducting member 62 in plan view.

The second conducting member 62 includes the first wiring portion 621, the second wiring portion 622, the third wiring portion 623, and the fourth wiring portion 624. The first wiring portion 621 and the second wiring portion 622 extend in the x direction, and are respectively connected to the input terminal 42 and the input terminal 43 that are arranged opposite from each other with the input terminal 41 therebetween in the y direction. The third wiring portion 623 is joined to the first wiring portion 621 and the second wiring portion 622, extends in the y direction, and is connected to the second semiconductor elements 10B. The openings 63 are formed in the areas of the first wiring portion 621 and the second wiring portion 622 that are offset in the x2 direction. As such, the openings 63 are provided near two corners of the conductive substrate 2 (first conductive portion 2A) at respective outer sides of the conductive substrate 2 in the y direction. Accordingly, the openings 63 are provided near two corners of the supporting substrate 3 supporting the conductive substrate 2 (first conductive portion 2A) at the respective outer sides of the supporting substrate 3 in the y direction. The configuration as described above allows the size of the second conducting member 62 to be relatively large in plan view and, during the formation of the sealing resin 8 (molding process), areas near the two corners of the conductive substrate 2 (first conductive portion 2A) at the respective outer sides of the conductive substrate 2 in the y direction can be pressed with the pressing pins 911 of the mold 91 which are inserted into the openings 63. As described above, the warpage of the supporting substrate 3 to which the conductive substrate 2 is bonded occurs such that the outer sides of the supporting substrate 3 in the y direction are positioned more upward than the center thereof in the y direction. However, the configuration described above can effectively suppress the warpage of the supporting substrate 3 during the molding process.

In the present embodiment, the conducting member 6 (the first conducting members 61 and the second conducting member 62) is made of a metal plate-like member. This facilitates formation of the openings 63 in the second conducting member 62. Furthermore, the conducting member 6 (the first conducting members 61 and the second conducting member 62) made of a metal plate-like member can easily adapt to various shapes and sizes, and can increase the reliability of a bonding portion with another component by securing a sufficient bonding area with the other component.

Parts of the obverse surface 201 of the conductive substrate 2 (first conductive portion 2A) overlap with the openings 63 in plan view and are formed with the recessed portions 201a. The recessed portions 201a are marks left by the pressing pins 911 applying a pressing force to the obverse surface 201 during the molding process. In the present embodiment, it is possible to devise an arrangement of the second conducting member 62 and the openings 63 formed therein, so that during the molding process, appropriate parts of the conductive substrate 2 (first conductive portion 2A) can be pressed with the pressing pins 911 while avoiding interference with functional elements such as the semiconductor elements 10.

The sealing resin 8 is formed with the resin voids 86 passing from the resin obverse surface 81 to the recessed portions 201a. Each of the resin voids 86 is tapered such that the cross-sectional area thereof decreases from the resin obverse surface 81 to the recessed portion 201a. The resin voids 86 are formed during a molding process (when the sealing resin 8 is formed). After the molding, the surfaces of the recessed portions 201a in the obverse surface 201 of the conductive substrate 2 are exposed from the sealing resin 8. In the present embodiment, the resin-filling portions 88 are provided for the resin voids 86 to fill the resin voids 86. This configuration can prevent foreign matter (such as moisture) from entering the recessed portions 201a exposed from the sealing resin 8. The semiconductor module A1 having the above configuration is preferable for improving durability and reliability.

In the present embodiment, the openings 63 in the second conducting member 62 (conducting member 6) are through-holes that penetrate through in the z direction. This configuration can prevent a deviation of the current path caused by forming the openings 63 in the second conducting member 62 (conducting member 6) that forms the path of a main circuit current.

The semiconductor module A1 includes the conducting member 6. The conducting member 6 forms the path of a main circuit current switched by the semiconductor elements 10. The conducting member 6 includes the first conducting members 61 connected to the first semiconductor elements 10A, and the second conducting member 62 connected to the second semiconductor elements 10B. The conducting member 6 (each of the first conducting members 61 and the second conducting member 62) is made of a metal plate-like member. The main circuit current described above may have a relatively large value. In this case, it is preferable to suppress the parasitic resistance components in the conducting member 6 that forms the path of the main circuit current in order to reduce the power consumption of the semiconductor module A1. Accordingly, in the semiconductor module A1, the conducting member 6 is made of a metal plate-like member instead of a bonding wire as described above to suppress the parasitic resistance components of the conducting member 6. In other words, the semiconductor module A1 has a package configuration preferable for suppressing the parasitic resistance components.

In the semiconductor module A1, each of the first semiconductor elements 10A has a rectangular shape in plan view, and the four corners of each of the first semiconductor elements 10A in plan view do not overlap with the second conducting member 62. According to this configuration, during the manufacturing process of the semiconductor module A1, it is possible to conduct visual inspection before forming the sealing resin 8 so as to check whether the first semiconductor elements 10A are properly bonded. In other words, the semiconductor module A1 allows for visual inspection regarding the bonding state of the first semiconductor elements 10A during the manufacturing process (e.g., the stage shown in FIG. 23). This makes it possible to determine whether the first semiconductor elements 10A are properly bonded. For example, it is possible to measure respective distances to the four corners of each first semiconductor element 10A by a laser ranging method, and determine that the first semiconductor element 10A is properly bonded if the difference between the distances to the four corners is small. As described above, the semiconductor module A1 can conduct visual inspection during the manufacturing process, and therefore has package configuration preferable for improving reliability. During the visual inspection, it is sufficient if at least three of the four corners of each of the first semiconductor elements 10A are visible in plan view. For this reason, it is sufficient if three corners of each of the first semiconductor elements 10A do not overlap with the second conducting member 62. Similarly, as shown in FIG. 5, four corners of each of the second semiconductor elements 10B do not overlap with the second conducting member 62. Accordingly, during the manufacturing process of the semiconductor module A1, it is possible to conduct visual inspection before forming the sealing resin 8 so as to check whether the second semiconductor elements 10B are properly bonded. The visual inspection may be automatic visual inspection that uses image-capturing and image processing.

The second conducting member 62 includes the first wiring portion 621, the second wiring portion 622, the third wiring portion 623, and the fourth wiring portion 624. The first wiring portion 621 and the second wiring portion 622 extend in the x direction, and are respectively connected to the input terminal 42 and the input terminal 43 that are arranged opposite from each other with the input terminal 41 therebetween in the y direction. The third wiring portion 623 is joined to the first wiring portion 621 and the second wiring portion 622, extends in the y direction, and is connected to the second semiconductor elements 10B. The fourth wiring portion 624 is joined to the first wiring portion 621 and the second wiring portion 622. The fourth wiring portion 624 is offset in the x2 direction relative to the third wiring portion 623, and overlaps with the first semiconductor elements 10A in plan view. The second conductive member 62 including the first wiring portion 621, the second wiring portion 622, the third wiring portion 623, and the fourth wiring portion 624 overlaps with a wide area of the obverse surface 201 in plan view, and has a relatively large size in plan view. Increasing the size of the second conducting member 62 in plan view is preferable in terms of suppressing the parasitic resistance components of the second conducting member 62 (conductive member 6) that forms the path of the main circuit current.

Each of the first semiconductor elements 10A has a first side 191, a second side 192, a third side 193, and a fourth side 194 in plan view. The first side 191 and the second side 192 extend in the y direction. The first side 191 is an edge located in the x2 direction in plan view, and the second side 192 is an edge located in the x1 direction in plan view. The third side 193 and the fourth side 194 extend in the x direction. The third side 193 is an edge located in the y2 direction in plan view, and the fourth side 194 is an edge located in the y1 direction in plan view. Since each of the first semiconductor elements 10A has a rectangular shape in plan view, the four corners formed by the first side 191, the second side 192, the third side 193, and the fourth side 194 are generally right-angled in plan view. The fourth wiring portion 624 (the first band portion 625) of the second conducting member 62 has a first edge 627 and a second edge 628. The first edge 627 is an edge of the fourth wiring portion 624 located in the x2 direction, and is offset in the x1 direction relative to the first side 191 in plan view. The first edge 627 extends at least from the third side 193 to the fourth side 194 in the y direction. As such, two corners 171 and 172 of each first semiconductor element 10A in the x2 direction do not overlap with the second conducting member 62 in plan view. The second edge 628 is an edge of the fourth wiring portion 624 (first band portion 625) located in the x1 direction, and is offset in the x2 direction relative to the second side 192 in plan view. The second edge 628 extends at least from the third side 193 to the fourth side 194 in the y direction. As such, two corners 173 and 174 of each first semiconductor element 10A in the x1 direction do not overlap with the second conducting member 62 in plan view. With this configuration, the four corners of each of the first semiconductor elements 10A in plan view do not overlap with the second conducting member 62 while the size of the second conducting member 62 in plan view is increased by providing the fourth wiring portion 624 with areas that overlap with the first semiconductor elements 10A in plan view. This makes it possible to effectively suppress the parasitic resistance components of the second conducting member 62 (conducting member 6), and to conduct visual inspection to check the bonding state of the first semiconductor elements 10A during the manufacturing process of the semiconductor module A1.

The fourth wiring portion 624 (first band portion 625) has the protruding areas 625a protruding in the z2 direction relative to the other areas. The protruding areas 625a overlap with the first semiconductor elements 10A in plan view. According to the configuration in which the fourth wiring portion 624 has the protruding areas 625a, the fourth wiring portion 624 is prevented from making improper contact with the first conducting members 61 bonded to the first semiconductor elements 10A.

The third wiring portion 623 has the recessed areas 623a recessed in the z1 direction relative to the other areas. The recessed areas 623a are bonded to the respective second semiconductor elements 10B. This configuration can increase the size of the third wiring portion 623 (second conductive member 62) in plan view while electrically connecting the third wiring portion 623 (second conductive member 62) and the second semiconductor elements 10B in a suitable manner.

The first semiconductor elements 10A and the second semiconductor elements 10B overlap with each other as viewed in the x direction. This configuration can suppress an increase in the dimension in the y direction of the conductive substrate 2 (first conductive portion 2A and the second conductive portion 2B) on which the first semiconductor elements 10A and the second semiconductor elements 10B are arranged, and can therefore reduce the size of the semiconductor module A1.

The semiconductor module A1 includes the conductive substrate 2, the two input terminals 41 and 42 (or the two input terminals 41 and 43), the output terminals 44, and the conducting member 6. The conductive substrate 2 includes the first conductive portion 2A and the second conductive portion 2B aligned in the x direction in plan view. The first semiconductor elements 10A are electrically bonded to the first conductive portion 2A. The second semiconductor elements 10B are electrically bonded to the second conductive portion 2B. The first semiconductor elements 10A and the second semiconductor elements 10B are arranged at intervals in the y direction. The two input terminals 41 and 42 (or the two input terminals 41 and 43) are offset in the x2 direction relative to the first conductive portion 2A. The input terminal 41 is a positive electrode, and is connected to the first conductive portion 2A. The input terminal 42 (or the input terminal 43) is a negative electrode. The output terminals 44 are offset in the x1 direction relative to the second conductive portion 2B. The conducting member 6 includes the first conducting members 61 connected to the first semiconductor elements 10A and the second conductive portion 2B, and the second conducting member 62 connected to the second semiconductor elements 10B and the input terminal 42 (or the input terminal 43). According to this configuration, the path of the main circuit current switched by the semiconductor elements 10 (the first semiconductor elements 10A and the second semiconductor elements 10B) is formed along the x direction in plan view, and the axis of symmetry (see an auxiliary line Li in FIG. 5) in the planar structure of the semiconductor module A1 extends along the y direction in plan view. In other words, the axis of symmetry and the path of the main circuit current are perpendicular to each other. This reduces the difference in the current path to the first semiconductor elements 10A and the second semiconductor elements 10B regarding the main circuit current inputted from the two input terminals 41 and 42 (or the two input terminals 41 and 43) and outputted from the output terminals 44. Accordingly, it is possible to suppress variations in parasitic inductance components and variations in current in the semiconductor module A1. Accordingly, the semiconductor module A1 has a package configuration preferable for equalizing the parasitic inductance components in the path of the main circuit current and for equalizing the amount of current to the semiconductor elements 10.

The first semiconductor elements 10A and the second semiconductor elements 10B are spaced apart in the x direction. The first semiconductor elements 10A and the second semiconductor elements 10B are aligned along the y direction. Accordingly, the direction in which the semiconductor elements 10 are aligned is perpendicular to the direction in which the first main circuit current or the second main circuit current flows. In this way, when a plurality of switching elements are connected in parallel for use as in the present embodiment, the difference in the length of the path of the first main circuit current between the three first semiconductor elements 10A can be reduced. This makes it possible to suppress the parasitic resistance components in the conducting member 6 that forms the path of the main circuit current.

The area in which the first main circuit current flows and the area in which the second main circuit current flows overlap with each other in plan view. In other words, the second conducting member 62, which connects the output terminals 44 to the input terminals 42 and 43 that are negative electrode terminals to let the second main circuit current flow, is arranged above the area (the first conductive portion 2A, the first conducting members 61, and the second conductive portion 2B) in which the first main circuit current flows. The direction in which the first main circuit current flows is opposite from the direction in which the second main circuit current flows. With the arrangement described above, the magnetic field generated by the first main circuit current and the magnetic field generated by the second main circuit current cancel each other out, thus enabling reduction of inductance.

The semiconductor module A1 of the present embodiment includes the two input terminals 42 and 43. The input terminals 42 and 43 are negative electrodes and flank the input terminal 41 in the y direction. The two input terminals 42 and 43 are connected to the second conducting member 62. This configuration can further reduce variations in the path of a current flowing from the output terminals 44 to the input terminals 42 and 43 via the second semiconductor elements 10B and the second conducting member 62.

In the semiconductor module A1, the second conducting member 62 includes the first wiring portion 621, the second wiring portion 622, the third wiring portion 623, and the fourth wiring portion 624. The first wiring portion 621 and the second wiring portion 622 extend in the x direction, and are respectively connected to the input terminal 42 and the input terminal 43 that are arranged opposite from each other with the input terminal 41 therebetween in the y direction. The third wiring portion 623 is joined to the first wiring portion 621 and the second wiring portion 622, extends in the y direction, and is connected to the second semiconductor elements 10B. The fourth wiring portion 624 is offset in the x2 direction relative to the third wiring portion 623, and is joined to the first wiring portion 621, the second wiring portion 622, and the third wiring portion 623. The second conductive member 62 including the first wiring portion 621, the second wiring portion 622, the third wiring portion 623, and the fourth wiring portion 624 overlaps with a wide area of the obverse surface 201 in plan view, and has a relatively large size in plan view. This configuration can appropriately reduce variations in the path of a current flowing from the output terminals 44 to the input terminals 42 and 43 via the second semiconductor elements 10B and the second conducting member 62. Accordingly, the semiconductor module A1 of the present embodiment is more preferable for equalizing the parasitic inductance components in the path (second conducting member 62) of the main circuit current and for equalizing the amount of current to the semiconductor elements 10B.

The fourth wiring portion 624 is joined to the first wiring portion 621 and the second wiring portion 622, and overlaps with the first semiconductor elements 10A in plan view. The fourth wiring portion 624 (first band portion 625) has the protruding areas 625a protruding in the z2 direction relative to the other areas. The protruding areas 625a overlap with the first semiconductor elements 10A in plan view. This configuration can increase the size of the fourth wiring portion 624 (second conductive member 62) in plan view, and can prevent the fourth wiring portion 624 from making improper contact with the first conducting members 61 bonded to the first semiconductor elements 10A.

The first semiconductor elements 10A and the second semiconductor elements 10B overlap with each other as viewed in the x direction. This configuration can suppress an increase in the dimension in the y direction of the conductive substrate 2 (first conductive portion 2A and the second conductive portion 2B) on which the first semiconductor elements 10A and the second semiconductor elements 10B are arranged, and can therefore reduce the size of the semiconductor module A1.

Figure 30:
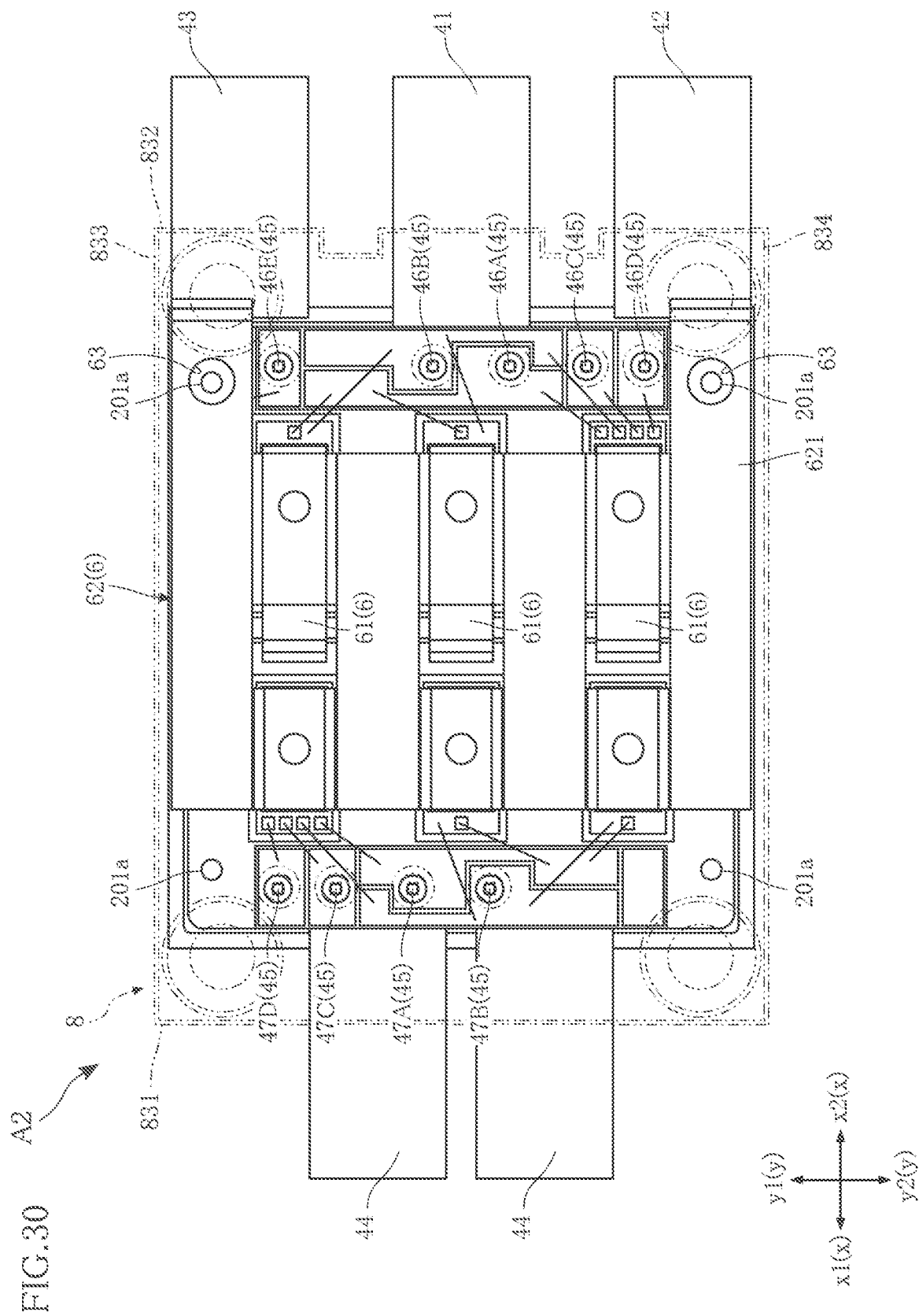
FIG. 30 is a plan view similar to FIG. 5, illustrating a semiconductor module according to a second embodiment.
Figure 31:
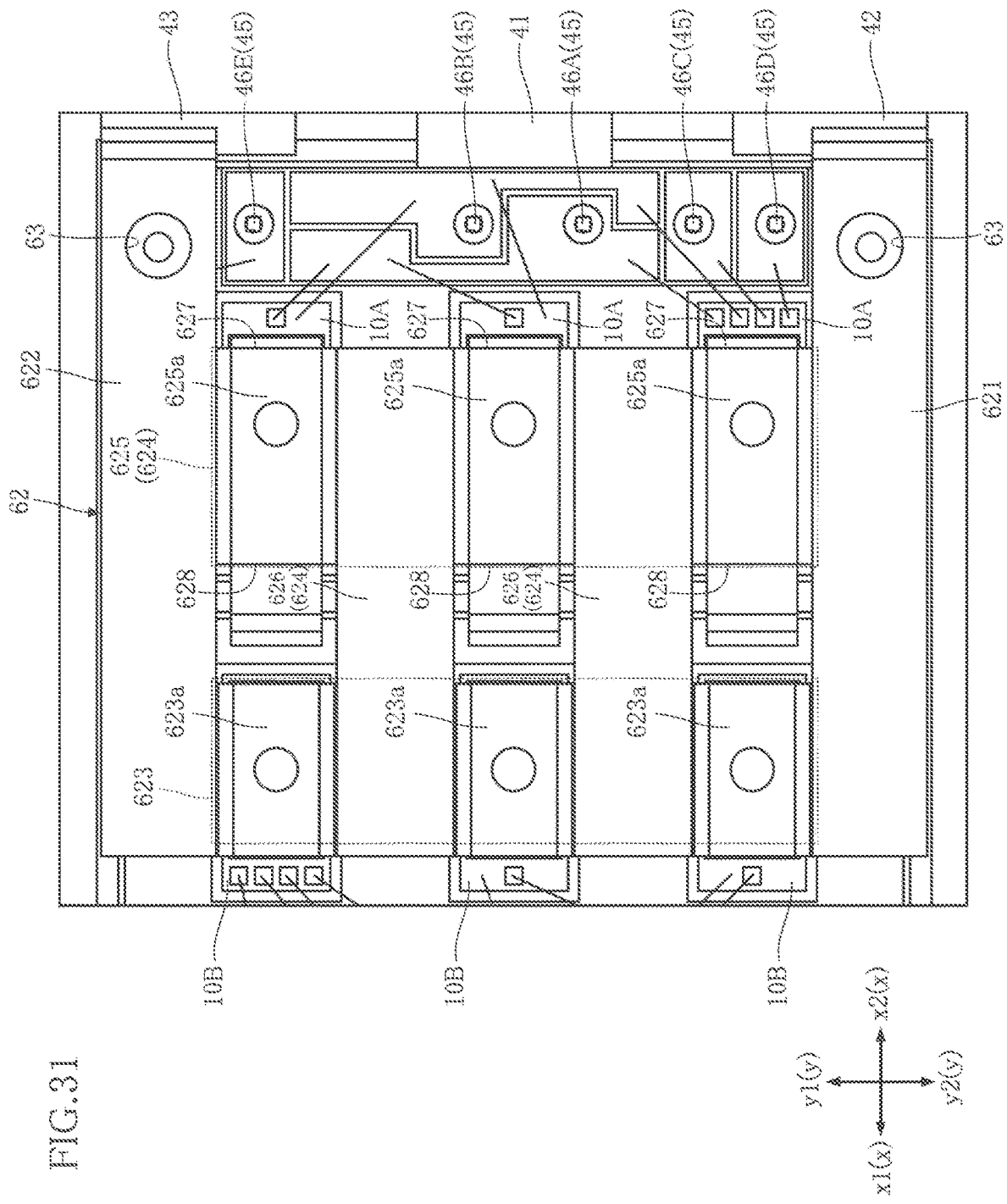
FIG. 31 is a partially enlarged view showing a part of FIG. 30 but omitting the imaginary lines of the sealing resin, the resin member, and the resin-filling portion.
Figure 32:
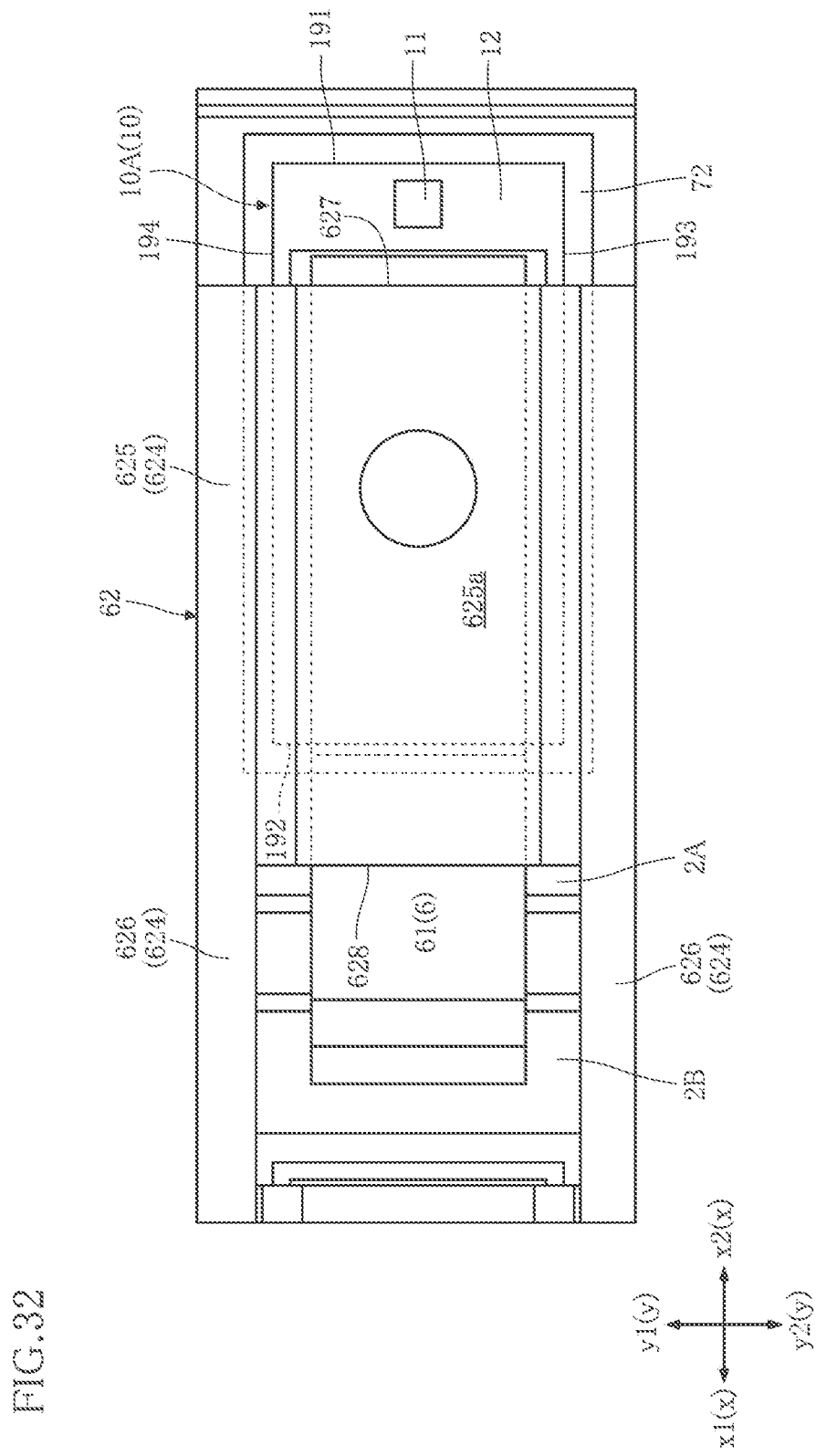
FIG. 32 is a partially enlarged view showing a part of FIG. 31.

FIGS. 30 to 32 illustrate a semiconductor module according to a second embodiment. A semiconductor module A2 of the present embodiment is different from the semiconductor module A1 of the first embodiment in the configuration of the second conducting member 62.

The present embodiment is different from the first embodiment in the area occupied by the fourth wiring portion 624 of the second conducting member 62. Specifically, the dimension of the first band portion 625 in the x direction is larger than that of the semiconductor module A1. As shown in FIGS. 31 and 32, the second edge 628 of the first band portion 625 is offset in the x1 direction as compared to the second edge 628 in the semiconductor module A1. As shown in FIG. 32, the second edge 628 is offset in the x1 direction relative to the second sides 192 of the first semiconductor elements 10A in plan view. As such, two corners of each first semiconductor element 10A in the x1 direction overlap with the second conducting member 62 (first band portion 625) in plan view.

The semiconductor module A2 of the present embodiment has the same advantages as the semiconductor module A1 of the first embodiment. Furthermore, in the semiconductor module A2, the first band portion 625 (second conducting member 62) of the fourth wiring portion 624 can have a larger size in plan view. This is more preferable for reducing parasitic inductance components.

Figure 33:
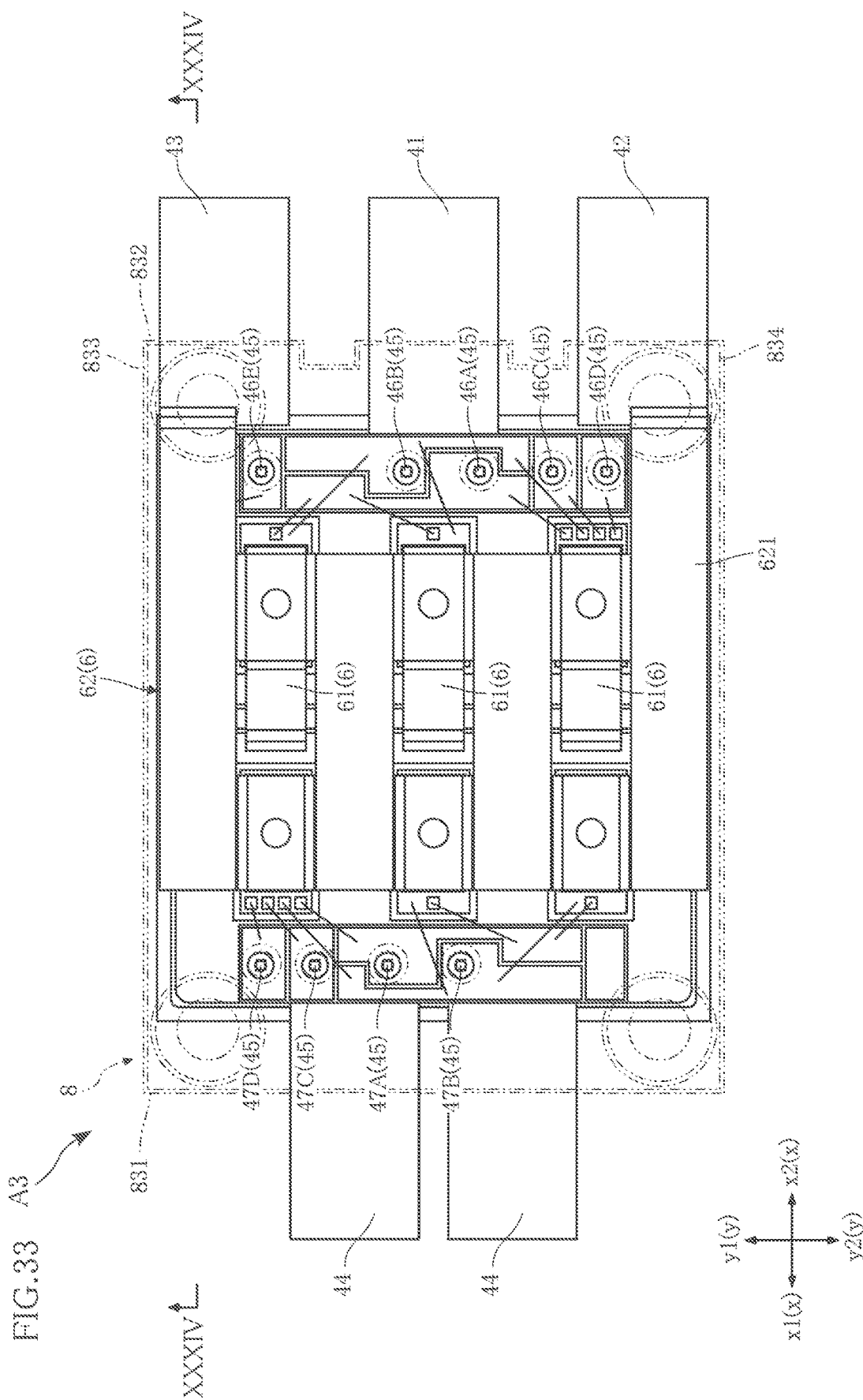
FIG. 33 is a plan view similar to FIG. 5, illustrating a semiconductor module according to a third embodiment.
Figure 34:
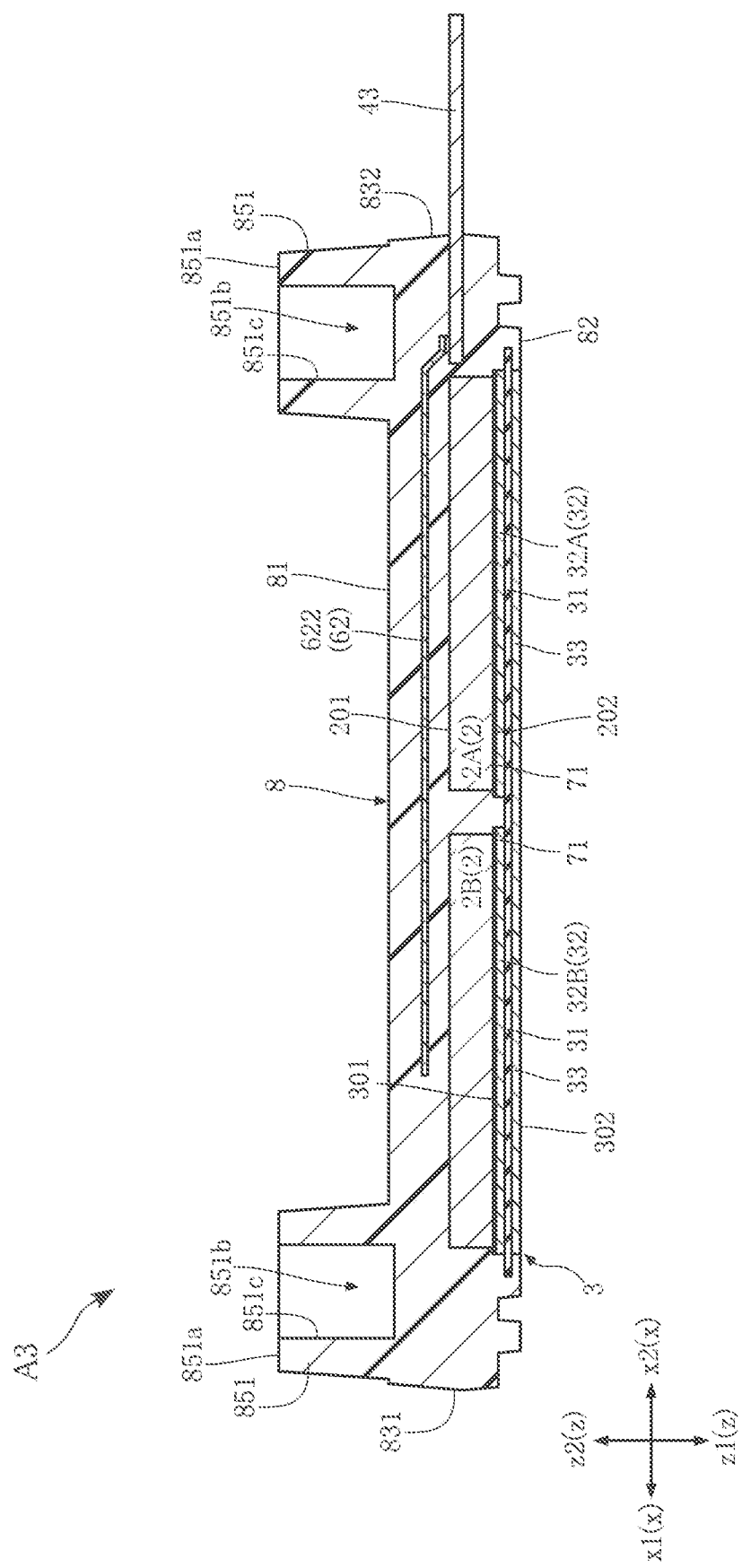
FIG. 34 is a cross-sectional view taken along line XXXIV-XXXIV of FIG. 33.

FIGS. 33 and 34 illustrate a semiconductor module according to a third embodiment. A semiconductor module A3 of the present embodiment is different from the semiconductor module A1 of the first embodiment mainly in the configuration of the second conducting member 62.

Unlike the above embodiments, the second conducting member 62 of the semiconductor module A3 does not have any openings 63. The mold 91 used to form the sealing resin 8 (by molding) in the manufacturing of the semiconductor module A3 is not provided with the pressing pins 911. Accordingly, as shown in FIG. 34, the sealing resin 8 is not formed with the resin voids 86, and the obverse surface 201 of the conductive substrate 2 (the first conductive portion 2A and the second conductive portion 2B) is not formed with the recessed portions 201a. Since the sealing resin 8 is not formed with the resin voids 86, the semiconductor module A3 of the present embodiment does not have any resin-filling portions 88 which are used to fill the resin voids 86 in the first embodiment.

The semiconductor module A3 of the present embodiment has the same advantages as the semiconductor module A1 of the first embodiment.

The semiconductor module according to the present disclosure is not limited to the above embodiments. Various design changes can be made to the specific configurations of the elements of the semiconductor module in the present disclosure.

Although the configuration described in the above embodiments includes two input terminals 42 and 43 (N terminals) to which the second conducting member 62 is connected, the present disclosure is not limited to this. It is possible to employ a configuration that includes only the input terminal 42 (N terminal), and the second conducting member 62 may be connected to the input terminal 42.

In the above embodiments, the control terminals 45 (the first control terminals 46A to 46E, and the second control terminals 47A to 47D) extend along the z direction, but the present disclosure is not limited to this. For example, the control terminals 45 may extend along the plane (x-y plane) perpendicular to the z direction.

In the above embodiments, the second conducting member 62 includes the two second band portions 626 and the first band portion 625, but the two second band portions 626 and the first band portion 625 do not always need to be provided. However, providing the two second band portions 626 and the first band portion 625 can suppress the misalignment of the semiconductor elements 10 and reduce inductance as compared to the configuration without the two second band portions 626 and the first band portion 625.

The present disclosure includes the configurations defined in the following clauses.

Clause 1.

A semiconductor module comprising:
a conductive substrate having an obverse surface and a reverse surface that are spaced apart from each other in a thickness direction;
at least one semiconductor element electrically bonded to the obverse surface and having a switching function;
a conducting member that forms a path of a main circuit current switched by the at least one semiconductor element;
a first input terminal and a second input terminal that are offset in one sense of a first direction relative to the conductive substrate, the first direction being perpendicular to the thickness direction; and
at least one output terminal offset in another sense of the first direction relative to the conductive substrate,
wherein the conductive substrate includes a first conductive portion and a second conductive portion that are spaced apart from each other in the first direction,
the at least one first semiconductor element includes a plurality of first semiconductor elements and a plurality of second semiconductor elements, the plurality of first semiconductor elements being electrically bonded to the first conductive portion and spaced apart from each other in a second direction perpendicular to the thickness direction and the first direction, the plurality of second semiconductor elements being electrically bonded to the second conductive portion and spaced apart from each other in the second direction,
the first input terminal is electrically connected to the first conductive portion,
the second input terminal has an opposite polarity to the first input terminal,
the output terminal is electrically connected to the second conductive portion, and
the conducting member includes a first conducting member connected to the plurality of first semiconductor elements and the second conductive portion, and a second conducting member connected to the plurality of second semiconductor elements and the second input terminal.

Clause 2.

The semiconductor module according to clause 1,
wherein the path of the main circuit current includes a path of a first main circuit current between the first input terminal and the output terminal, and a path of a second main circuit current between the output terminal and the second input terminal, and
a direction of the first main circuit current is opposite from a direction of the second main circuit current.

Clause 3.

The semiconductor module according to clause 1 or 2, wherein the path of the main circuit current switched by the plurality of first semiconductor elements and the plurality of second semiconductor elements is formed along the first direction as viewed in the thickness direction.

Clause 4.

The semiconductor module according to any of clauses 1 to 3, wherein the first conducting member includes a plurality of conducting portions respectively corresponding to the plurality of first semiconductor elements.

Clause 5.

The semiconductor module according to any of clauses 1 to 4, further comprising a third input terminal that is offset in the one sense of the first direction relative to the plurality of first semiconductor elements, and that is connected to the second conducting member,
wherein the first input terminal is provided between the second input terminal and the third input terminal in the second direction.

Clause 6.

The semiconductor module according to clause 5, wherein the second conducting member includes a first wiring portion connected to the second input terminal and extending in the first direction, a second wiring portion connected to the third input terminal and extending in the first direction, a third wiring portion joined to the first wiring portion and the second wiring portion, extending in the second direction, and connected to the plurality of second semiconductor elements, and a fourth wiring portion offset in the one sense of the first direction relative to the third wiring portion, and joined to the first wiring portion, the second wiring portion, and the third wiring portion.

Clause 7.

The semiconductor module according to clause 6, wherein the fourth wiring portion overlaps with the plurality of first semiconductor elements as viewed in the thickness direction.

Clause 8.

The semiconductor module according to clause 7, wherein the fourth wiring portion has a plurality of protruding areas protruding in the thickness direction relative to other areas of the fourth wiring portion, each of the protruding areas overlapping with a corresponding one of the plurality of first semiconductor elements as viewed in the thickness direction.

Clause 9.

The semiconductor module according to any of clauses 6 to 8,
wherein each of the plurality of first semiconductor elements and the plurality of second semiconductor elements includes a source electrode and a drain electrode that are spaced apart from each other in the thickness direction,
the first conducting member is connected to the source electrode of each of the first semiconductor elements,
the first conductive portion is connected to the drain electrode of each of the first semiconductor elements,
the third wiring portion is connected to the source electrode of each of the second semiconductor elements, and
the second conductive portion is connected to the drain electrode of each of the second semiconductor elements.

Clause 10.

The semiconductor module according to clause 9, wherein the plurality of first semiconductor elements and the plurality of second semiconductor elements overlap with each other as viewed in the first direction.

Clause 11.

The semiconductor module according to any of clauses 5 to 10, wherein the first input terminal, the second input terminal, and the third input terminal overlap with each other as viewed in the second direction.

Clause 12.

The semiconductor module according to any of clauses 1 to 11, wherein each of the first conducting member and the second conducting member is made of a metal plate-like member.

Clause 13.

The semiconductor module according to clause 1, further comprising a control terminal connected to one of the plurality of first semiconductor elements and the plurality of second semiconductor elements,
wherein the control terminal is arranged on the obverse surface and extends along the thickness direction.

Clause 14.

The semiconductor module according to any of clauses 1 to 13, wherein each of the first input terminal and the second input terminal has an input-side bonding surface extending in the one sense of the first direction and facing in one sense of the thickness direction, and
the output terminal has an output-side bonding surface extending in the other sense of the first direction and facing in the one sense of the thickness direction.

Clause 15.

The semiconductor module according to clause 14, wherein each of the first input terminal and the second input terminal has an input-side side surface and an input-side machining mark, the input-side side surface being located at a periphery of the input-side bonding surface as viewed in the thickness direction and facing in a direction intersecting with a normal of the input-side bonding surface, the input-side machining mark being formed on the input-side side surface, and
the output terminal has an output-side side surface and an output-side machining mark, the output-side side surface being located at a periphery of the output-side bonding surface as viewed in the thickness direction and facing in a direction intersecting with a normal of the output-side bonding surface, the output-side machining mark formed on the output-side side surface.

Clause 16.

The semiconductor module according to any of clauses 1 to 15, further comprising a sealing resin covering at least a part of each of the first and second conductive portions, the plurality of first semiconductor elements, the plurality of second semiconductor elements, the first conducting member, and the second conducting member.

Clause 17.

The semiconductor module according to clause 16, wherein the sealing resin has a first resin side surface and a second resin side surface that are spaced apart from each other in the first direction, the second resin side surface is positioned closer to the second conductive portion than the first resin side surface, the second resin side surface has two ends spaced apart from each other in the second direction, and at least one of the ends is formed with a resin separation mark.

Clause 18.

The semiconductor module according to clause 16,
wherein the at least one output terminal includes a first output terminal and a second output terminal, and
the sealing resin has a resin side surface with a resin separation mark formed between the first output terminal and the second output terminal.

Clause 19.

A semiconductor module comprising:
- a conductive substrate having an obverse surface and a reverse surface that are spaced apart from each other in a thickness direction;
- at least one semiconductor element electrically bonded to the obverse surface and having a switching function;
- a conducting member that forms a path of a main circuit current switched by the at least one semiconductor element, and that is separated apart from the obverse surface in the thickness direction;
- a first input terminal and a second input terminal that are offset in one sense of a first direction relative to the conductive substrate, the first direction being perpendicular to the thickness direction; and
- an output terminal offset in another sense of the first direction relative to the conductive substrate,
- wherein the conductive substrate includes a first conductive portion and a second conductive portion that are spaced apart from each other in the first direction perpendicular to the thickness direction,
- the at least one semiconductor element includes a plurality of first semiconductor elements electrically bonded to the first conductive portion, and a plurality of second semiconductor elements electrically bonded to the second conductive portion,
- the plurality of first semiconductor elements are spaced apart from each other along a second direction perpendicular to the thickness direction and the first direction,
- the plurality of second semiconductor elements are spaced apart from each other along the second direction,
- the first input terminal is a positive electrode joined to the first conductive portion,
- the second input terminal is a negative electrode,
- the output terminal is joined to the second conductive portion, and
- the conducting member includes a first conducting member connected to the plurality of first semiconductor elements and the second conductive portion, and a second conducting member connected to the plurality of second semiconductor elements and the second input terminal.

Clause 20.

The semiconductor module according to clause 19, wherein the path of the main circuit current switched by the plurality of first semiconductor elements and the plurality of second semiconductor elements is formed along the first direction as viewed in the thickness direction, and
the plurality of first semiconductor elements and the plurality of second semiconductor elements are arranged symmetrically with respect to an axis perpendicular to the first direction as viewed in the thickness direction.

Clause 21.

The semiconductor module according to clause 19 or 20, further comprising a third input terminal that is offset in the one sense of the first direction relative to the plurality of first semiconductor elements, and that is connected to the second conducting member,
  wherein the second input terminal and the third input terminal are offset in one sense and another sense respectively of the second direction with the first input terminal disposed therebetween.

Clause 22.

The semiconductor module according to clause 21, wherein the second conducting member includes a first wiring portion connected to the second input terminal and extending in the first direction, a second wiring portion connected to the third input terminal and extending in the first direction, a third wiring portion joined to the first wiring portion and the second wiring portion, extending in the second direction, and connected to the plurality of second semiconductor elements, and a fourth wiring portion that is offset in the one sense of the first direction relative to the third wiring portion, and that is joined to the first wiring portion, the second wiring portion, and the third wiring portion.

Clause 23.

The semiconductor module according to clause 22, wherein the fourth wiring portion overlaps with the plurality of first semiconductor elements as viewed in the thickness direction.

Clause 24.

The semiconductor module according to clause 23, wherein the fourth wiring portion has a plurality of protruding areas protruding in the thickness direction relative to other areas of the fourth wiring portion, each of the protruding areas overlapping with a corresponding one of the plurality of first semiconductor elements as viewed in the thickness direction.

Clause 25.

The semiconductor module according to any of clauses 22 to 24,
  wherein each of the plurality of first semiconductor elements and the plurality of second semiconductor elements includes a source electrode and a drain electrode that are spaced apart from each other in the thickness direction,
  the first conducting member is connected to the source electrode of each of the first semiconductor elements,
  the first conductive portion is connected to the drain electrode of each of the first semiconductor elements,
  the third wiring portion is connected to the source electrode of each of the second semiconductor elements, and
  the second conductive portion is connected to the drain electrode of each of the second semiconductor elements.

Clause 26.

The semiconductor module according to clause 25, wherein the plurality of first semiconductor elements and the plurality of second semiconductor elements overlap with each other as viewed in the first direction.

Clause 27.

The semiconductor module according to any of clauses 21 to 26, wherein the first input terminal, the second input terminal, and the third input terminal overlap with each other as viewed in the second direction.

Clause 28.

The semiconductor module according to any of clauses 19 to 27, wherein each of the first conducting member and the second conducting member is made of a metal plate-like member.

---

REFERENCE NUMERALS

A1, A2, A3: Semiconductor Module
10: Semiconductor Element
10A: First Semiconductor Element 10B: Second Semiconductor Element
101: Element Obverse Surface 102: Element Reverse Surface
11: First Obverse-Surface Electrode (Gate Electrode)

REFERENCE NUMERALS

12: Second Obverse-Surface Electrode (Source Electrode)
13: Third Obverse-Surface Electrode 14: Fourth Obverse-Surface Electrode
15: Reverse-Surface Electrode (Drain Electrode) 16: Fifth Obverse-Surface Electrode
171, 172, 173, 174: Corner
181, 182, 183, 184: Corner
191: First Side 192: Second Side
193: Third Side 194: Fourth Side
2: Conductive Substrate 2A: First Conductive Portion
2B: Second Conductive Portion 201: Obverse Surface
201a: Recessed Portion 201b: Recess Edge
202: Reverse Surface 21: Base Member
22: Obverse-Surface Bonding Layer
23: Reverse-Surface Bonding Layer
3: Supporting Substrate 301: Supporting Surface
302: Bottom Surface 31: Insulating Layer
32: First Metal Layer 32A: First Portion
32B: Second Portion 321: First Bonding Layer
33: Second Metal Layer
41: First Input Terminal
411: Input-Side Bonding Surface 412: Input-Side Side Surface
413: Tip Surface 414: Lateral Surface
42: Second Input Terminal
421: Input-Side Bonding Surface
422: Input-Side Side Surface 423: Tip Surface
424: Lateral Surface 43: Third Input Terminal
431: Input-Side Bonding Surface 432: Input-Side Side Surface
433: Tip Surface 434: Lateral Surface
44: Output Terminal 441: Output-Side Bonding Surface
442: Output-Side Side Surface 443: Tip Surface
444: Lateral Surface 45: Control Terminal
451: Holder 452: Metal Pin 459: Conductive Bonding Member
46A, 46B, 46C, 46D, 46E: First Control Terminal
47A, 47B, 47C, 47D: Second Control Terminal
5: Control Terminal Support 51: Insulating Layer
52: First Metal Layer 521: First Portion
522: Second Portion 523: Third Portion
524: Fourth Portion 525: Fifth Portion
53: Second Metal Layer 59: Bonding Member
6: Conducting Member 601: First Portion
61: First Conducting Member 61h: Opening
62: Second Conducting Member 62A: First Portion
62B: Second Portion 621: First Wiring Portion
622: Second Wiring Portion 623: Third Wiring Portion
623a: Recessed Area 623h: Opening
624: Fourth Wiring Portion 625: First Band portion
625a: Protruding Area 625h: Opening
626: Second Band portion 627: First Edge
628: Second Edge 63: Opening
69: Conductive Bonding Member
71: First Conductive Bonding Member
711: First Base Layer 712: First Layer
713: Second Layer 72: Second Conductive Bonding Member
721: Second Base Layer 722: Third Layer
723: Fourth Layer
731: Wire
731a: First Wire 731b: Second Wire
732, 733, 734, 735: Wire 8: Sealing Resin
81: Resin Obverse Surface 82: Resin Reverse Surface
831, 832: Resin Side Surface 832a: Recessed Portion
833, 834: Resin Side Surface 851: First Protrusion
851a: First Protruding End Surface
851b: Recessed Portion
851c: Inner Wall Surface 852: Second Protrusion
86: Resin Void 861: Resin Void Edge
87: Resin Member 88: Resin-Filling Portion
91: Mold 911: Pressing Pin

The invention claimed is:

1. A semiconductor module comprising:
a conductive substrate having an obverse surface and a reverse surface that are spaced apart from each other in a thickness direction;
at least one semiconductor element electrically bonded to the obverse surface and having a switching function;
a conducting member constituting a path of a main circuit current switched by the at least one semiconductor element;
a first input terminal, a second input terminal, and a third input terminal that are disposed on one side in a first direction relative to the conductive substrate, the first direction being perpendicular to the thickness direction;
at least one output terminal disposed on the other side in the first direction relative to the conductive substrate;
at least one control terminal connected to the at least one semiconductor element; and
a sealing resin covering at least a part of the conductive substrate, the at least one semiconductor element, a part of the first input terminal, a part of the second input terminal, a part of the third input terminal, a part of the at least one output terminal, and a part of the at least one control terminal,
wherein the conductive substrate includes a first conductive portion and a second conductive portion that are spaced apart from each other in the first direction,
wherein the at least one semiconductor element includes a plurality of first semiconductor elements electrically bonded to the first conductive portion, and a plurality of second semiconductor elements electrically bonded to the second conductive portion,
wherein the first input terminal is electrically connected to one group of the plurality of first semiconductor elements and the plurality of second semiconductor elements,
wherein the second input terminal and the third input terminal are disposed on one side and on the other side, respectively, in a second direction perpendicular to the thickness direction and the first direction, with the first input terminal being interposed therebetween, wherein the second input terminal and the third input terminal have a polarity opposite to that of the first input terminal, wherein the second input terminal and the third input terminal are electrically connected to the other group of the plurality of first semiconductor elements and the plurality of second semiconductor elements,
wherein the at least one output terminal is electrically connected to the second conductive portion,
wherein the sealing resin includes a first recessed portion between the first input terminal and the second input terminal as viewed in the thickness direction, the first recessed portion being recessed to the other side in the first direction, the sealing resin also including a second recessed portion between the first input terminal and the third input terminal as viewed in the thickness direction, the second recessed portion being recessed to the other side in the first direction, and
wherein the at least one control terminal is disposed on the obverse surface and extends along the thickness direction.

2. The semiconductor module according to claim 1, wherein the at least one control terminal includes a plurality of first control terminals controlling the plurality of first semiconductor elements and a plurality of second control terminals controlling the plurality of second semiconductor elements, the plurality of first control terminals are supported by the first conductive portion and located between the plurality of first semiconductor elements and each of the first input terminal and the second input terminal in the first direction, the plurality of second control terminals are supported by the second conductive portion and located between the plurality of second semiconductor elements and the at least one output terminal in the first direction.

3. The semiconductor module according to claim 1, wherein the plurality of first semiconductor elements and the plurality of second semiconductor elements overlap with each other as viewed in the first direction.

4. The semiconductor module according to claim 1, wherein the first input terminal, the second input terminal, and the third input terminal overlap with each other as viewed in the second direction.

5. The semiconductor module according to claim 1, wherein each of the first input terminal and the second input terminal has an input-side bonding surface extending to the one side in the first direction and facing one side in the thickness direction, and the at least one output terminal has an output-side bonding surface extending to the other side in the first direction and facing the one side in the thickness direction.

6. The semiconductor module according to claim 5, wherein each of the first input terminal and the second input terminal has an input-side side surface and an input-side machining mark, the input-side side surface being located at a periphery of the input-side bonding surface as viewed in the thickness direction and facing in a direction intersecting a normal of the input-side bonding surface, the input-side machining mark being formed on the input-side side surface, and the at least one output terminal has an output-side side surface and an output-side machining mark, the output-side side surface being located at a periphery of the output-side bonding surface as viewed in the thickness direction and facing in a direction intersecting a normal of the output-side bonding surface, the output-side machining mark being formed on the output-side side surface.

7. The semiconductor module according to claim 1, wherein the sealing resin has a first resin side surface and a second resin side surface that are spaced apart from each other in the first direction, the second resin side surface is positioned closer to the second conductive portion than the first resin side surface, the second resin side surface has two ends spaced apart from each other in the second direction, and at least one of the ends is formed with a resin separation mark.

8. The semiconductor module according to claim 1, wherein the at least one output terminal includes a first output terminal and a second output terminal, and the sealing resin has a resin side surface formed with a resin separation mark between the first output terminal and the second output terminal.

\* \* \* \* \*